US009609190B2

(12) United States Patent
Lee et al.

(10) Patent No.: US 9,609,190 B2
(45) Date of Patent: Mar. 28, 2017

(54) DEVICES, METHODS, AND SYSTEMS FOR EXPANDED-FIELD-OF-VIEW IMAGE AND VIDEO CAPTURE

(71) Applicant: InVisage Technologies, Inc., Menlo Park, CA (US)

(72) Inventors: Jess Jan Young Lee, Woodside, CA (US); Michael Hepp, San Jose, CA (US); Edward Hartley Sargent, Toronto (CA)

(73) Assignee: InVisage Technologies, Inc., Newark, CA (US)

( * ) Notice: Subject to any disclaimer, the term of this patent is extended or adjusted under 35 U.S.C. 154(b) by 20 days.

(21) Appl. No.: 14/067,745

(22) Filed: Oct. 30, 2013

(65) Prior Publication Data

US 2014/0118584 A1 May 1, 2014

Related U.S. Application Data

(60) Provisional application No. 61/720,889, filed on Oct. 31, 2012.

(51) Int. Cl.
*H04N 5/225* (2006.01)
*H04N 5/369* (2011.01)
(Continued)

(52) U.S. Cl.
CPC ........... *H04N 5/2254* (2013.01); *G03B 37/04* (2013.01); *H01L 27/1464* (2013.01);
(Continued)

(58) Field of Classification Search
CPC ...... H04N 5/2254; H04N 5/353; H04N 5/369; H04N 5/2258; H04N 5/23296;
(Continued)

(56) References Cited

U.S. PATENT DOCUMENTS 6,304,284 B1 * 10/2001 Dunton ................. G06T 3/4038
348/36
6,639,626 B1 * 10/2003 Kubo et al. ................ 348/218.1
(Continued)

FOREIGN PATENT DOCUMENTS

CN 104937920 A 9/2015
WO WO-2012001755 A1 1/2012
(Continued)

OTHER PUBLICATIONS

Co-pending U.S. Appl. No. 13/099,903, filed May 3, 2011.*
(Continued)

*Primary Examiner* — Luong T Nguyen
(74) *Attorney, Agent, or Firm* — Schwegman Lundberg & Woessner, P.A.

(57) ABSTRACT

In various example embodiments, an imaging system and method are provided. In an embodiment, the system comprises a first image sensor array, a first optical system to project a first image on the first image sensor array, the first optical system having a first zoom level. A second optical system is to project a second image on a second image sensor array, the second optical system having a second zoom level. The second image sensor array and the second optical system are pointed in the same direction as the first image sensor array and the first optical system. The second zoom level is greater than the first zoom level such that the second image projected onto the second image sensor array is a zoomed in on portion of the first image projected on the first image sensor array. The first image sensor array includes at least four megapixels and the second image sensor array includes one-half or less than the number of pixels in the first image sensor array.

62 Claims, 52 Drawing Sheets

(51) Int. Cl.
*H04N 5/353* (2011.01)
*H01L 27/146* (2006.01)
*G03B 37/04* (2006.01)
*H04N 5/232* (2006.06)
*H04N 5/3745* (2011.01)
*H04N 9/04* (2006.01)

(52) U.S. Cl.
CPC .. *H01L 27/14605* (2013.01); *H01L 27/14623* (2013.01); *H04N 5/2258* (2013.01); *H01L 27/14612* (2013.01); *H01L 27/14643* (2013.01); *H04N 5/23296* (2013.01); *H04N 5/353* (2013.01); *H04N 5/3745* (2013.01); *H04N 9/045* (2013.01)

(58) Field of Classification Search
CPC  H04N 5/3745; H04N 9/045; H01L 27/14623; H01L 27/14612; H01L 27/14643; H01L 27/1464; H01L 27/14605; G03B 37/04
See application file for complete search history.

(56) References Cited

U.S. PATENT DOCUMENTS

| | | | |
|---|---|---|---|
| 6,778,207 B1* | 8/2004 | Lee | H04N 5/23238 348/36 |
| 7,305,180 B2* | 12/2007 | Labaziewicz et al. | 396/60 |
| 7,557,832 B2* | 7/2009 | Lindenstruth et al. | 348/208.99 |
| 7,671,907 B2* | 3/2010 | Kobayashi et al. | 348/240.2 |
| 7,982,777 B2* | 7/2011 | Prechtl | H04N 5/232 348/211.11 |
| 8,558,929 B2* | 10/2013 | Tredwell | 348/294 |
| 8,643,058 B2* | 2/2014 | Bawendi et al. | 257/187 |
| 8,648,287 B1* | 2/2014 | Fossum | 250/208.1 |
| 2005/0128327 A1* | 6/2005 | Bencuya et al. | 348/308 |
| 2006/0187312 A1 | 8/2006 | Labaziewicz et al. | |
| 2007/0091190 A1* | 4/2007 | Iwabuchi et al. | 348/294 |
| 2008/0143829 A1 | 6/2008 | Takeda | 348/143 |
| 2008/0211941 A1* | 9/2008 | Deever et al. | 348/262 |
| 2008/0218611 A1* | 9/2008 | Parulski et al. | 348/262 |
| 2008/0278610 A1 | 11/2008 | Boettiger | |
| 2010/0020201 A1 | 1/2010 | Chao et al. | |
| 2011/0267510 A1 | 11/2011 | Malone et al. | |
| 2012/0002084 A1 | 1/2012 | Weissman et al. | |

FOREIGN PATENT DOCUMENTS

| | | |
|---|---|---|
| WO | WO-2014070927 A2 | 5/2014 |
| WO | WO-2014070927 A3 | 5/2014 |

OTHER PUBLICATIONS

Co-pending U.S. Appl. No. 13/894,184, filed May 14, 2013.*
"International Application Serial No. PCT/US2013/067569, International Search Report mailed May 8, 2014", 5 pgs.
"International Application Serial No. PCT/US2013/067569, Written Opinion mailed May 8, 2014", 9 pgs.
"International Application Serial No. PCT/US2013/067569, International Preliminary Report on Patentability mailed May 14, 2015", 8 pgs.
"European Application Serial No. 13850455.0, Extended European Search Report mailed Apr. 29, 2016", 7 pgs.

* cited by examiner

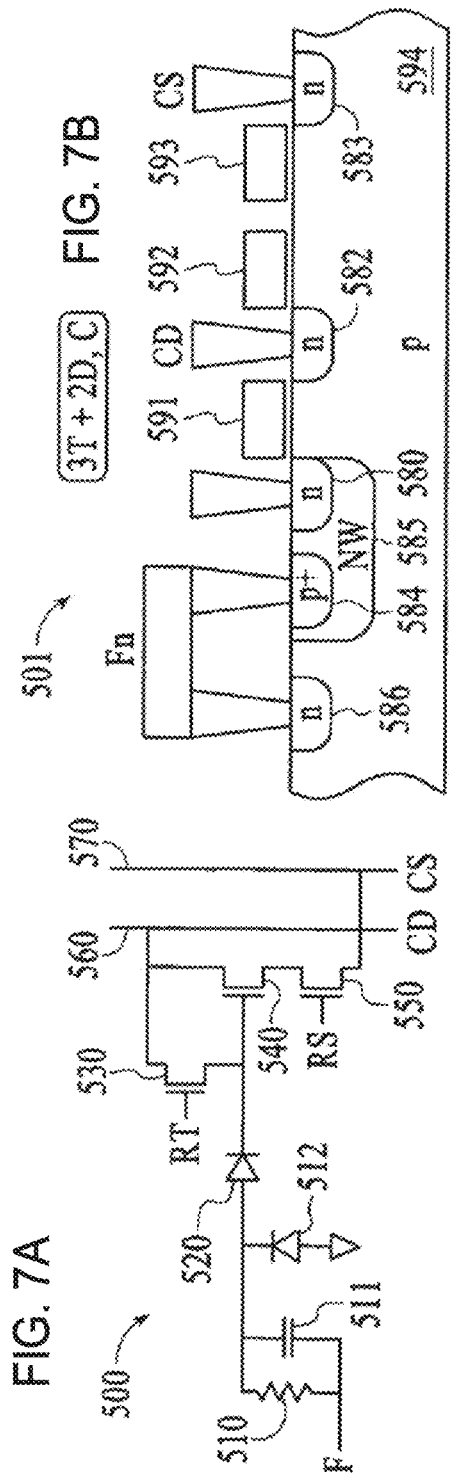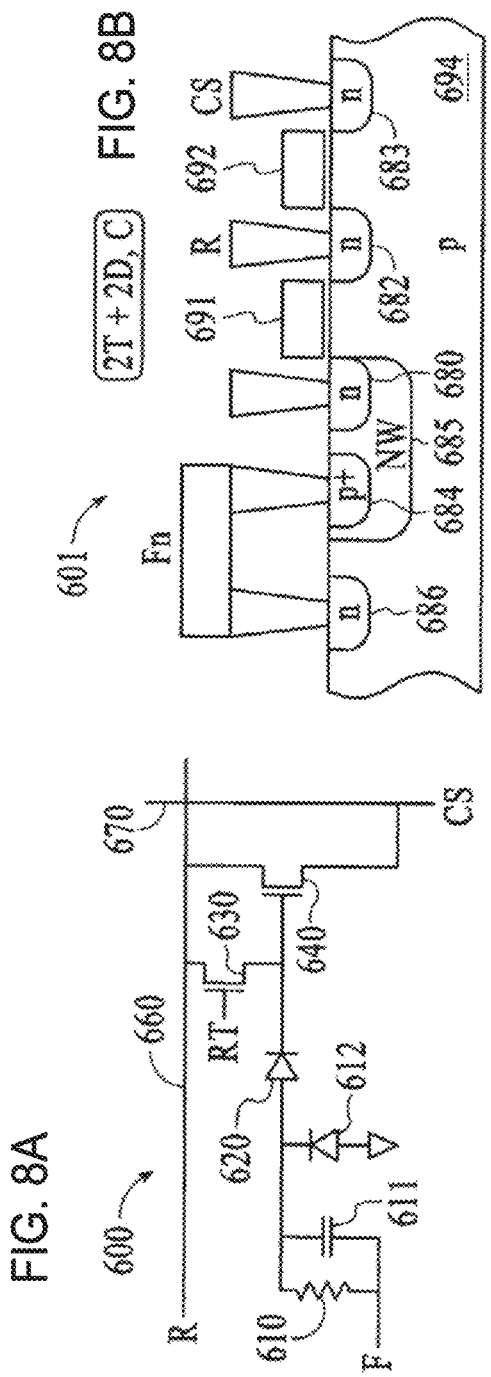

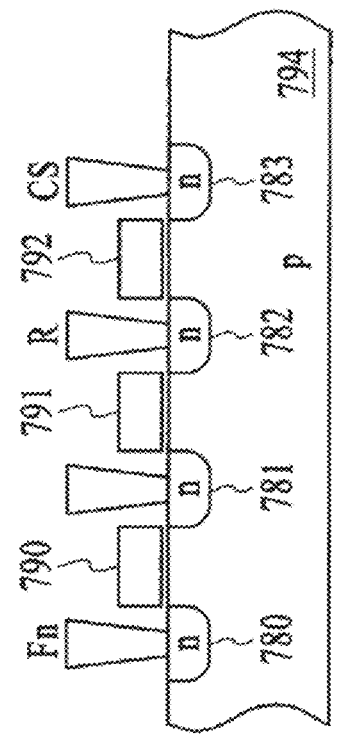
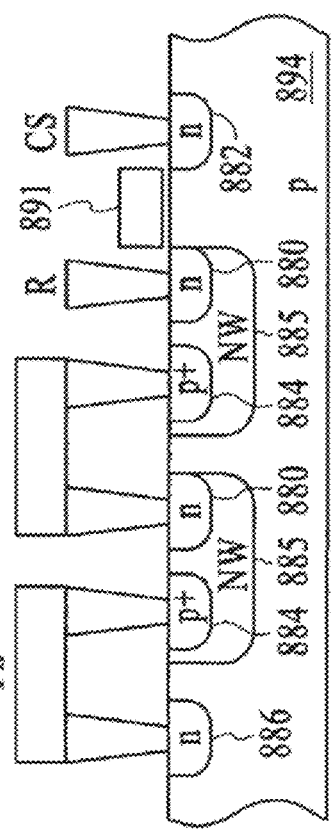
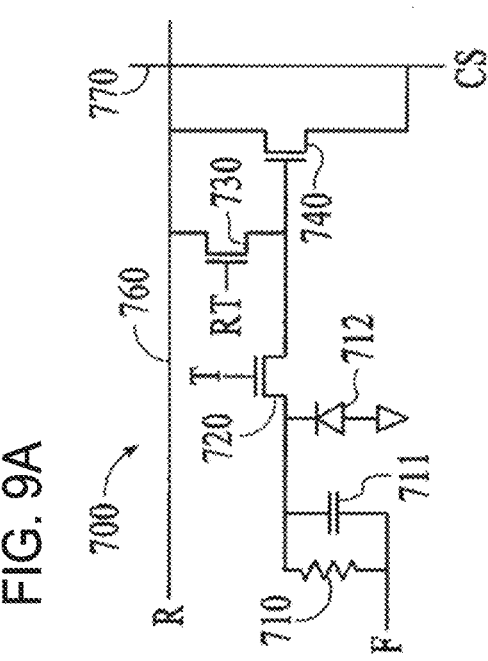
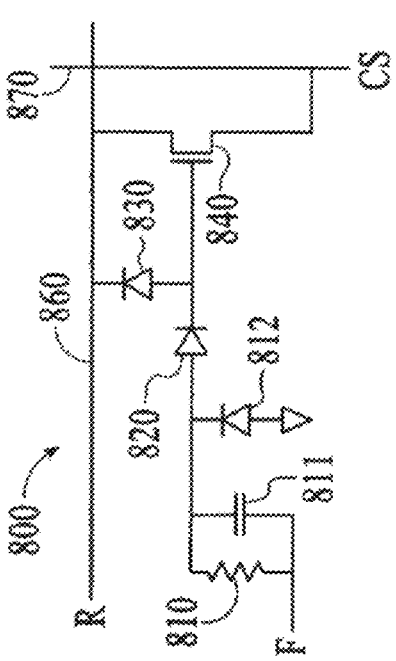

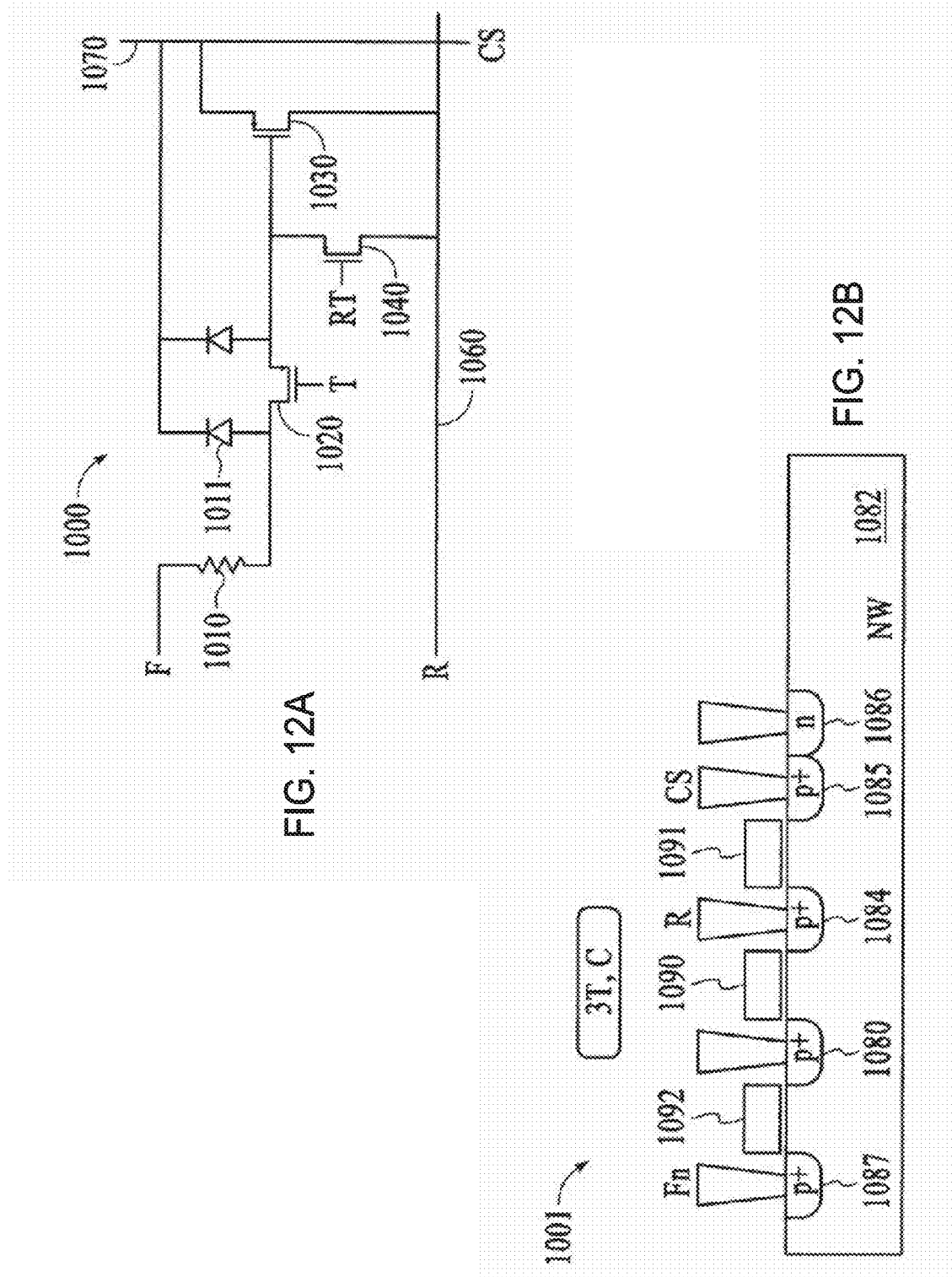

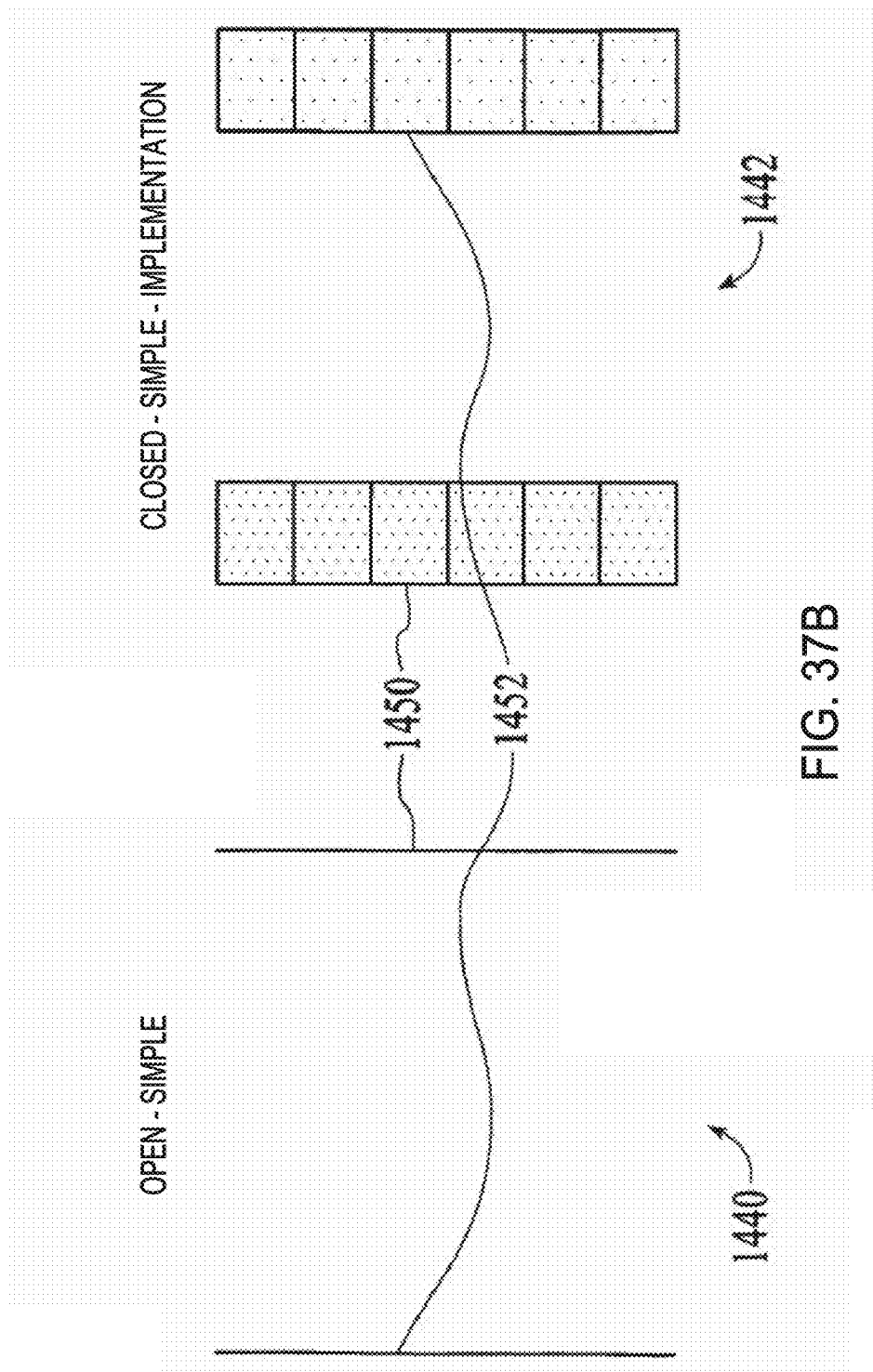

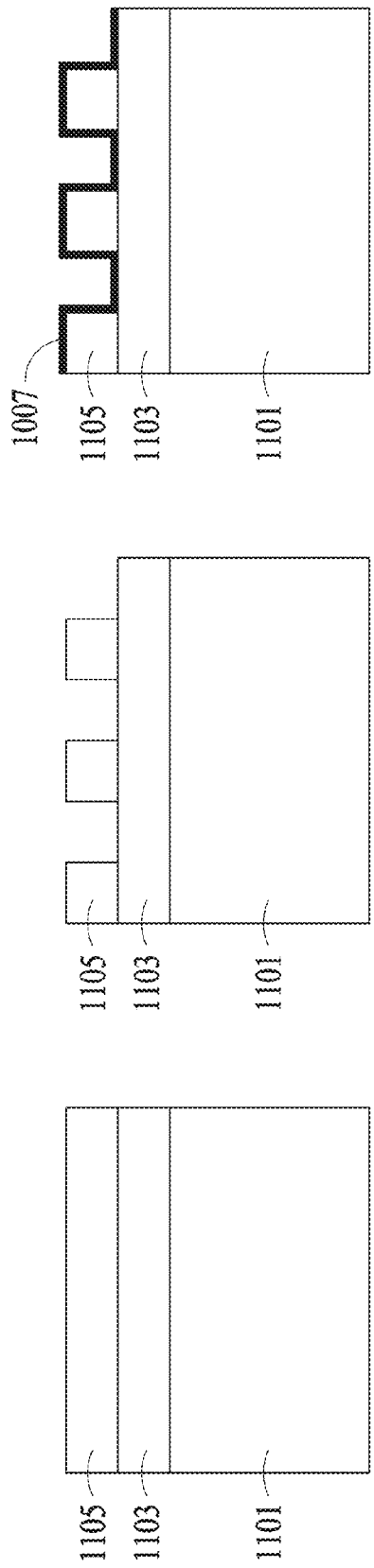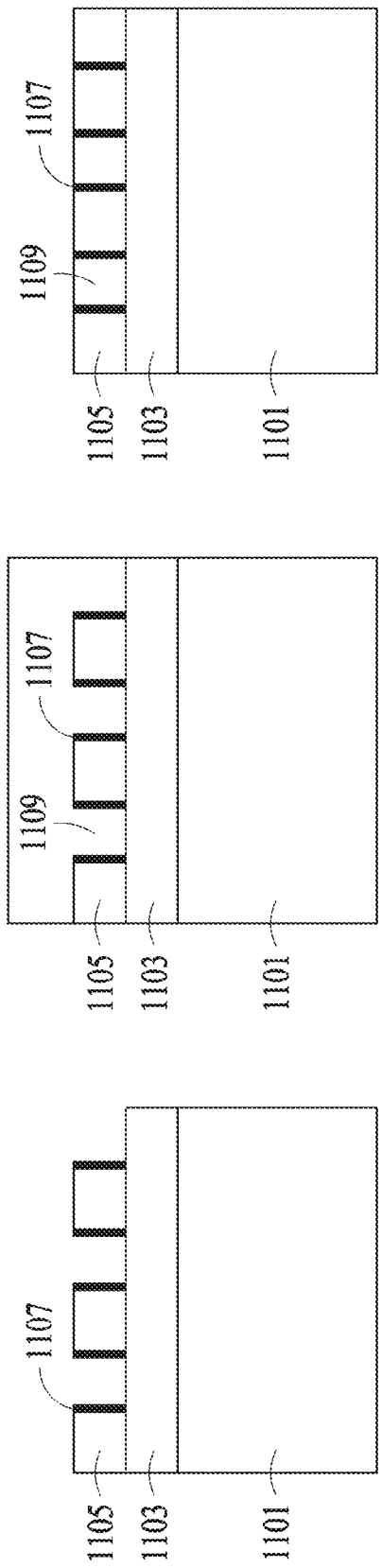

DEVICES, METHODS, AND SYSTEMS FOR EXPANDED-FIELD-OF-VIEW IMAGE AND VIDEO CAPTURE

This application claims the benefit of priority under 35 U.S.C. 119(e) to U.S. Provisional Patent Application Ser. No. 61/720,889, filed on Oct. 31, 2012, which is incorporated herein by reference in its entirety.

TECHNICAL FIELD

The inventive subject matter generally relates to optical and electronic devices, systems and methods that include optically sensitive material, such as nanocrystals or other optically sensitive material, and methods of making and using the devices and systems.

BACKGROUND

Image sensors transduce spatial and spatio-temporal information, carried in the optical domain, into a recorded impression. Digital image sensors provide such a recorded impression in the electronic domain.

Image sensors systems desirably provide a range of fields of view that enable the user to acquire images of particularly high fidelity (such as resolution, or signal-to-noise ratio, or other desired feature in an image) within a particular angular range of interest. In cases, a wide angular range, or field of view, is desired.

BRIEF DESCRIPTION OF THE FIGURES

The systems and methods described herein may be understood by reference to the following figures:

FIGS. 3A-18B illustrate a "global" pixel shutter arrangement;

FIG. 37B shows an aspect of an open simple geometrical arrangement of pixels;

FIGS. 61A-61F are cross-sections depicting a means of fabricating an optical-crosstalk-reducing structure such as that shown in FIG. 59.

Figure 1:
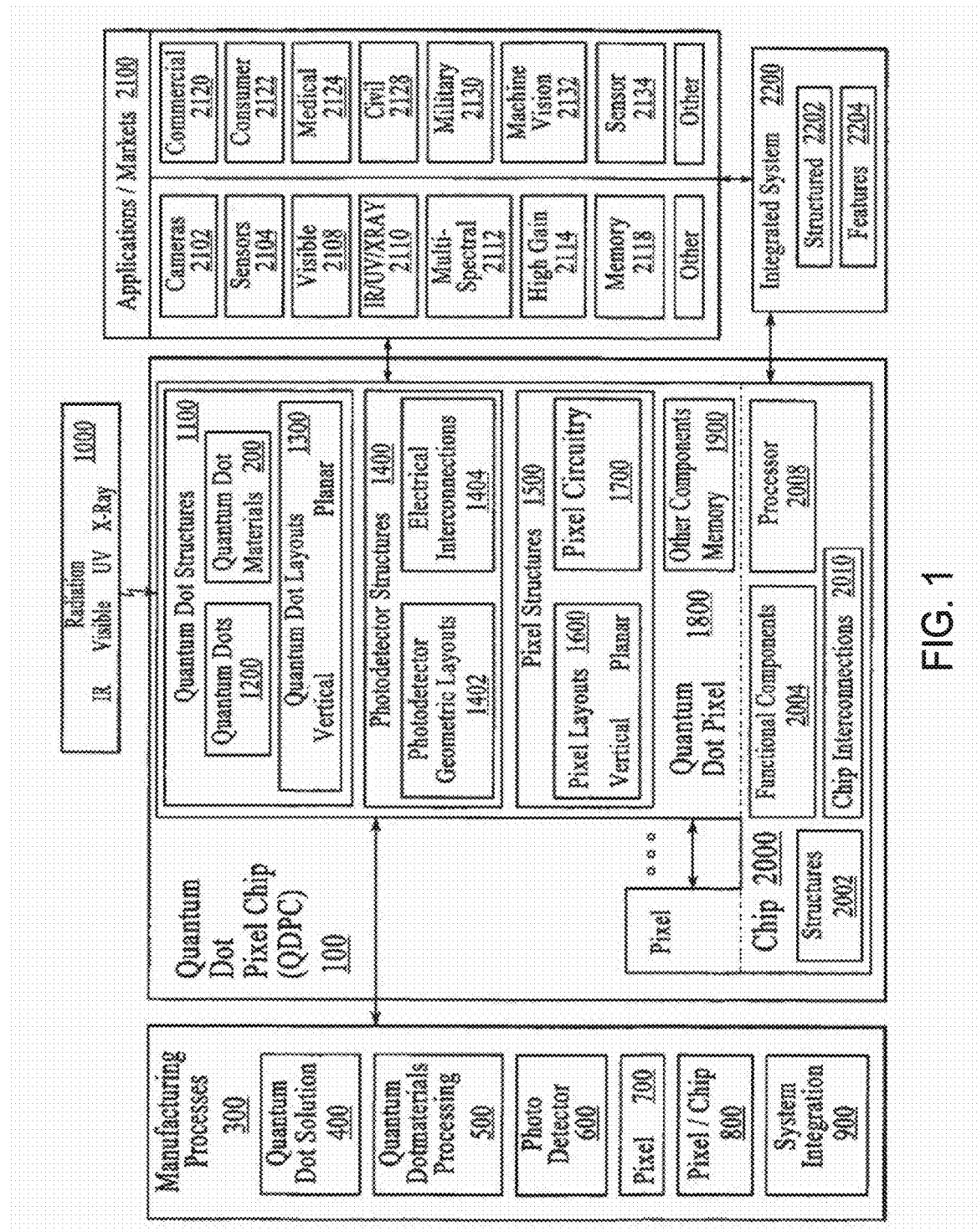
FIG. 1 shows overall structure and areas according to an embodiment.

Embodiments are described, by way of example only, with reference to the accompanying drawings. The drawings are not necessarily to scale. For clarity and conciseness, certain features of the embodiment may be exaggerated and shown in schematic form.

DETAILED DESCRIPTION

Embodiments include an imaging system having a first image sensor array; a first optical system configured to project a first image on the first image sensor array, the first optical system providing a first field of view; a second image sensor array; a second optical system configured to project a second image on the second image sensor array, the second optical system having a second field of view; wherein said first field of view and second field of view include some overlap in the angular range imaged; and wherein said first field of view and second field of view include some non-overlap in the angular range imaged.

Embodiments include an imaging system having a first image sensor array; a first optical system configured to project a first image on the first image sensor array, the first optical system imaging a first portion of a scene; a second image sensor array; a second optical system configured to project a second image on the second image sensor array, the second optical system imaging a second portion of a scene; wherein said first portion of a scene, and said second portion of a scene, include some overlap in the scenes imaged; and wherein said first portion of a scene, and said second portion of a scene, include some non-overlap in the scenes imaged.

Embodiments include an imaging system comprising an integrated circuit comprising at least a first imaging array region and a second imaging array region; a first optical system configured to project a first image onto said first imaging array region, the first optical system providing a first field of view; and a second optical system configured to project a second image onto said second imaging array region, the second optical system having a second field of view; wherein said first field of view and second field of view include some overlap in the angular range imaged; and wherein said first field of view and second field of view include some non-overlap in the angular range imaged.

Embodiments include an imaging system comprising an integrated circuit comprising at least a first imaging array region and a second imaging array region; a first optical system configured to project a first image on the first imaging array region, the first optical system imaging a first portion of a scene; and a second optical system configured to project a second image onto said second imaging array region, the second optical system imaging a second portion of a scene; wherein said first portion of a scene, and said second portion of a scene, include some overlap in the scenes imaged; and wherein said first portion of a scene, and said second portion of a scene, include some non-overlap in the scenes imaged.

Embodiments include an imaging system in which the first image sensor array includes at least one million pixels.

Embodiments include an imaging system in which the first imaging array region includes at least one million pixels.

Embodiments include an imaging system wherein the first imaging array region and the second imaging array region are formed on the same substrate.

Embodiments include an imaging system in which the angular relationship between the staring direction of the first imaging region and the second imaging region may be varied.

Embodiments include an imaging system in which varying the angular relationship between the staring direction of the first imaging array region and the second imaging array region allows the field of view of the imaging system to be varied.

Embodiments include an imaging system wherein a digital image is formed that combines information acquired from the first imaging array region and the second imaging array region.

Embodiments include an imaging system comprising first pixel circuitry for reading image data from the first imaging array region; and second pixel circuitry for reading image data from the imaging array region; where said pixel circuitry is configured to collect images from the two imaging array regions acquired over substantially the same interval of time.

Embodiments include an imaging system comprising first pixel circuitry for reading image data from the first imaging array region; and second pixel circuitry for reading image data from the imaging array region; where said pixel circuitry is configured to collect global-electronically-shuttered images from the two imaging array regions acquired over substantially the same interval of time.

Embodiments include an imaging system wherein the imaging system is part of a camera device, further comprising control circuitry configured to output an image with super resolution, in at least a subregion of a combined image, that is generated from at least a portion of the first imaging array region and at least a portion of the second imaging array region.

Embodiments include an imaging system wherein the control circuitry is configured to switch the switching element of each of the pixel circuits from the first state to the second state at substantially the same time for each of the pixel circuits after an integration period of time.

Embodiments include an imaging system wherein each pixel circuit further comprises reset circuitry configured to reset the voltage difference across the optically sensitive material while the switching element is in the second state.

Embodiments include an imaging system wherein each pixel circuit further comprises a read out circuit formed on one side of the semiconductor substrate below the plurality of pixel regions.

Embodiments include an imaging system wherein the optically sensitive material is a continuous film of nanocrystal material.

Embodiments include an imaging system further comprising analog to digital conversion circuitry to generate digital pixel values from the signal read out of the pixel circuits for each of the image sensor arrays and a processor configured to process the pixel values corresponding to at least two of the image sensor arrays in a first mode of operation to generate an output image.

In example embodiments, an integrated circuit system can comprise multiple imaging regions. FIG. 1 is a block diagram of an image sensor integrated circuit (also referred to as an image sensor chip) that comprises multiple imaging regions 100, 400, 500, 600, 700, 800. The largest of these imaging regions 100, typically having the greatest number of pixels, such as approximately 8 million pixels, may be termed the primary imaging array. The additional imaging arrays, typically having a lesser number of pixels, may be termed the secondary imaging arrays 400, 500, 600, 700, 800.

In the pixel arrays, 100, 400, 500, 600, 700, 800, incident light is converted into electronic signals. Electronic signals are integrated into charge stores whose contents and voltage levels are related to the integrated light incident over the frame period. Row and column circuits, such as 110 and 120, 410, and 420, etc., are used to reset each pixel, and read the signal related to the contents of each charge store, in order to convey the information related to the integrated light over each pixel over the frame period to the outer periphery of the chip. FIG. 1 is described in additional detail, below.

Figure 2:
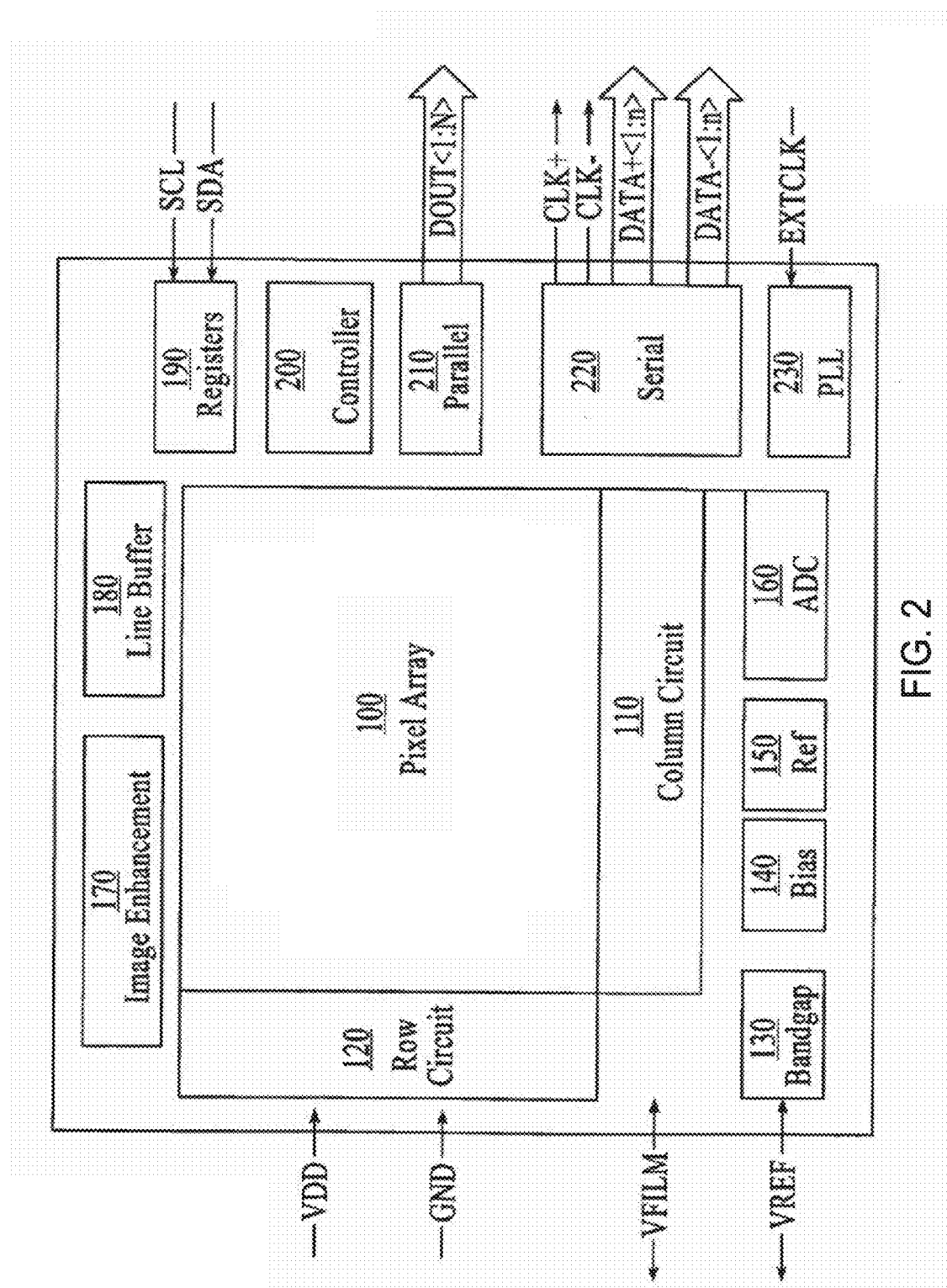
FIG. 2 is a block diagram of an example system configuration that may be used in combination with embodiments described herein.

Various analog circuits are shown in FIG. 2 including 130, 140, 150, 160, and 230. The pixel electrical signal from the column circuits is fed into at least one analog-to-digital converter 160 where it is converted into a digital number representing the light level at each pixel. The pixel array and ADC are supported by analog circuits that provide bias and reference levels 130, 140, and 150.

In embodiments, more than one ADC 160 may be employed on a given integrated circuit. In embodiments, there may be an ADC for each imaging region 100, 400, 500, etc. In embodiments, all imaging regions may share a single ADC. In embodiments, there may be used a plurality of ADCs, but a given ADC may be responsible for analog-to-digital conversion of signals for more than one imaging region.

Various digital circuits are shown in FIG. 2 including 170, 180, 190, and 200. The Image Enhancement circuitry 170 provides image enhancement functions to the data output from ADC to improve the signal to noise ratio. Line buffer 180 temporarily stores several lines of the pixel values to facilitate digital image processing and IO functionality. Registers 190 is a bank of registers that prescribe the global operation of the system and/or the frame format. Block 200 controls the operation of the chip.

In embodiments employing multiple imaging arrays, digital circuits may take in information from the multiple imaging arrays, and may generate data, such as a single image or modified versions of the images from the multiple imaging arrays, that takes advantage of information supplied by the multiple imaging arrays.

IO circuits 210 and 220 support both parallel input/output and serial input/output. IO circuit 210 is a parallel IO interface that outputs every bit of a pixel value simultaneously. IO circuit 220 is a serial IO interface where every bit of a pixel value is output sequentially.

In embodiments, more than one IO circuit may be employed on a given integrated circuit. In embodiments, there may be an IO system for each imaging region 100, 400, 500, etc. In embodiments, all imaging regions may share a single IO system. In embodiments, there may be used a plurality of IO systems, but a given IO system may be responsible for analog-to-digital conversion of signals for more than one imaging region.

A phase-locked loop 230 provides a clock to the whole chip.

In a particular example embodiment, when 0.11 µm CMOS technology node is employed, the periodic repeat distance of pixels along the row-axis and along the column-axis may be 700 nm, 900 nm, 1.1 µm, 1.2 µm, 1.4 µm, 1.55 µm, 1.75 µm, 2.2 µm, or larger. The implementation of the smallest of these pixels sizes, especially 700 nm, 900 nm, 1.1 µm, and 1.2 µm, and 1.4 µm, may require transistor sharing among pairs or larger group of adjacent pixels.

Pixel sizes can vary from less than about 0.5 to 3 microns across a lateral dimension or any range subsumed therein (less than about 0.5 to 3 microns squared in area or any range subsumed therein). In examples, the pixels size may be less than about 1.3, 1.4, 1.5, 1.7, 2, 2.2 or 2.5 microns (with less than that amount squared in area). Specific examples are 1.2 and 1.4 microns. The primary may have larger pixels than secondary array. Primary may be greater than 0.5, 0.7, 1, 1.2 or 1.4 or 1.5 microns and less than 1, 1.2, 1.5, 1.7, 2, 2.2, 2.5 or 3 microns. The one or more secondary arrays could be also be greater than 0.5, 0.7, 1, 1.2 or 1.4 or 1.5 microns and less than 1, 1.2, 1.5, 1.7, 2, 2.2, 2.5 or 3 microns but would be smaller than the primary. For example, the primary may be greater than X and the secondary may be less than X, where X is 1.2, 1.4, 1.5, 1.7, or 2, etc.

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

In embodiments, very small pixels can be implemented. Associating all of the silicon circuit area associated with each pixel with the read-out electronics may facilitate the implementation of small pixels. In embodiments, optical sensing may be achieved separately, in another vertical level, by an optically-sensitive layer that resides above the interconnect layer.

In embodiments, global electronic shutter may be combined with multiarray image sensor systems. Global electronic shutter refers to a configuration in which a given imaging array may be sampled at substantially the same time. Put another way, in global electronic shutter, the absolute time of start-of-integration-period, and end-of-integration-period, may be rendered substantially the same for all pixels within the imaging array region.

In embodiments, a plurality of image arrays may employ global electronic shutter, and their image data may later be combined. In embodiments, the absolute time of start-of-integration-period, and end-of-integration-period, may be rendered substantially the same for all pixels associated with a plurality of arrays within the imaging system.

In embodiments, image sensor systems include a first image sensor region; a second image sensor region; where each image sensor region implements global electronic shutter, wherein, during a first period of time, each of the at least two image sensor regions accumulates electronic charges proportional to the photon fluence on each pixel within each image sensor region; and, during a second period of time, each image sensor region extracts an electronic signal proportional to the electronic charge accumulated within each pixel region within its respective integration period.

FIGS. 3A-18B show additional pixel circuits including a "global" shutter arrangement. A global shutter arrangement allows a voltage for multiple pixels or the entire array of pixels to be captured at the same time. In example embodiments, these pixel circuits may be used in combination with small pixel regions that may have an area of less than 4 micrometers squared and a distance between electrodes of less than 2 micrometers in example embodiments. The pixel regions may be formed over the semiconductor substrate and the pixel circuits may be formed on or in the substrate underneath the pixel regions. The pixel circuits may be electrically connected to the electrodes of the pixel regions through vias and interconnect layers of the integrated circuit. The metal layers may be arranged to shield the pixel circuits (including transistors or diodes used for global shutter) from light incident on the optically sensitive layers in the pixel regions, as further described below.

Some embodiments of global shutter pixel circuits have a single global shutter capture in which all of the rows are read out before a new integration period is commenced. Other embodiments have a continuous global shutter that allows integration of a new frame to occur simultaneously with the read out of a previous frame. The maximum frame rate is equal to the read out rate just as in the rolling shutter. The single global shutter may require the read out to be stalled while the pixel integrates. Therefore, the maximum frame rate may be reduced by the additional integration time.

Embodiments of global shutter pixel circuits described below include several variations of 5T, 4T, 3T, 2T, and 1T pixels that achieve global shutter using quantum dot film. In an example embodiment, the quantum dot film may be a photoconductor with an optically sensitive nanocrystal material as described above. In example embodiments, the current across the film has a non-linear relationship with light intensity absorbed by the nanocrystal material. A bias is applied across the nanocrystal material by electrodes as described above, which results in a voltage difference across the film. In example embodiments, the film provides photoconductive gain when this bias is applied across the film as described above. The electrodes may be in any of the photoconductor configurations described above or in other configurations. In some embodiments, these circuit may be used to read out one layer of a multi-layer or multi-region color pixel as described further below.

In example embodiments of global shutter pixel circuits some or all of the following may be used:

The film can be configured as a current source or current sink.

A charge store may be independent from the film in the pixel region and isolated from the radiation source.

A separation element (including non-linear elements; e.g., a diode or a switch) between the film interface and the storage element may be used A readout transistor, configured as an amplifier that may operate independently of the other commonly connected devices may be used. The amplifier is typically operated as a source follower, but other embodiments may also be used.

Implicit or parasitic diodes that can be used to either reset the film or control the readout transistor in some embodiments.

The array of pixel regions may have one common electrode shared between all pixel regions (or sets of adjacent pixels) and each pixel region may have one independent electrode isolated from the others. The common electrode can be positive or negative and does not have to be bound by CMOS rails or ESD devices in some embodiments. The common electrode can accept dynamic signaling in some embodiments.

For continuous shuttering with simultaneous readout, a mechanism to reset the film independent from the charge store is used in example embodiments.

The following FIGS. 3-18 illustrate global shutter pixel circuits according to example embodiments. FIGS. 3A-18A are each pixel schematic circuit diagrams of a particular embodiment. Corresponding FIGS. 3B-18B are each device cross-section diagrams illustrating a physical arrangement of the corresponding circuit in an integrated circuit device.

Abbreviations used to describe the various embodiments are explained as follows: 4T indicates 4 transistors are used; C indicates "continuous"; NC indicates "non-continuous"; 2D indicates 2 diodes; and +1pD indicates 1 parasitic (or essentially "free") diode.

4T, NC Global Shutter Circuits:

The operating concept of the 4T is the basis for the other designs as well. FIG. 3A is a circuit diagram of a pixel/cross-section/layout for an embodiment of a 4T, NC device 120. Device 120 is the isolation switch which enables the global shutter. The pixel is reset with RT high and T high. After the exposure expires, T is switched low and the film no longer integrates onto the gate of 140. RS is switched high and INT is sampled at CS.

Next RT and T are switched high and then low, in the appropriate order. The signal RESET is sampled. The pixel value is RESET-INT. The dark level of the pixel is adjusted by setting CD to the desired value which may be different from the value of CD during global reset. Double sampling serves the purpose of removing threshold variation and setting the dark level offset. The film at 110 acts as a current sink. Device 150 acts as a switch for the source current for the follower at 140. Device 130 resets the storage node and the film. The storage node is at 115.

5T, C Global Shutter Circuit:

FIG. 4A is a circuit diagram of a pixel/cross-section/layout for an embodiment of a 5T, C device. In order to achieve continuous global shuttering shown in FIG. 4A, the film 210 is reset independently of the storage element 215. The fifth transistor 221, as shown in FIG. 4A enables this. The film with parasitics is then considered a self contained integrator. It is reset by 230 and charge is transferred with 220. The sampling scheme is identical to the 4T design except for the fact that the storage element at 215 is now reset independently from the film, that is, signal T is low when RT is brought high.

Figure 5A:
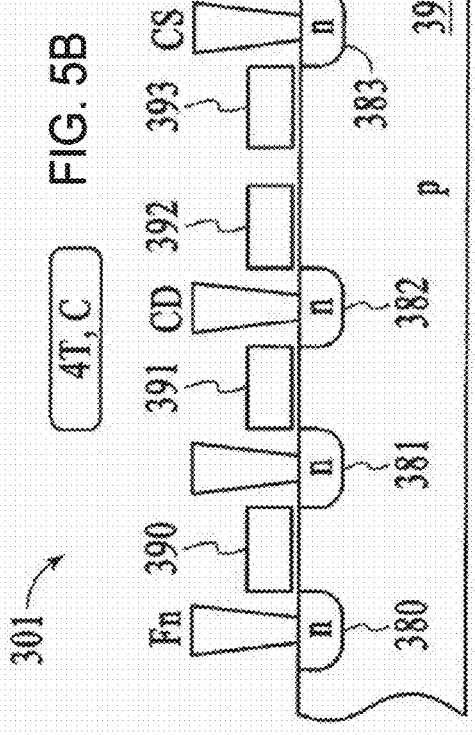
Figure 5B:
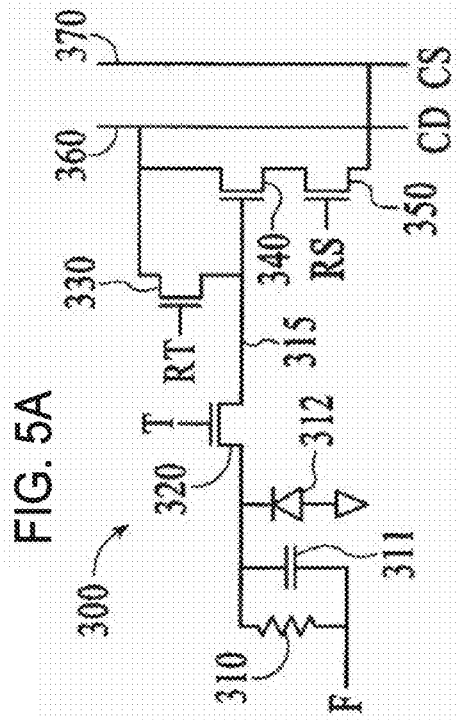

4T (+1pD), C Global Shutter Circuit:

FIG. 5A is a variation of the circuit for the 4T as in FIG. 4A with the addition of parasitics. These parasitics can be used to achieve continuous global shuttering with only 4T in this embodiment. The parasitic diode 312 now allows reset of the film 310. The common film electrode F is brought negative such that 312 tuns on and resets the film to the desired level. This charges the parasitic film capacitor 311 (not necessarily in the film). The F electrode is now brought back up to a new, higher level and the film is left to integrate. The film can now be reset as many times as desired without affecting the storage element at 315.

Figure 6A:
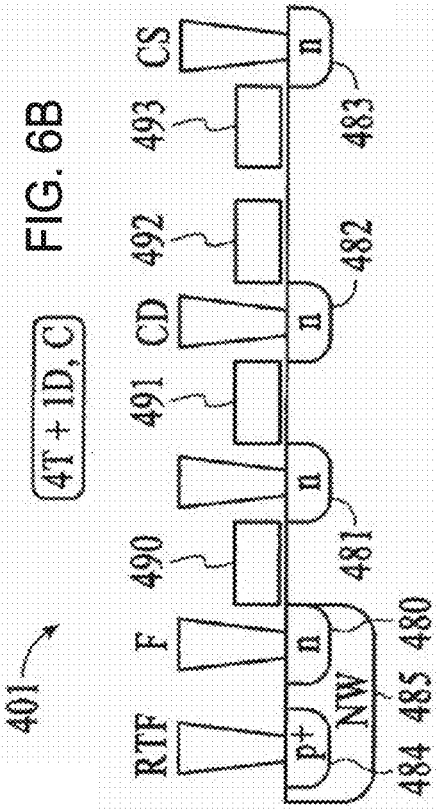
Figure 6B:
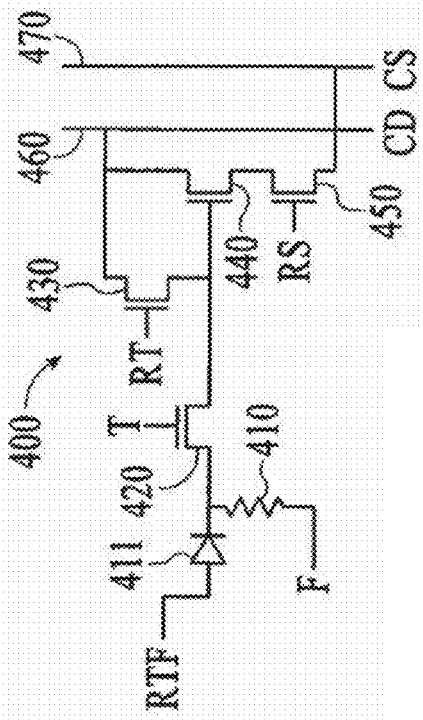

4T (+1D), C Global Shutter Circuit:

Continuous shuttering shown in FIG. 6A is achieved in 4T with the addition of a diode 411. The diode is created with a PN junction inside an Nwell region 485. The operation is the same as the 5T shown in FIG. 4A. The main different is that the reset device is replaced with a diode. When RTF is high, current can flow to pull the film at 410 to the reset level. Later RTF falls to allow integration at the film node. Parasitic capacitance provides the primary storage node.

3T (+2D), C Global Shutter Circuit:

FIG. 7A shows a 3T configuration where diode 520 replaces the transistor from 320. The parasitic diode 512 is used to reset the film 510 independently of the storage node at the gate of 540. This is achieved by pulsing the F node to a negative value such that the diode 512 turns on. After charge is integrated at 511, it is transferred by driving F to a high voltage. This turns on diode 520.

2T (+2D), C Global Shutter Circuit:

FIG. 8A shows a 2T pixel capable of continuous global shuttering. The two diodes at 612 and 620 act to reset the pixel and transfer charge as described herein. Now the row select device at 550 is eliminated. The pixel works with a single column line 670 and a single row line 660. With the addition of the RT line, a total of 2 horizontal wires and 1 vertical wire are needed for operation. This reduces the wiring load necessary for each pixel. The pixel works by resetting the storage node at the gate of 640 to a high voltage and then dropping R to the lowest value. This turns off the source follower at 640. In order to read the pixel, R is brought high. The parasitic capacitance at the pixel, particularly at Drain/Source of 630 causes the storage node to boost to a higher level as R is brought high. In this "winner-take-all" configuration, only the selected row will activate the column line.

3T (+1pD), C Global Shutter Circuit:

Another embodiment of the 3T continuous pixel is shown in FIG. 9A. Here, the row select device as described above is eliminated. One advantage of this 3T is that there are no explicit diodes. The parasitic diode at 712 resets the pixel independently from the storage node. The cross section of the device in bulk 794 shows that a small layout is possible.

1T (+3D) Global Shutter Circuit:

A 1T version of the pixel where diodes replace critical transistors is shown in FIG. 10A. First the film 810 is reset by bringing F negative. Next integrate by bringing F to an intermediate level. Finally, transfer charge by bringing F high. The scheme is such that even under saturation, bringing F high pushes charge onto the storage node. The storage node is reset by bringing R low. Since charge is always pushed onto the storage node, we guarantee that the reset function properly sets the initial charge.

Figure 11A:
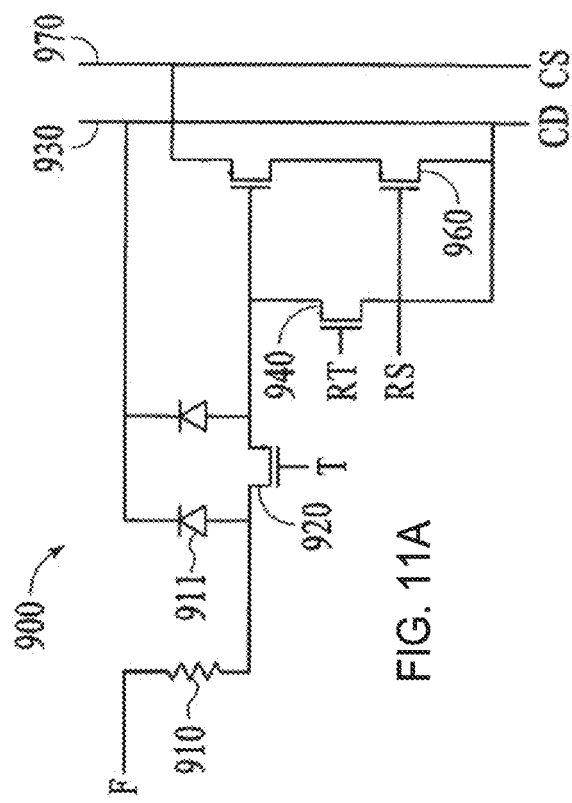
Figure 11B:
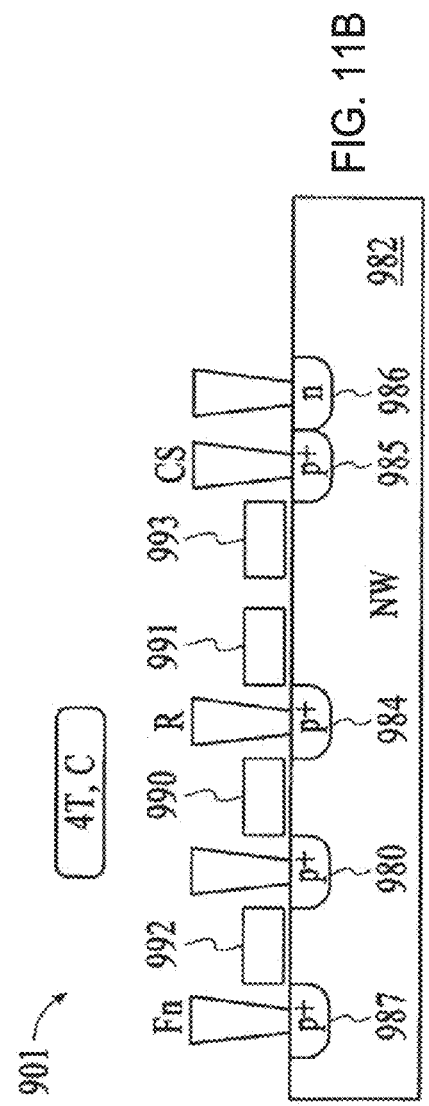

4T, PMOS Global Shutter Circuit:

A PMOS version of the 4T is shown in FIG. 11A. This operates similar to the 4T NMOS version except that continuous shuttering is feasible with the P+/NWell diodes 911. By bringing CD low enough, the film 910 reset through the diode to CD.

3T, PMOS Global Shutter Circuit:

A PMOS version of the 3T is shown in FIG. 12A. The row select device is now eliminated and a compact layout is formed.

Figure 13A:
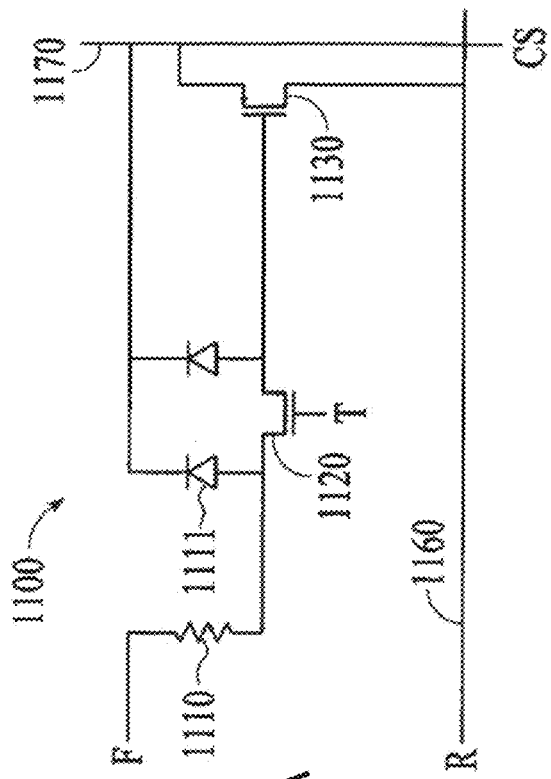
Figure 13B:
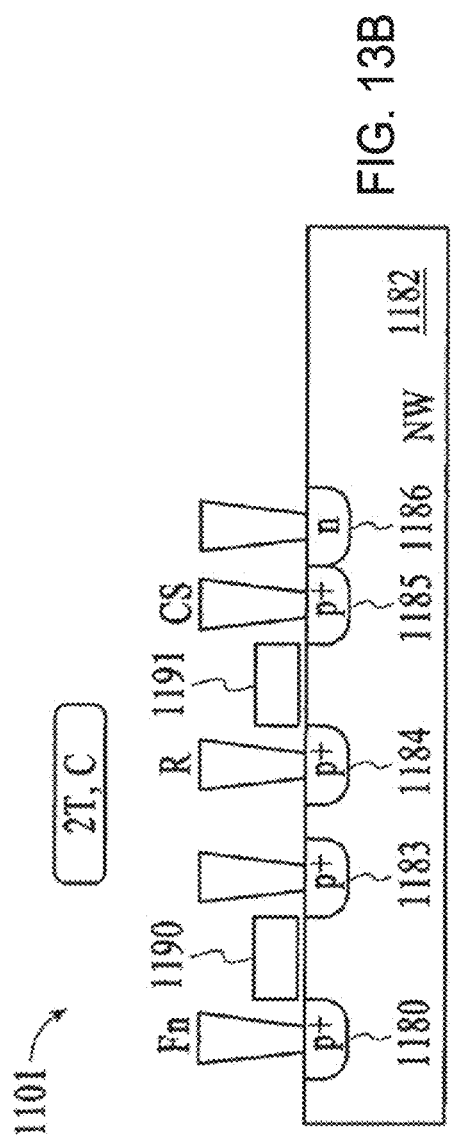

2T, PMOS Global Shutter Circuit:

A PMOS version of the 2T is shown in FIG. 13A. This works by resetting the film globally by bringing CS low. Charge is then transferred across 1120.

Figure 14A:
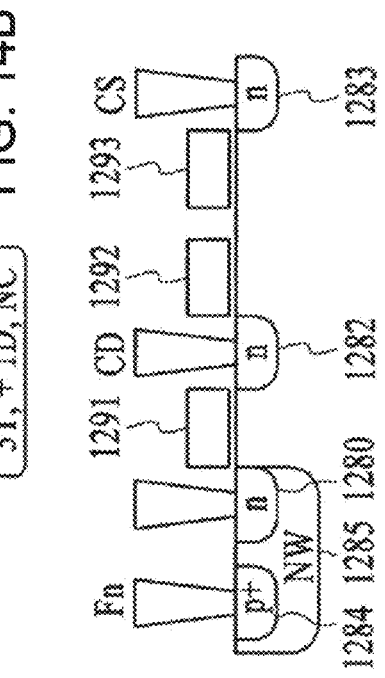

3T (+1D), NC Global Shutter Circuit:

FIG. 14A shows a 3T version of the pixel where the film 1210 sources current rather than sinks it. The pixel integrates with F high. When F is forced low the diode 1220 turns off. Once the diode turns off, no more charge is accumulated.

Figure 15A:
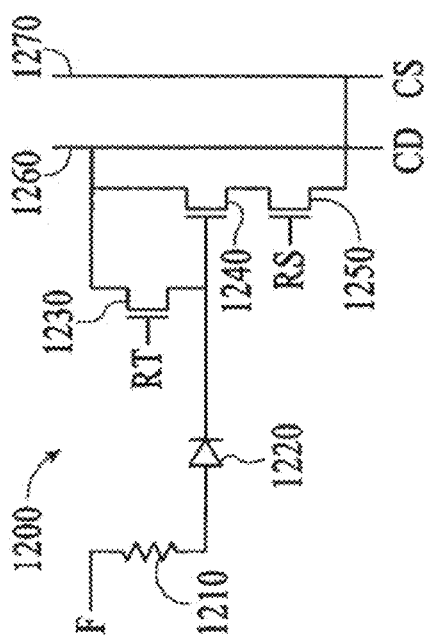
Figure 14B:
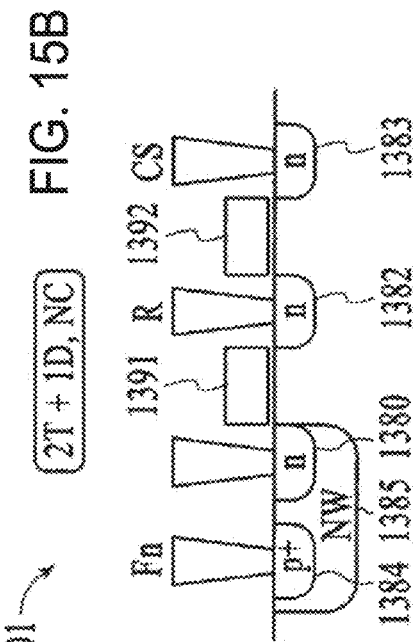
Figure 15B:
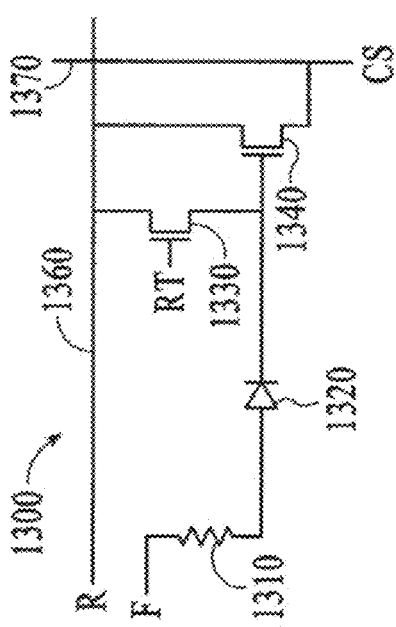

2T (+1D), NC Global Shutter Circuit:

FIG. 15A shows the 2T version where the row select device is eliminated. This saves some area from the 3T but reduces the pixel range.

Figure 16A:
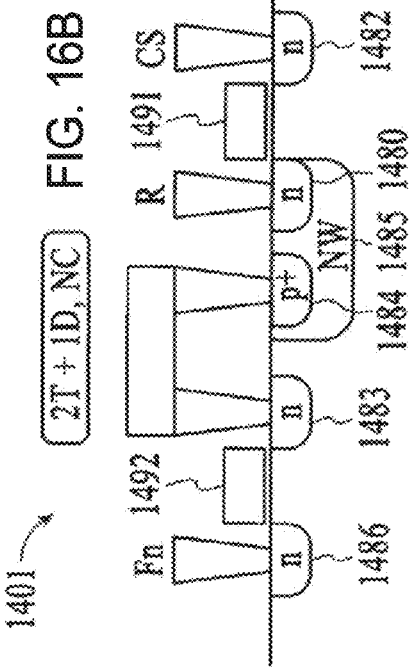
Figure 16B:
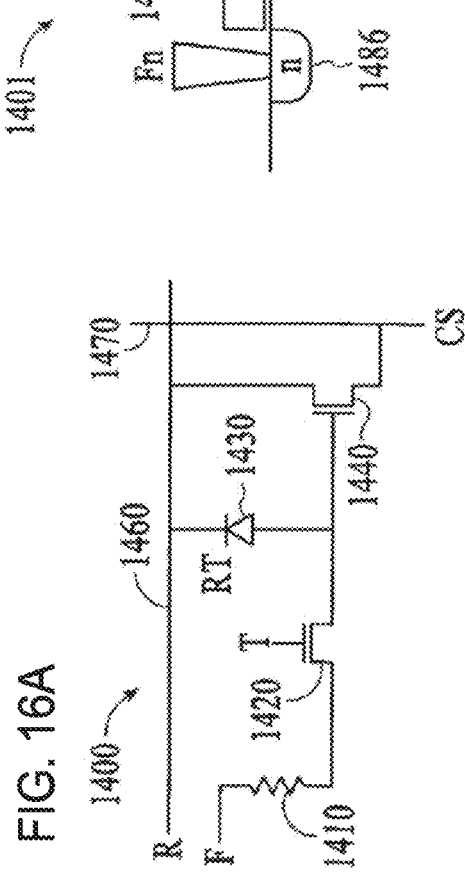

2T (+1D) Alt, NC Global Shutter Circuit:

FIG. 16A shows an alternative layout for the 2T where a diode is used as the reset device.

Figure 17A:
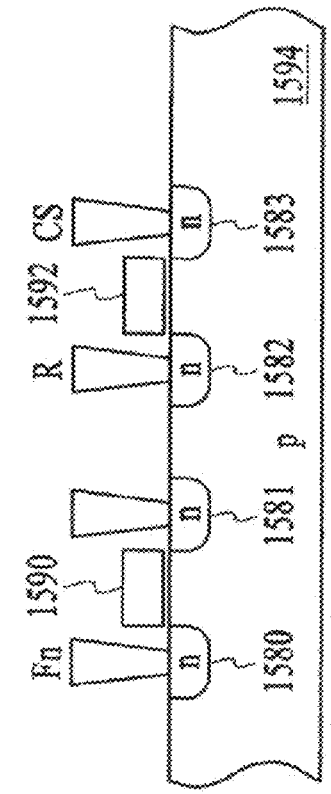
Figure 17B:
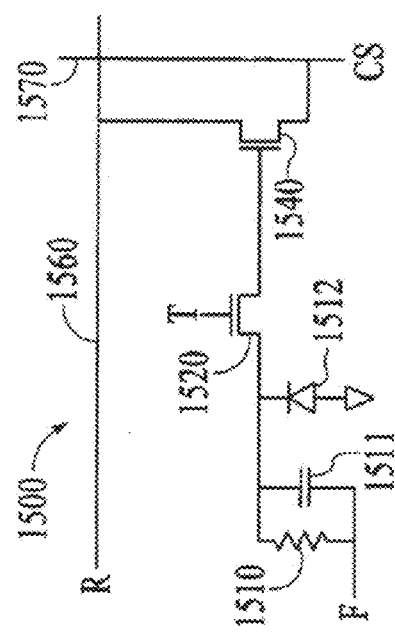

2T (+1pD), NC Global Shutter Circuit:

FIG. 17A eliminates the reset device and makes use of the parasitic diode 1512 to reset the film.

Figure 18B:
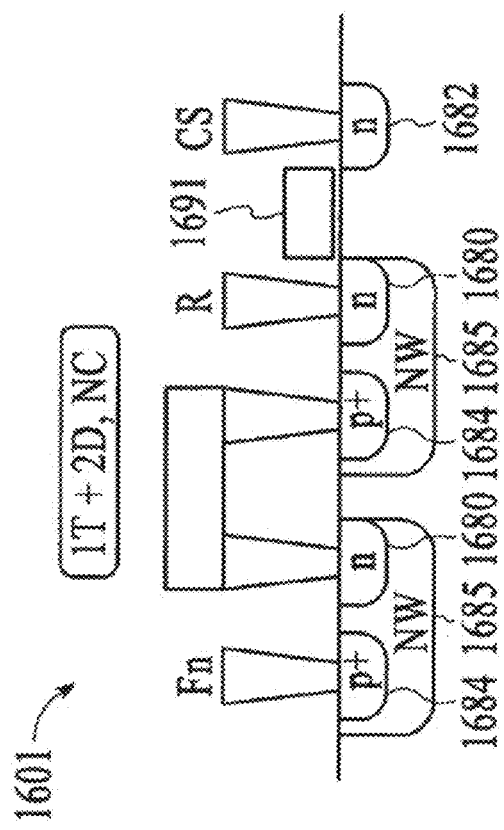
Figure 18A:
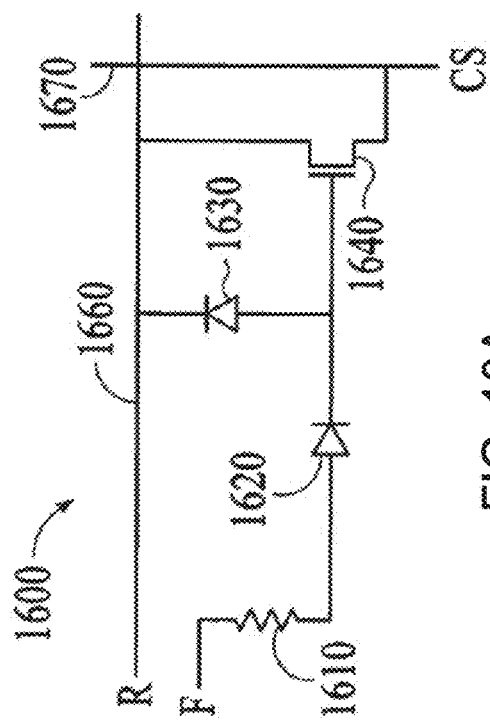

1T (+2D), NC Global Shutter Circuit:

The 1T with 2 diodes produces a compact layout as shown in FIG. 18A. If global shuttering is not needed, then it is possible to create a 1T with 1 diode. The diode in this case is very small. This 1T+1D pixel removes the diode 1620 between the film 1610 and the source follower gate 1640 and makes a direct connection from the film to the source follower gate. The operation of this pixel can be deduced from the description of the 1T+2D which follows. First reset the pixel by bringing F high and R low. The film resets through the 2 diodes down to the low voltage at R (e.g., gnd). Next drive R to 1V. This causes the film to start integrating. The voltage at the source follower gate starts to increase. If the voltage increase starts to exceed 1V, it will stay clamped by the voltage at R. This is the saturation level. For non-saturating pixel the gate will increase in voltage by less than 1V. To stop integrating charge, F is driven low. This cuts off the path for current to flow into the storage node because of the diode action. When the pixel is to be read out, R is driven up to 3V while the R at every other row is held at 1V. This causes the storage element to boost in voltage by as much as 1V. R provides the drain current for the source follower and the column line is driven by the activated row and no other rows because the source follower is in a winner take all configuration. The INT value is sampled. Next R is dropped to the low level and then pulled high again. This resets the storage node and then the RESET level is sampled. It is possible to set a dark level offset by selecting the appropriate R level in relation to the level used while resetting the film.

The above pixel circuits may be used with any of the photodetector and pixel region structures described herein. In some embodiments, the above pixel circuits may be used with multi-region pixel configurations by using a pixel circuit for each region (such as a red, green, and blue regions of optically sensitive material). The pixel circuit may read the signals into a buffer that stores multiple color values for each pixel. For example, the array may read out the pixels on a row-by-row basis. The signals can then be converted to digital color pixel data. These pixel circuits are examples only and other embodiments may use other circuits. In some embodiments, the film can be used in direct integration mode. Normally the film is treated as a photo-resistor that changes current or resistance with light level. In this direct integration mode, the film is biased to be a direct voltage output device. The voltage level directly indicates the incident light level.

In some embodiments, the quantum film signal can be read out using transistors that have high noise factors. For example, thin oxide transistors can be used to read out quantum film signal, with the presence of large leakage current and other noise sources of the transistors themselves. This becomes possible because the film has intrinsic gain which helps suppress the transistor noise.

Figure 19:
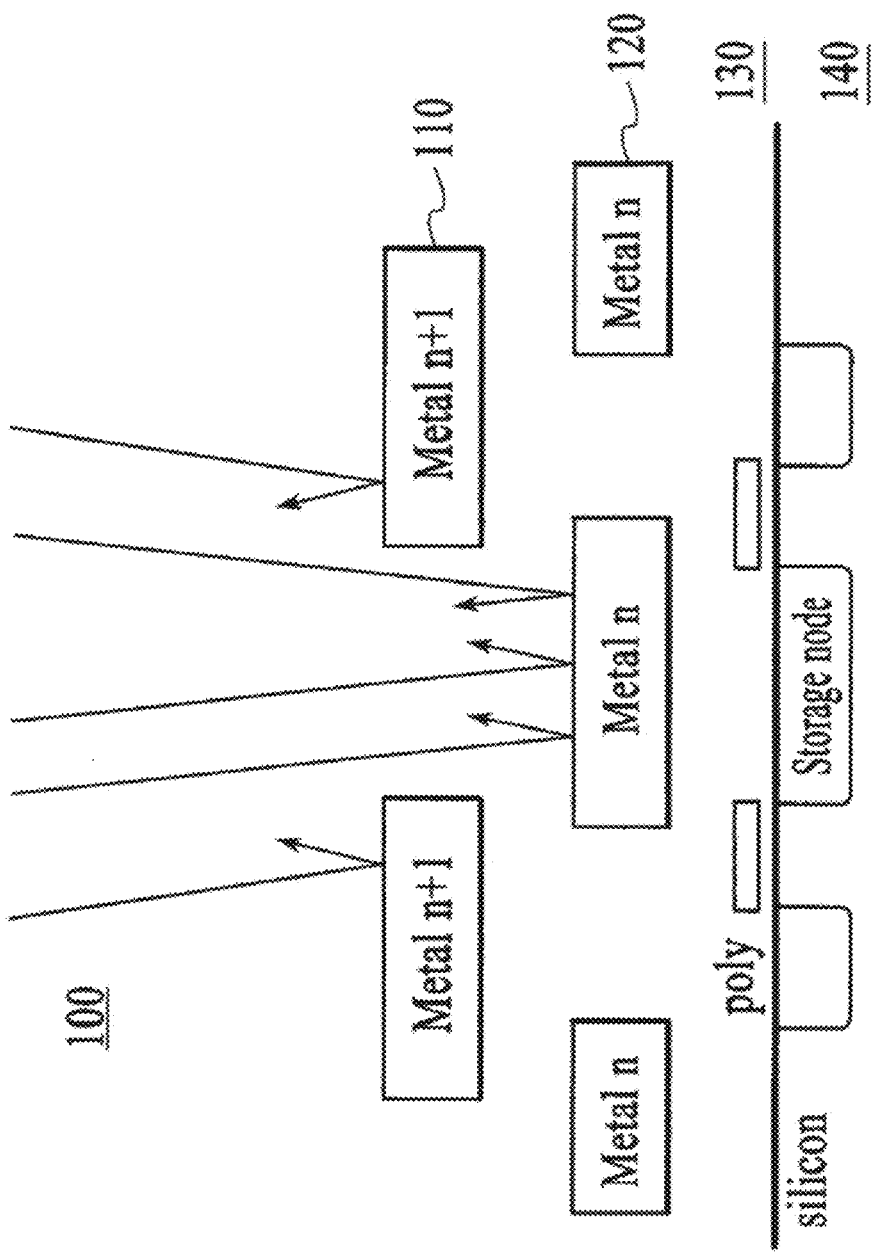
FIG. 19 shows the vertical profile of an embodiment where metal interconnect layers of an integrated circuit shield the pixel circuitry on the semiconductor substrate from incident light.
Figure 20:
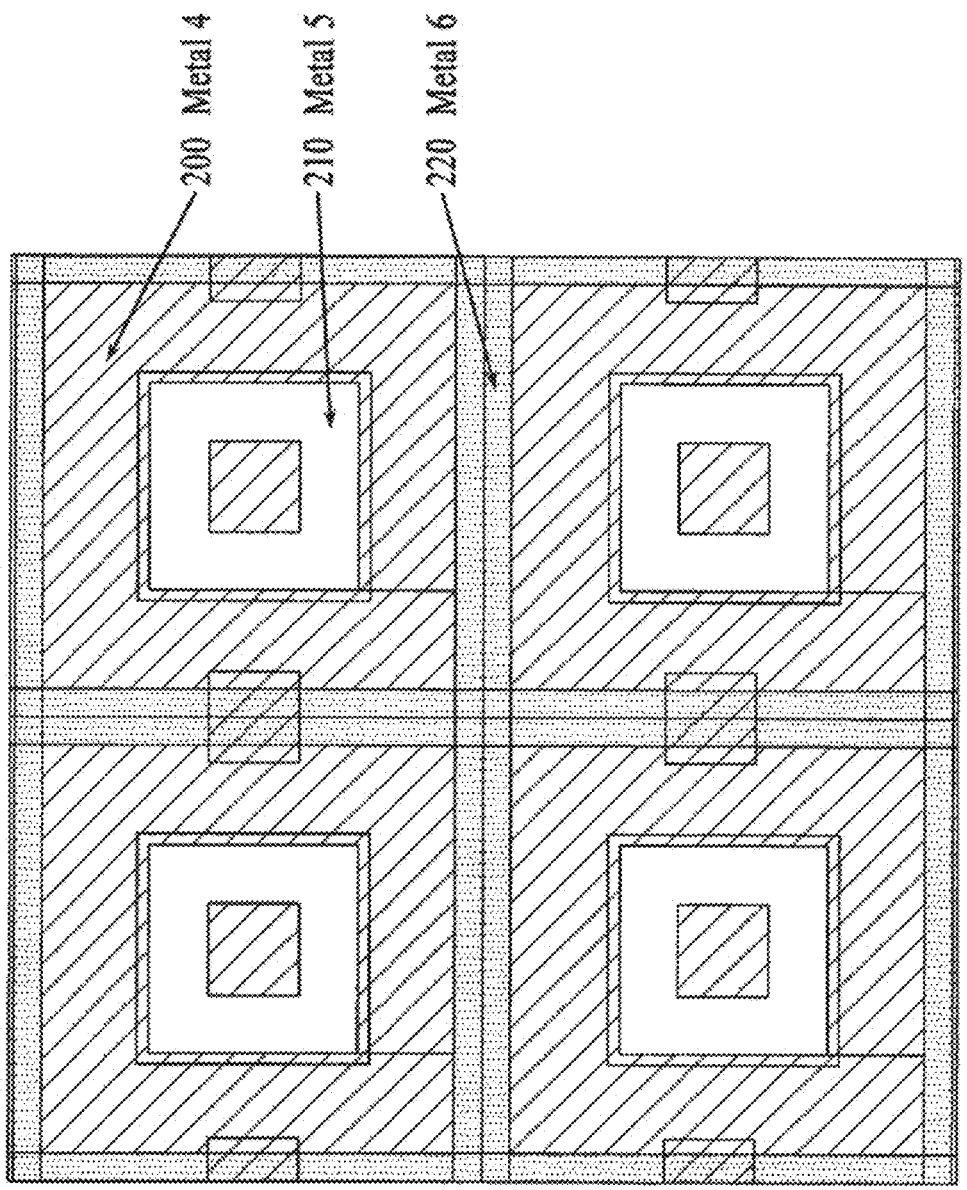
FIG. 20 shows a layout (top view) of an embodiment where metal interconnect layers of an integrated circuit shield the pixel circuitry on the semiconductor substrate from incident light.

As described above, metal and/or metal contacts in a vertical stacked structure can be laid out in different layers of the photodetector structure and used as contacts and/or as shielding or isolation components or elements. In embodiments, for example, one or more metal layers are used to isolate or shield components (e.g., charge store or charge store devices) of underlying circuitry or other components of the IC. FIGS. 19 and 20 show an embodiment in which a conductive material is positioned between the charge store of the respective pixel region such that the respective charge store is isolated from the light incident on the optically sensitive layer. At least a portion of the conductive material is in electrical communication with the optically sensitive layer of the respective pixel region. The metal regions or layers shown and described in FIGS. 37 and 38 can be used as electrical contacts, as described herein, in addition to their function as isolation elements.

FIG. 19 shows the vertical profile of a metal-covered-pixel. The pixel includes a silicon portion 140, a poly silicon layer 130, and metal layers 120 and 110. In this embodiment 120 and 110 are staggered to completely cover the silicon portion of the pixel. Some of the incident light 100 is reflected by 110. The rest of incident light 100 is reflected by metal layer 120. As a result no light can reach silicon 140. This complete improves the insensitivity to incident light of storage node (141).

FIG. 20 shows a layout (top view) of a metal-covered-pixel. In this embodiment, three metal layers (e.g., metal 4/5/6 corresponding to layers 108, 110, and 112 in FIG. 19) are used to completely cover the silicon portion of a pixel. Region 200 is metal 4, region 210 is metal 5, and region 220 is metal 6. Regions 200/210/220 cover approximately the entire pixel area, and thus prevent any light from reaching the silicon portion of the pixel below.

Figure 21:
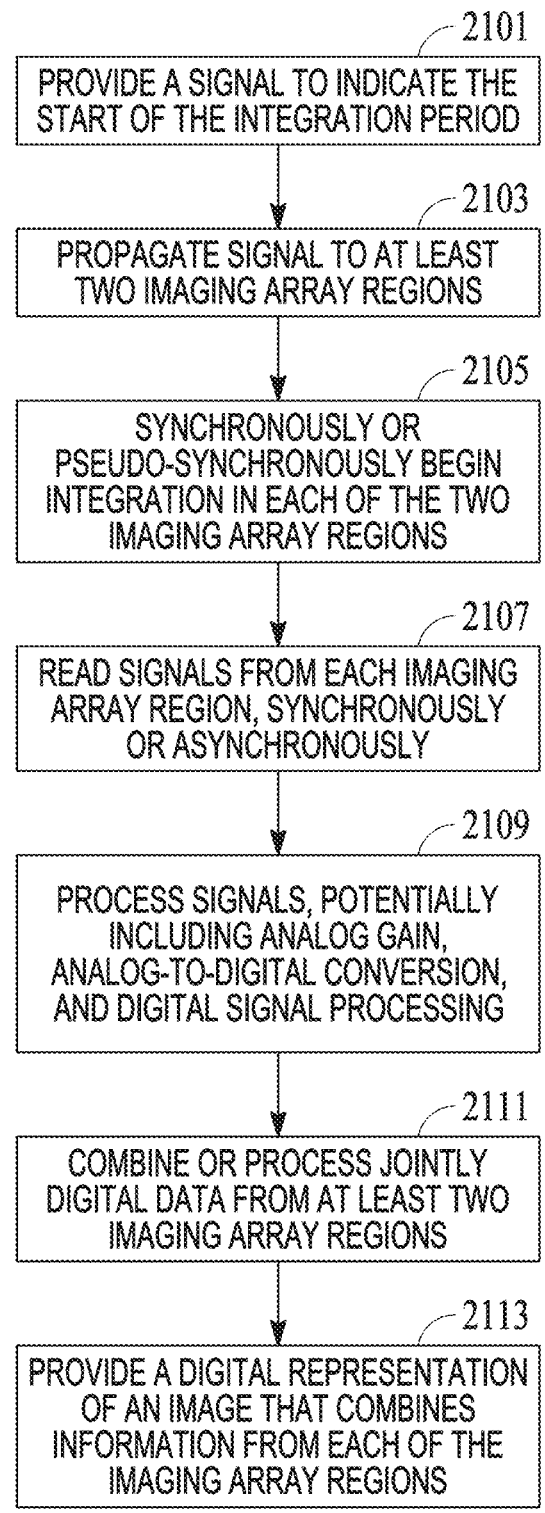
FIG. 21 is a flowchart of an example operation of the arrays.

Referring to FIG. 21, embodiments include a method that includes the following steps:

At operation 2101, providing a signal to indicate the start of the integration period;

At operation 2103, propagating said signal to at least two imaging array regions;

At operation 2105, synchronously or pseudo-synchronously begin integration into each of the two imaging array regions;

At operation 2107, read signals from each imaging array region, synchronously or asynchronously;

At operation 2109, process the signals, potentially including analog gain, analog-to-digital conversion, and digital signal processing;

At operation 2111, combine or process jointly digital data from at least two imaging array regions;

At operation 2113, provide a digital representation of an image that combines information from each of the imaging array regions.

Figure 22:
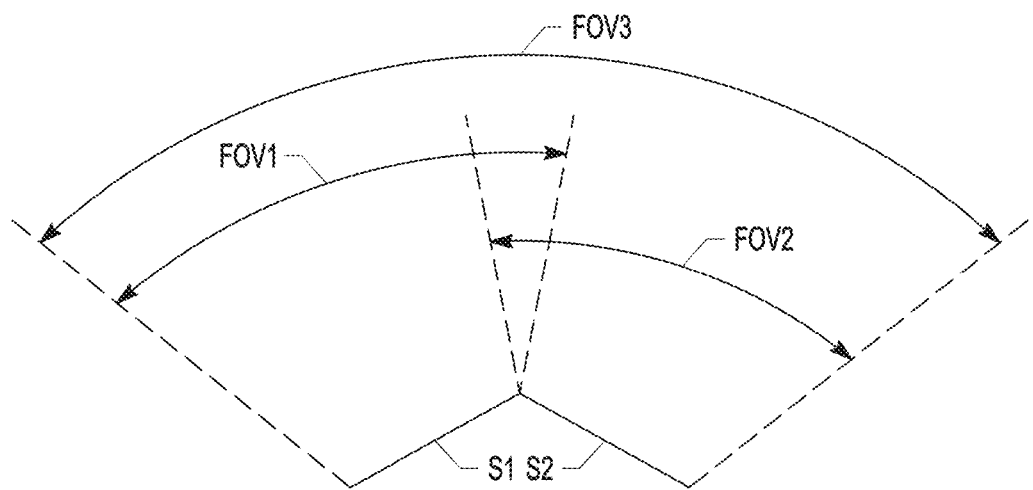
FIG. 22 shows an example embodiment of an imaging system comprising two imaging arrays in which each array views a distinct, partially overlapping, partially non-overlapping, field of view.

Referring to FIG. 22, an imaging system may include a first image sensor S1 that images field of view FOV1; and a second image sensor S2 and images field of view FOV2. In embodiments, the imaging system may provide a digital image that combines information from S1 and S2 to produce an image that substantially spans, in its information content, field of view FOV3, where FOV3 substantially spans the union of FOV1 and FOV2.

Figure 23:
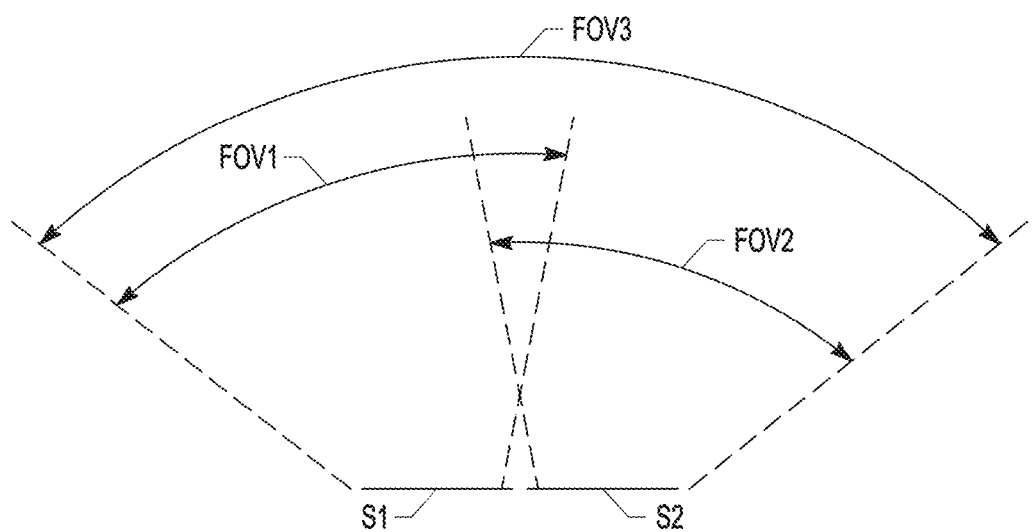
FIG. 23 shows an example embodiment of an imaging system comprising two imaging arrays in which each array views a distinct, partially overlapping, partially non-overlapping, field of view

Referring to FIG. 23, an imaging system may include a first image sensor S1 that images field of view FOV1; and a second image sensor S2 and images field of view FOV2. In embodiments, the imaging system may provide a digital image that combines information from S1 and S2 to produce an image that substantially spans, in its information content, field of view FOV3, where FOV3 substantially spans the union of FOV1 and FOV2.

Figure 24:
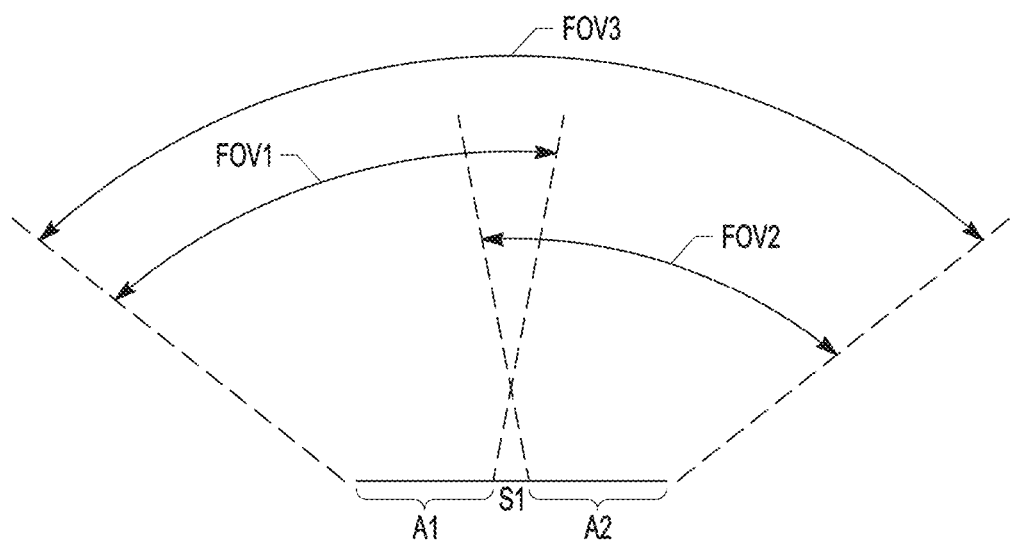
FIG. 24 shows an example embodiment of an imaging system comprising a single integrated circuit comprising at least two imaging array regions; in which each imaging array region views a distinct, partially overlapping, partially non-overlapping, field of view.

Referring to FIG. 24, an imaging system may include an integrated circuit S1 that includes imaging array region A1 and imaging array region A2; where A1 images field of view FOV1; and A2 images field of view FOV2. In embodiments, the imaging system may provide a digital image that combines information from A1 and A2 to produce an image that substantially spans, in its information content, field of view FOV3, where FOV3 substantially spans the union of FOV1 and FOV2.

Figure 25:
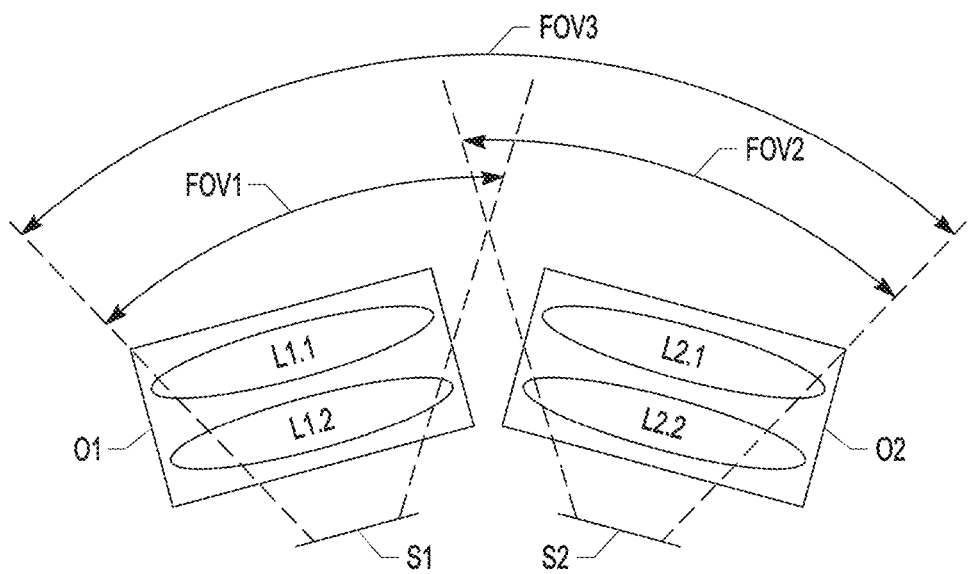
FIGS. 25-31 show various embodiments of imaging systems.

Referring to FIG. 25, an imaging system may include a first image sensor S1 and a first optic O1, O1 including at least one lens L1.1, that, together, image field of view FOV1; a second image sensor S2 and a second optic O2, O2 including at least one lens L2.1, that, together, image field of view FOV2. In embodiments, the imaging system may provide a digital image that combines information from S1 and S2 to produce an image that substantially spans, in its information content, field of view FOV3, where FOV3 substantially spans the union of FOV1 and FOV2.

Figure 26:
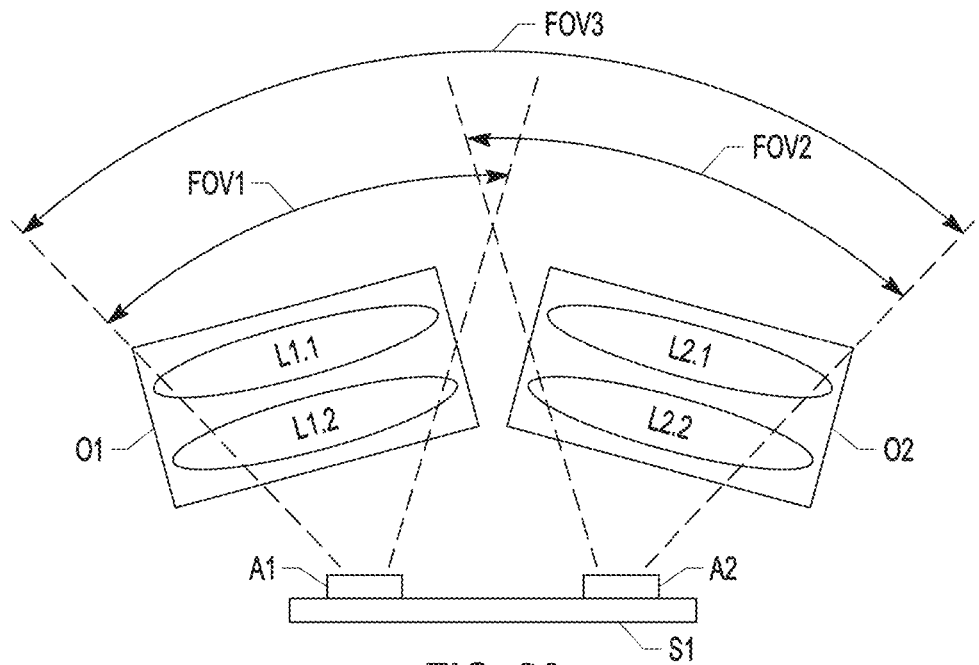

Referring to FIG. 26, an imaging system may include a first imaging array region A1 and a first optic O1, O1 including at least one lens L1.1, that, together, image field of view FOV1; a second imaging array region A2 and a second optic O2, O2 including at least one lens L2.1, that, together, image field of view FOV2. In embodiments, A1 and A2 may reside on a single integrated circuit S1. In embodiments, the imaging system may provide a digital image that combines information from A1 and A2 to produce an image that substantially spans, in its information content, field of view FOV3, where FOV3 substantially spans the union of FOV1 and FOV2.

Figure 27:
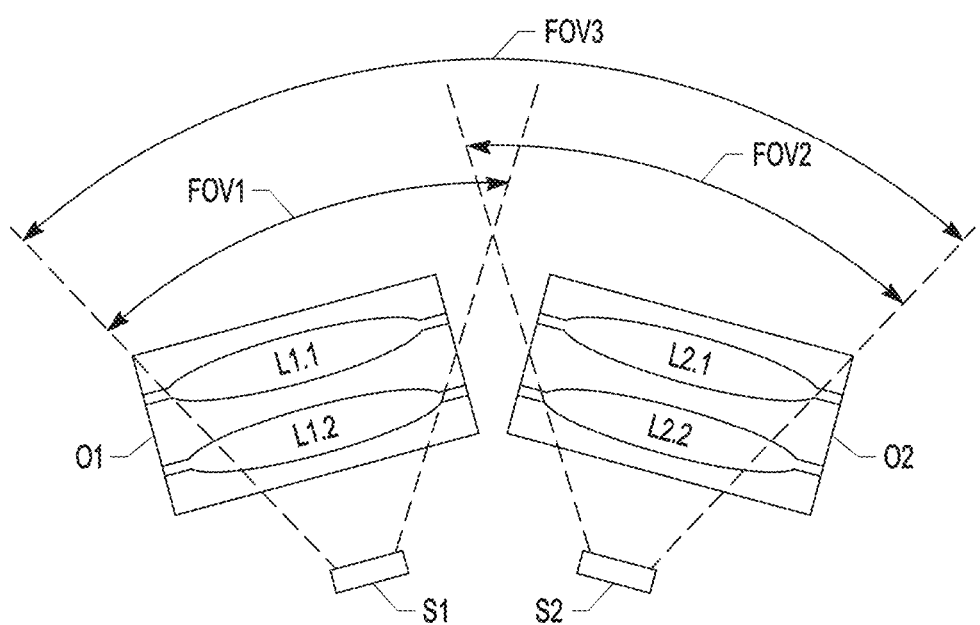

Referring to FIG. 27, an imaging system may include a first image sensor S1 and a first optic O1, O1 including at least one wafer-levels lens L1.1, that, together, image field of view FOV1; a second image sensor S2 and a second optic O2, O2 including at least one wafer-levels lens L2.1, that, together, image field of view FOV2. In embodiments, the imaging system may provide a digital image that combines information from S1 and S2 to produce an image that substantially spans, in its information content, field of view FOV3, where FOV3 substantially spans the union of FOV1 and FOV2.

Figure 28:
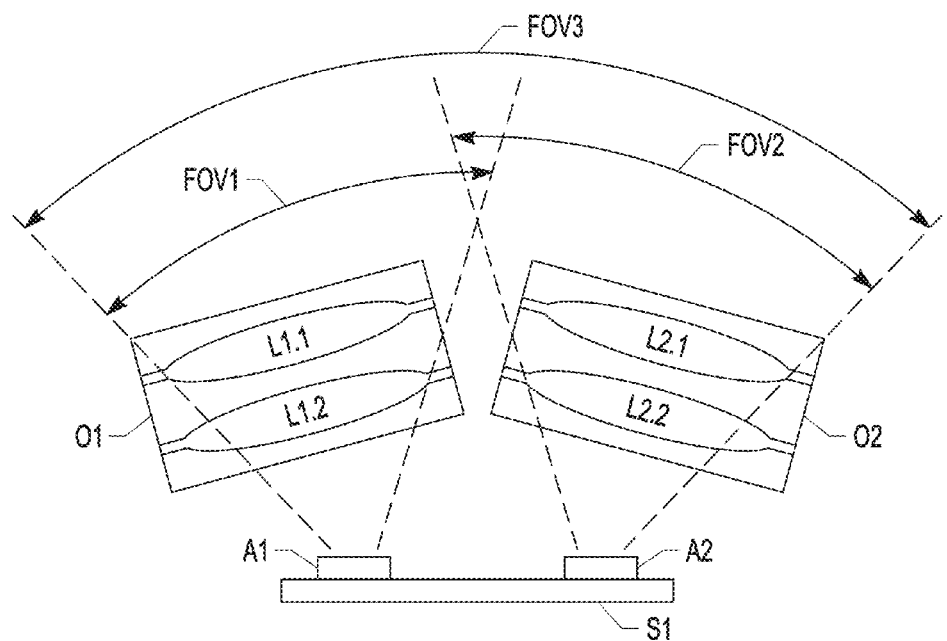

Referring to FIG. 28, an imaging system may include a first imaging array region A1 and a first optic O1, O1 including at least one wafer-level lens L1.1, that, together, image field of view FOV1; a second imaging array region A2 and a second optic O2, O2 including at least one wafer-level lens L2.1, that, together, image field of view FOV2. In embodiments, A1 and A2 may reside on a single integrated circuit S1. In embodiments, the imaging system may provide a digital image that combines information from A1 and A2 to produce an image that substantially spans, in its information content, field of view FOV3, where FOV3 substantially spans the union of FOV1 and FOV2.

Figure 29:
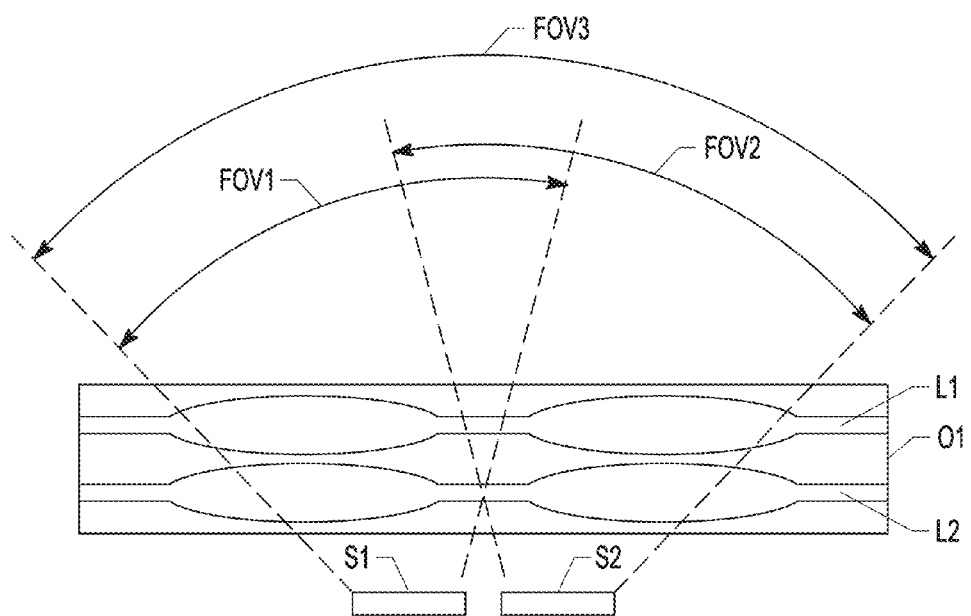

Referring to FIG. 29, an imaging system may include a first image sensor S1; a second image sensor S2; a first optic O1, O1 including at least one wafer-levels lens system L1; where L1 images field of view FOV1 onto S1; and L1 images field of view FOV2 onto S2. In embodiments, the imaging system may provide a digital image that combines information from S1 and S2 to produce an image that substantially spans, in its information content, field of view FOV3, where FOV3 substantially spans the union of FOV1 and FOV2.

Figure 30:
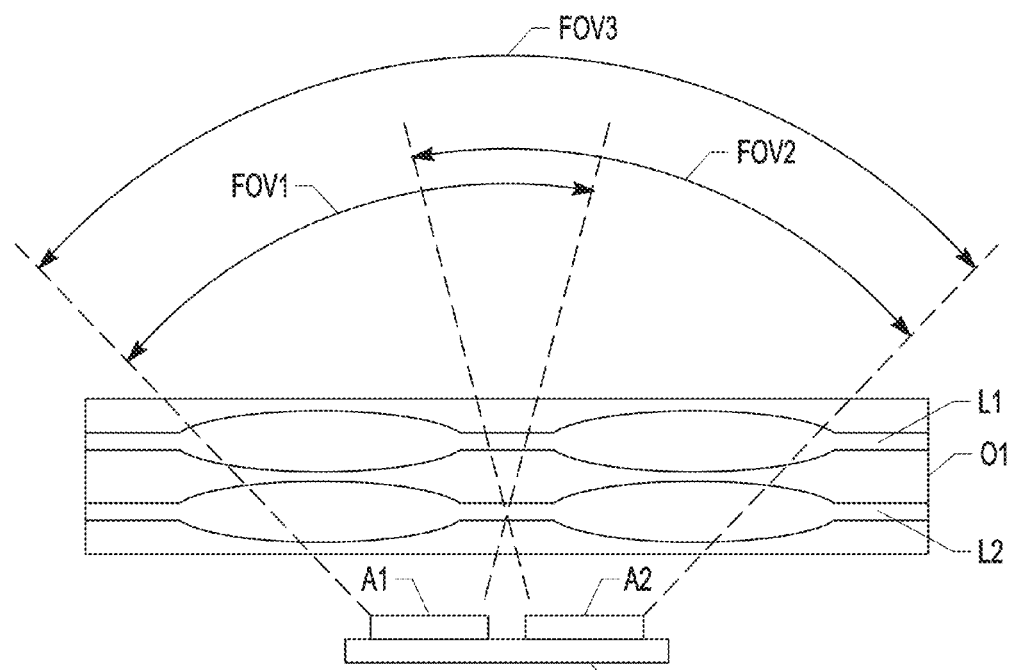

Referring to FIG. 30, an imaging system may include a first imaging array region A1; a second imaging array region A2; a first optic O1, O1 including at least one wafer-levels lens system L1; where L1 images field of view FOV1 onto A1; and L1 images field of view FOV2 onto A2. In embodiments, A1 and A2 may reside on a single integrated circuit S1. In embodiments, the imaging system may provide a digital image that combines information from A1 and A2 to produce an image that substantially spans, in its information content, field of view FOV3, where FOV3 substantially spans the union of FOV1 and FOV2.

Figure 31:
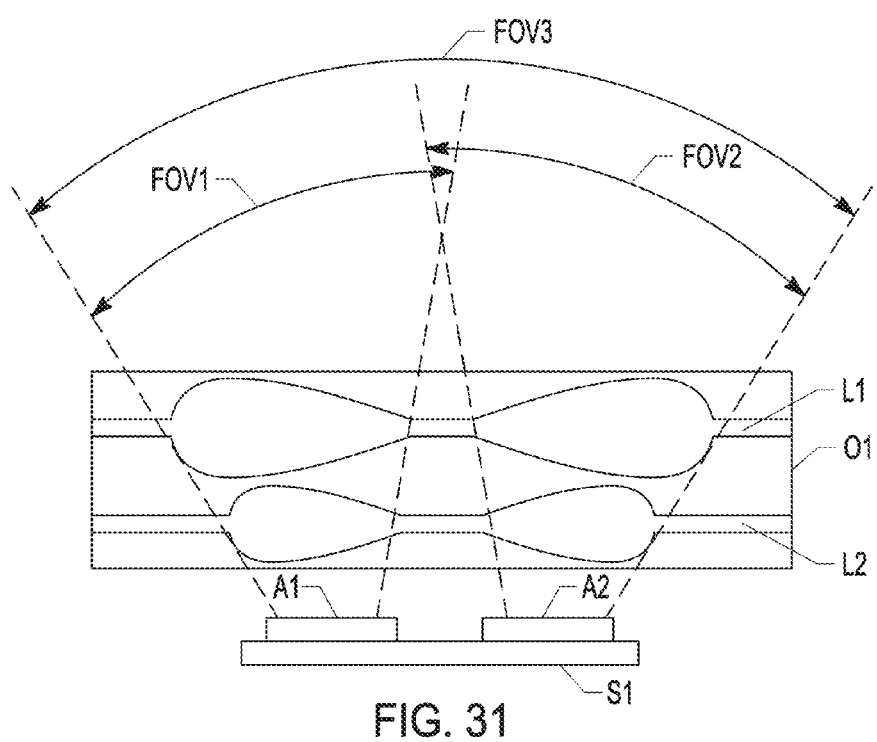

Referring to FIG. 31, an imaging system may include a first imaging array region A1; a second imaging array region A2; a first optic O1, O1 including at least one wafer-levels lens system L1; where L1 images field of view FOV1 onto A1; and L1 images field of view FOV2 onto A2. In embodiments, at least one of {L1 and L2} may include at least one lens or lens element that is noncentrosymmetric; in embodiments, it may include astigmatism. In embodiments, A1 and A2 may reside on a single integrated circuit S1. In embodiments, the imaging system may provide a digital image that combines information from A1 and A2 to produce an image that substantially spans, in its information content, field of view FOV3, where FOV3 substantially spans the union of FOV1 and FOV2.

Figure 32:
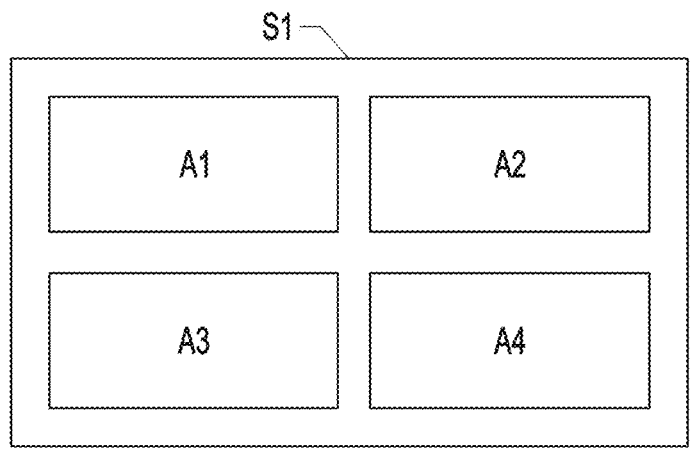
FIGS. 32 and 33 show imaging array regions and fields-of-view of various imaging systems.
Figure 33:
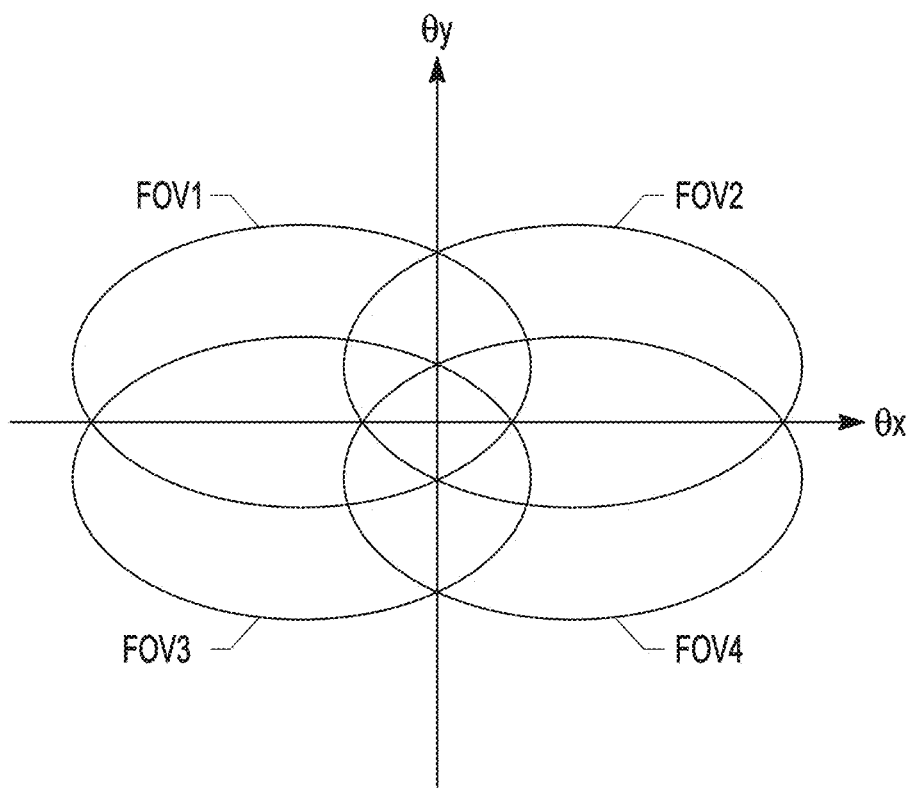

Referring to FIG. 32 and FIG. 33, an imaging system may include a first imaging array region A1; a second imaging array region A2; a third imaging array A3; and a fourth imaging array A4. In embodiments, at least two of {A1, A2, A3, A4} may reside on a single integrated circuit S1. In embodiments, the imaging system may provide a digital image that combines information from at least two of {A1, A2, A3, A4} to produce an image that substantially spans, in its information content, at least two of fields-of-view (see FIG. 33) {FOV1, FOV2, FOV3, FOV4}.

Figure 34:
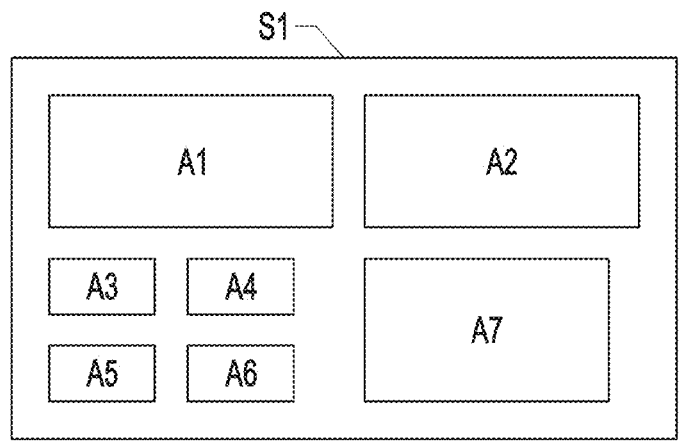
FIGS. 34 and 35 show a series of imaging array regions and fields-of-view of various imaging systems.
Figure 35:
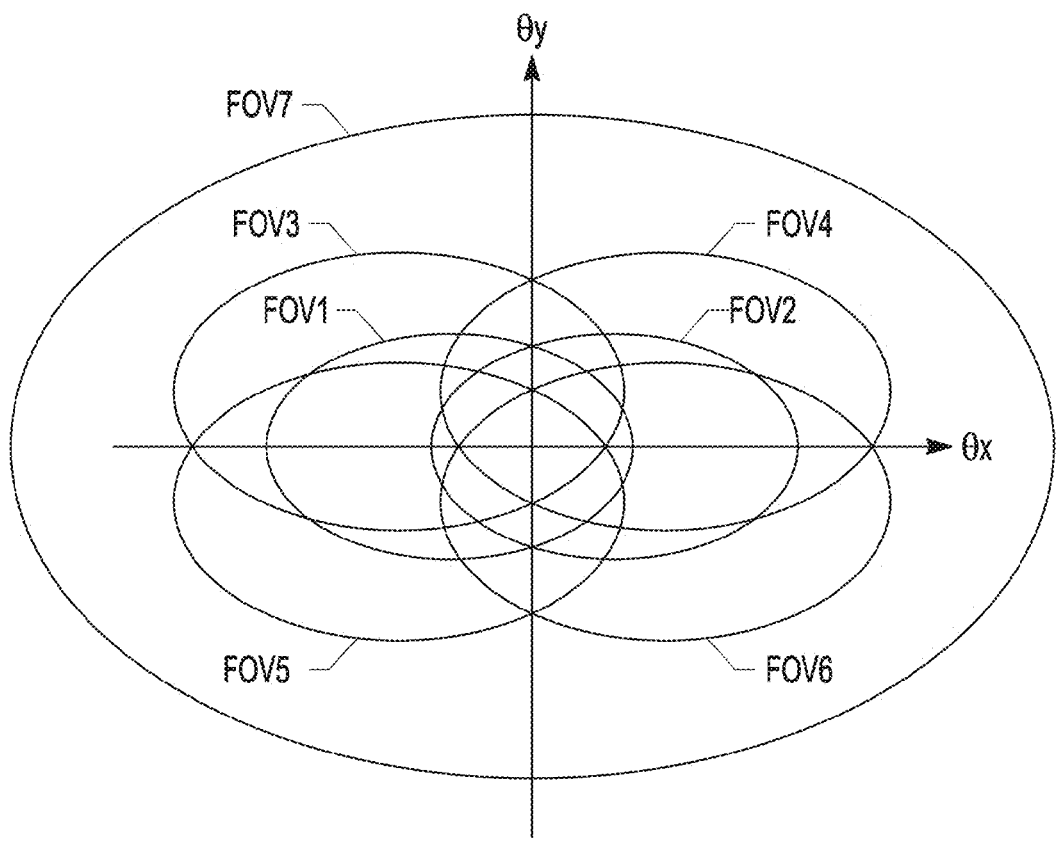

Referring to FIG. 34 and FIG. 35, an imaging system may include a series of imaging array regions such as {A1 . . . A7}. In embodiments, at least two of {A1 . . . A7} may reside on a single integrated circuit S1. In embodiments, the imaging system may provide a digital image that combines information from at least two of {A1 . . . A7} to produce an image that substantially spans, in its information content, at least two of fields-of-view (see FIG. 35) {FOV1 . . . FOV7}. In embodiments, the total angular span in x, y, or both, of at least one of {FOV1 . . . FOV7}, is substantially less than the total angular span in x, y, or both, of at least another of {FOV1 . . . FOV7}. In embodiments, the area of at least one of {A1 . . . A7} is substantially less than the area of at least another of {A1 . . . A7}. In embodiments, the area of each pixel in at least one of {A1 . . . A7} is substantially less than the area of each pixel in at least another of {A1 . . . A7}. In embodiments, said first pixel area is chosen from the list {1.4×1.4 µm, 1.1×1.1 µm}, and said second smaller pixel area is chosen from the list {1.1×1.1 µm, 0.9×0.9 µm, 0.7×0.7 µm, and 0.5×0.5 µm}. In embodiments, a higher degree of resolution may be achieved in certain imaging arrays than in others. In embodiments, if greater resolution is desired in the center of the image compared to the periphery, the total resolution dedicated—via individual high-resolution sensors, and/or combining information from multiple arrays—may be selected to be higher in the center of an image.

In embodiments, at least one imaging array region provides a different viewing angle, or line of sight, on a scene compared to a second imaging array region, i.e., there is a different apparent position of a given object viewed from the two imaging array regions. In embodiments, differences in line of sight, or parallax, or viewing angle, are used to infer the depth into the scene of objects. In embodiments, depth is estimated by combining information acquired from at least two imaging array regions. In embodiments, imaging system may, following assembly, employ a training period in which the difference in line of sight is determined using a selection of known test scenes; and software is employed that employs knowledge of the specific parallax error of a specific assembled imaging system to provide depth estimation. In embodiments, manufacturing tolerances are reduced by the fact that an exact offset does not need to be achieved; but, instead, the final offset can be estimated following assembly.

In embodiments, in along a first dimension, labeled x, a number n_x imaging array region may be employed; and along a second dimension, labeled y, a number n_y imaging array regions may be employed. In embodiments, images from the multiple imaging array regions may be combined to provide a field of view greater than the individual fields of view of at least one of the constituent imaging array regions. In embodiments, n_x is not equal to n_y. In embodiments, n_x=2, n_y=1. In embodiments, nx=3, n_y=1. In embodiments, nx=3, n_y=2. In embodiments, nx=4, n_y=2.

In embodiments, in along a first dimension, labeled x, a number n_x optical systems, aka camera, may be employed; and along a second dimension, labeled y, a number n_y cameras may be employed. In embodiments, images from the multiple cameras may be combined to provide a field of view greater than the individual fields of view of at least one of the constituent cameras. In embodiments, n_x is not equal to n_y. In embodiments, n_x=2, n_y=1. In embodiments, nx=3, n_y=1. In embodiments, nx=3, n_y=2. In embodiments, nx=4, n_y=2.

In embodiments, image sensor integrated circuits making up a multiarray, or multi-integrated-circuit, imaging system may be selected from the set:

Front-side-illuminated image sensor;

Back-side-illuminated image sensor;

Image sensors employing an optically sensitive layer electrically coupled to metal electrodes in a front-side-illuminated image sensor;

Image sensors employing an optically sensitive layer electrically coupled to metal electrodes in a back-side-illuminated image sensor;

Image sensors employing an optically sensitive layer electrically coupled to a silicon diode in a front-side-illuminated image sensor; and Image sensors employing an optically sensitive layer electrically coupled to a silicon diode in a back-side-illuminated image sensor.

In embodiments, arrays may employ pixels having different sizes. In embodiments, the principal array may employ 1.4 µm×1.4 µm pixels, and the secondary array may employ 1.1 µm×1.1 µm pixels.

In embodiments, arrays may include pixels having different sizes. In an example embodiment, at least one pixel may have linear dimensions of 1.4 µm×1.4 µm, and at least one pixel on the same image sensor integrated circuit may have linear dimensions 1.1 µm×1.1 µm pixels.

Pixel sizes can vary from less than about 0.5 to 3 microns across a lateral dimension or any range subsumed therein (less than about 0.5 to 3 microns squared in area or any range subsumed therein). In examples, the pixels size may be less than about 1.3, 1.4, 1.5, 1.7, 2, 2.2 or 2.5 microns (with less than that amount squared in area). Specific examples are 1.2 and 1.4 microns. The primary array may have larger pixels than secondary array. Primary may be greater than 0.5, 0.7, 1, 1.2 or 1.4 or 1.5 microns and less than 1, 1.2, 1.5, 1.7, 2, 2.2, 2.5 or 3 microns. The one or more secondary arrays could be also be greater than 0.5, 0.7, 1, 1.2 or 1.4 or 1.5 microns and less than 1, 1.2, 1.5, 1.7, 2, 2.2, 2.5 or 3 microns but would be smaller than the primary. For example, the primary may be greater than X and the secondary may be less than X, where X is 1.2, 1.4, 1.5, 1.7, or 2, etc.

In example embodiments, arrays A1 and A2 may be on a single substrate. A photosensitive layer may be formed over the substrate with pixel circuitry below the photosensitive region. In some embodiments, photosensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

Referring again to FIG. 1, FIG. 1 shows structure of and areas relating to quantum dot pixel chip structures (QDPCs) 100, according to example embodiments. As illustrated in FIG. 1, the QDPC 100 may be adapted as a radiation 1000 receiver where quantum dot structures 1100 are presented to receive the radiation 1000, such as light. The QDPC 100 includes quantum dot pixels 1800 and a chip 2000 where the chip is adapted to process electrical signals received from the quantum dot pixel 1800. The quantum dot pixel 1800 includes the quantum dot structures 1100 include several components and sub components such as quantum dots 1200, quantum dot materials 200 and particular configurations or quantum dot layouts 300 related to the dots 1200 and materials 200. The quantum dot structures 1100 may be used to create photodetector structures 1400 where the quantum dot structures are associated with electrical interconnections 1404. The electrical connections 1404 are provided to receive electric signals from the quantum dot structures and communicate the electric signals on to pixel circuitry 1700 associated with pixel structures 1500. Just as the quantum dot structures 1100 may be laid out in various patterns, both planar and vertical, the photodetector structures 1400 may have particular photodetector geometric layouts 1402. The photodetector structures 1400 may be associated with pixel structures 1500 where the electrical interconnections 1404 of the photodetector structures are electrically associated with pixel circuitry 1700. The pixel structures 1500 may also be laid out in pixel layouts 1600 including vertical and planar layouts on a chip 2000 and the pixel circuitry 1700 may be associated with other components 1900, including memory for example. The pixel circuitry 1700 may include passive and active components for processing of signals at the pixel 1800 level. The pixel 1800 is associated both mechanically and electrically with the chip 2000. From an electrical viewpoint, the pixel circuitry 1700 may be in communication with other electronics (e.g. chip processor 2008). The other electronics may be adapted to process digital signals, analog signals, mixed signals and the like and it may be adapted to process and manipulate the signals received from the pixel circuitry 1700. In other embodiments, a chip processor 2008 or other electronics may be included on the same semiconductor substrate as the QDPCs and may be structured using a system-on-chip architecture. The chip 2000 also includes physical structures 2002 and other functional components 2004, which will also be described in more detail below.

The QDPC 100 detects electromagnetic radiation 1000, which in embodiments may be any frequency of radiation from the electromagnetic spectrum. Although the electromagnetic spectrum is continuous, it is common to refer to ranges of frequencies as bands within the entire electromagnetic spectrum, such as the radio band, microwave band, infrared band (IR), visible band (VIS), ultraviolet band (UV), X-rays, gamma rays, and the like. The QDPC 100 may be capable of sensing any frequency within the entire electromagnetic spectrum; however, embodiments herein may reference certain bands or combinations of bands within the electromagnetic spectrum. It should be understood that the use of these bands in discussion is not meant to limit the range of frequencies that the QDPC 100 may sense, and are only used as examples. Additionally, some bands have common usage sub-bands, such as near infrared (NIR) and far infrared (FIR), and the use of the broader band term, such as IR, is not meant to limit the QDPCs 100 sensitivity to any band or sub-band. Additionally, in the following description, terms such as "electromagnetic radiation," "radiation," "electromagnetic spectrum," "spectrum," "radiation spectrum," and the like are used interchangeably, and the term color is used to depict a select band of radiation 1000 that could be within any portion of the radiation 1000 spectrum, and is not meant to be limited to any specific range of radiation 1000 such as in visible 'color.'

In the example embodiment of FIG. 1, the nanocrystal materials and photodetector structures described above may be used to provide quantum dot pixels 1800 for a photosensor array, image sensor or other optoelectronic device. In example embodiments, the pixels 1800 include quantum dot structures 1100 capable of receiving radiation 1000, photodetectors structures adapted to receive energy from the quantum dot structures 1100 and pixel structures. The quantum dot pixels described herein can be used to provide the following in some embodiments: high fill factor, potential to bin, potential to stack, potential to go to small pixel sizes, high performance from larger pixel sizes, simplify color filter array, elimination of de-mosaicing, self-gain setting/automatic gain control, high dynamic range, global shutter capability, auto-exposure, local contrast, speed of readout, low noise readout at pixel level, ability to use larger process geometries (lower cost), ability to use generic fabrication processes, use digital fabrication processes to build analog circuits, adding other functions below the pixel such as memory, A to D, true correlated double sampling, binning, etc. Example embodiments may provide some or all of these features. However, some embodiments may not use these features.

A quantum dot 1200 may be a nanostructure, typically a semiconductor nanostructure, that confines a conduction band electrons, valence band holes, or excitons (bound pairs of conduction band electrons and valence band holes) in all three spatial directions. A quantum dot exhibits in its absorption spectrum the effects of the discrete quantized energy spectrum of an idealized zero-dimensional system. The wave functions that correspond to this discrete energy spectrum are typically substantially spatially localized within the quantum dot, but extend over many periods of the crystal lattice of the material.

Figure 36:
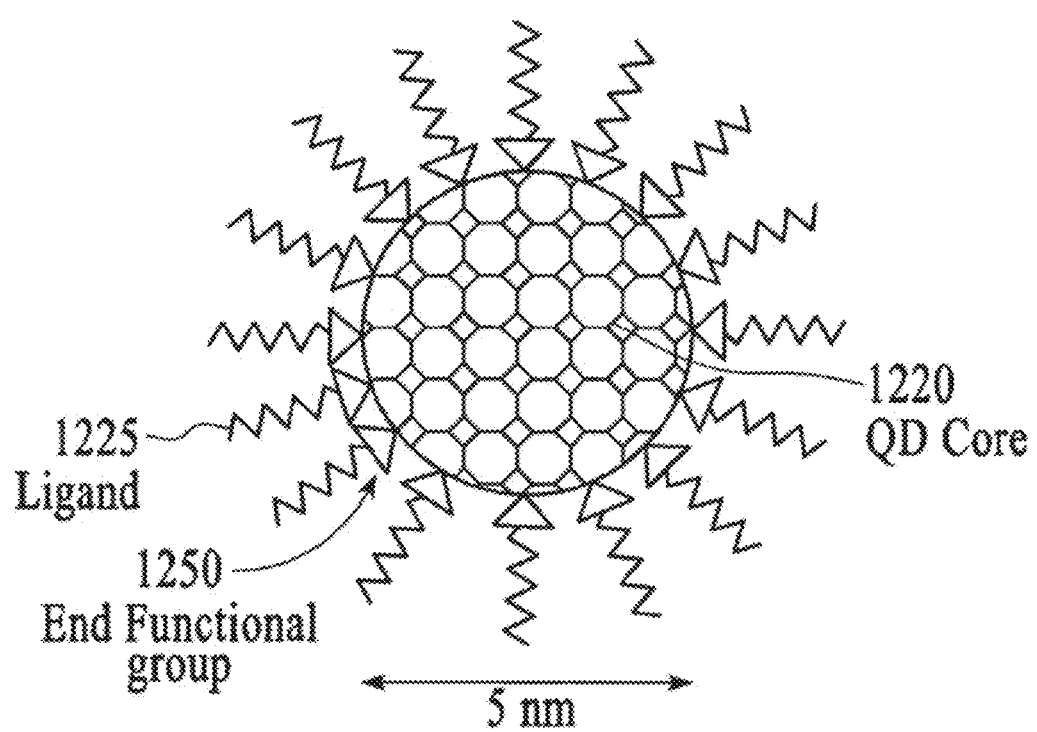
FIG. 36 shows an example of a quantum dot.

FIG. 36 shows an example of a quantum dot 1200. In one example embodiment, the QD 1200 has a core 1220 of a semiconductor or compound semiconductor material, such as PbS. Ligands 1225 may be attached to some or all of the outer surface or may be removed in some embodiments as described further below. In embodiments, the cores 1220 of adjacent QDs may be fused together to form a continuous film of nanocrystal material with nanoscale features. In other embodiments, cores may be connected to one another by linker molecules.

Some embodiments of the QD optical devices are single image sensor chips that have a plurality of pixels, each of which includes a QD layer that is radiation 1000 sensitive, e.g., optically active, and at least two electrodes in electrical communication with the QD layer. The current and/or voltage between the electrodes is related to the amount of radiation 1000 received by the QD layer. Specifically, photons absorbed by the QD layer generate electron-hole pairs, such that, if an electrical bias is applied, a current flows. By determining the current and/or voltage for each pixel, the image across the chip can be reconstructed. The image sensor chips have a high sensitivity, which can be beneficial in low-radiation-detecting 1000 applications; a wide dynamic range allowing for excellent image detail; and a small pixel size. The responsivity of the sensor chips to different optical wavelengths is also tunable by changing the size of the QDs in the device, by taking advantage of the quantum size effects in QDs. The pixels can be made as small as 1 square micron or less, such as 700×700 nm, or as large as 30 by 30 microns or more or any range subsumed therein.

The photodetector structure 1400 is a device configured so that it can be used to detect radiation 1000 in example embodiments. The detector may be 'tuned' to detect prescribed wavelengths of radiation 1000 through the types of quantum dot structures 1100 that are used in the photodetector structure 1400. The photodetector structure can be described as a quantum dot structure 1100 with an I/O for some input/output ability imposed to access the quantum dot structures' 1100 state. Once the state can be read, the state can be communicated to pixel circuitry 1700 through an electrical interconnection 1404, wherein the pixel circuitry may include electronics (e.g., passive and/or active) to read the state. In an embodiment, the photodetector structure 1400 may be a quantum dot structure 1100 (e.g., film) plus electrical contact pads so the pads can be associated with electronics to read the state of the associated quantum dot structure.

In embodiments, processing my include binning of pixels in order to reduce random noise associated with inherent properties of the quantum dot structure 1100 or with readout processes. Binning may involve the combining of pixels 1800, such as creating 2×2, 3×3, 5×5, or the like superpixels. There may be a reduction of noise associated with combining pixels 1800, or binning, because the random noise increases by the square root as area increases linearly, thus decreasing the noise or increasing the effective sensitivity. With the QDPC's 100 potential for very small pixels, binning may be utilized without the need to sacrifice spatial resolution, that is, the pixels may be so small to begin with that combining pixels does not decrease the required spatial resolution of the system. Binning may also be effective in increasing the speed with which the detector can be run, thus improving some feature of the system, such as focus or exposure.

In embodiments the chip may have functional components that enable high-speed readout capabilities, which may facilitate the readout of large arrays, such as 5 Mpixels, 6 Mpixels, 8 Mpixels, 12 Mpixels, 24 Mpixels, or the like. Faster readout capabilities may require more complex, larger transistor-count circuitry under the pixel 1800 array, increased number of layers, increased number of electrical interconnects, wider interconnection traces, and the like.

In embodiments, it may be desirable to scale down the image sensor size in order to lower total chip cost, which may be proportional to chip area. Embodiments include the use of micro-lenses. Embodiments include using smaller process geometries.

In embodiments, pixel size, and thus chip size, may be scaled down without decreasing fill factor. In embodiments, larger process geometries may be used because transistor size, and interconnect line-width, may not obscure pixels since the photodetectors are on the top surface, residing above the interconnect. In embodiments, geometries such as 90 nm, 0.13 µm and 0.18 µm may be employed without obscuring pixels. In embodiments, small geometries such as 90 nm and below may also be employed, and these may be standard, rather than image-sensor-customized, processes, leading to lower cost. In embodiments, the use of small geometries may be more compatible with high-speed digital signal processing on the same chip. This may lead to faster, cheaper, and/or higher-quality image sensor processing on chip. In embodiments, the use of more advanced geometries for digital signal processing may contribute to lower power consumption for a given degree of image sensor processing functionality.

Pixel sizes can vary from less than about 0.5 to 3 microns across a lateral dimension or any range subsumed therein (less than about 0.5 to 3 microns squared in area or any range subsumed therein). In examples, the pixels size may be less than about 1.3, 1.4, 1.5, 1.7, 2, 2.2 or 2.5 microns (with less than that amount squared in area). Specific examples are 1.2 and 1.4 microns. The primary array may have larger pixels than secondary array. Primary may be greater than 0.5, 0.7, 1, 1.2 or 1.4 or 1.5 microns and less than 1, 1.2, 1.5, 1.7, 2, 2.2, 2.5 or 3 microns. The one or more secondary arrays could be also be greater than 0.5, 0.7, 1, 1.2 or 1.4 or 1.5 microns and less than 1, 1.2, 1.5, 1.7, 2, 2.2, 2.5 or 3 microns but would be smaller than the primary. For example, the primary may be greater than X and the secondary may be less than X, where X is 1.2, 1.4, 1.5, 1.7, or 2, etc.

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

Because the optically sensitive layer and the read-out circuit that reads a particular region of optically sensitive material exist on separate planes in the integrated circuit, the shape (viewed from the top) of (1) the pixel read-out circuit and (2) the optically sensitive region that is read by (1); can be generally different. For example it may be desired to define an optically sensitive region corresponding to a pixel as a square; whereas the corresponding read-out circuit may be most efficiently configured as a rectangle.

In an imaging array based on a top optically sensitive layer connected through vias to the read-out circuit beneath, there exists no imperative for the various layers of metal, vias, and interconnect dielectric to be substantially or even partially optically transparent, although they may be transparent in some embodiments. This contrasts with the case of front-side-illuminated CMOS image sensors in which a substantially transparent optical path must exist traversing the interconnect stack. In the case of conventional CMOS image sensors, this presents an additional constraint in the routing of interconnect. This often reduces the extent to which a transistor, or transistors, can practically be shared. For example, 4:1 sharing is often employed, but higher sharing ratios are not. In contrast, a read-out circuit designed for use with a top-surface optically-sensitive layer can employ 8:1 and 16:1 sharing.

In embodiments, the optically sensitive layer may connect electrically to the read-out circuit beneath without a metal intervening between the optically sensitive layer and the read-out circuit beneath.

Embodiments of QD devices include a QD layer and a custom-designed or pre-fabricated electronic read-out integrated circuit. The QD layer is then formed directly onto the custom-designed or pre-fabricated electronic read-out integrated circuit. In some embodiments, wherever the QD layer overlies the circuit, it continuously overlaps and contacts at least some of the features of the circuit. In some embodiments, if the QD layer overlies three-dimensional features of the circuit, the QD layer may conform to these features. In other words, there exists a substantially contiguous interface between the QD layer and the underlying electronic read-out integrated circuit. One or more electrodes in the circuit contact the QD layer and are capable of relaying information about the QD layer, e.g., an electronic signal related to the amount of radiation 1000 on the QD layer, to a readout circuit. The QD layer can be provided in a continuous manner to cover the entire underlying circuit, such as a readout circuit, or patterned. If the QD layer is provided in a continuous manner, the fill factor can approach about 100%, with patterning, the fill factor is reduced, but can still be much greater than a typical 35% for some example CMOS sensors that use silicon photodiodes.

In embodiments, the QD optical devices are readily fabricated using techniques available in a facility normally used to make conventional CMOS devices. For example, a layer of QDs can be solution-coated onto a pre-fabricated electronic read-out circuit using, e.g., spin-coating, which is a standard CMOS process, and optionally further processed with other CMOS-compatible techniques to provide the final QD layer for use in the device. Because the QD layer need not require exotic or difficult techniques to fabricate, but can instead be made using standard CMOS processes, the QD optical devices can be made in high volumes, and with no significant increase in capital cost (other than materials) over current CMOS process steps.

Figure 37A:
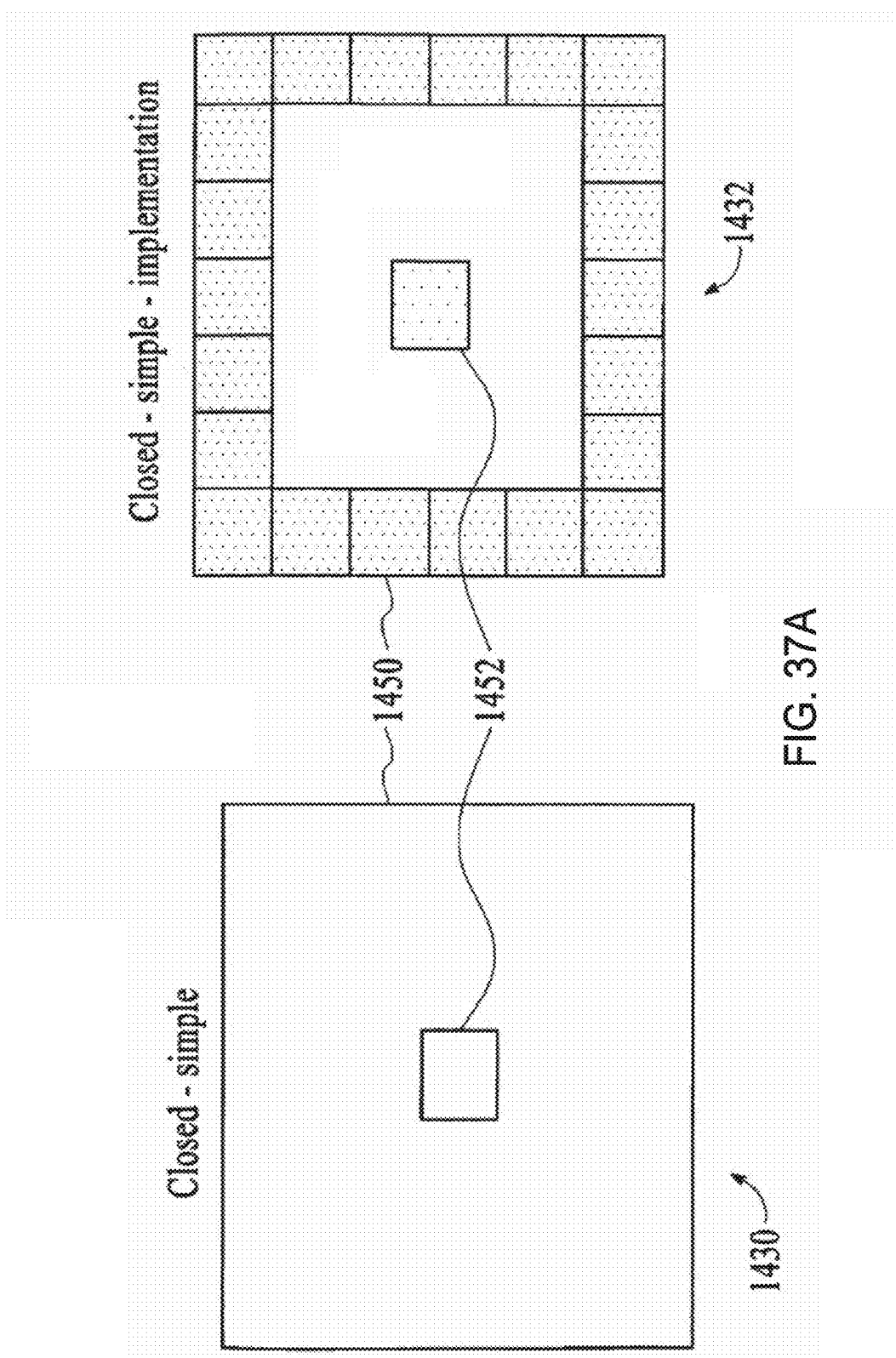
FIG. 37A shows an aspect of a closed simple geometrical arrangement of pixels.
Figure 37C:
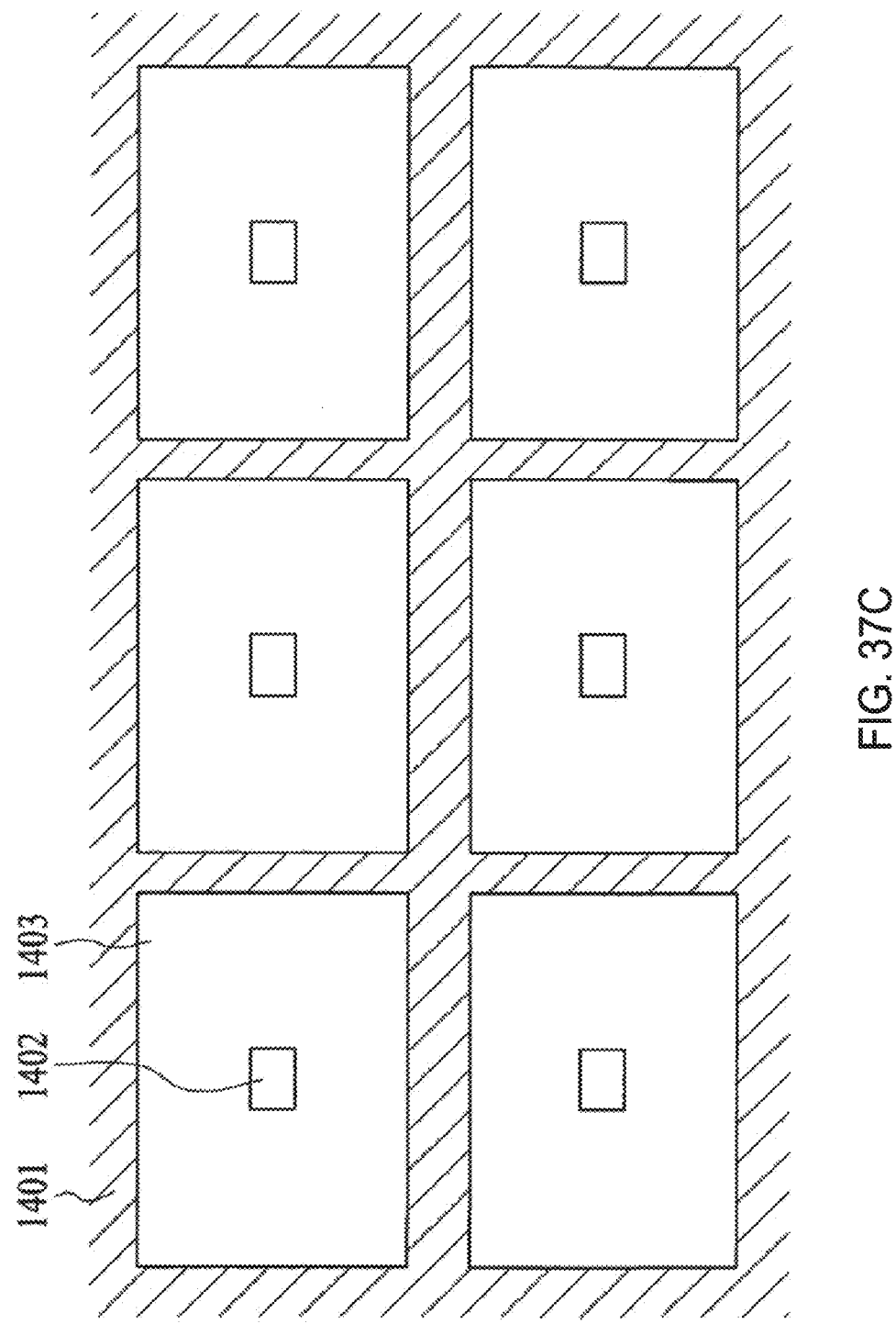
FIG. 37C shows a two-row by three-column sub-region within a generally larger array of top-surface electrodes.

FIG. 37C shows a two-row by three-column sub-region within a generally larger array of top-surface electrodes. The array of electrical contacts provides electrical communication to an overlying layer of optically sensitive material. 1401 represents a common grid of electrodes used to provide one shared contact to the optically sensitive layer. 1402 represents the pixel-electrodes which provide the other contact for electrical communication with the optically sensitive layer. In embodiments, a voltage bias of −2 V may be applied to the common grid 1401, and a voltage of ±2.5 V may be applied at the beginning of each integration period to each pixel electrode 1402.

In embodiments, a direct non-metallic contact region (e.g., pn junction contact) may be used instead of a metal interconnect pixel electrode for 1402.

Whereas the common contact 1401 is at a single electrical potential across the array at a given time, the pixel electrodes 1402 may vary in time and space across the array. For example if a circuit is configured such that the bias at 1402 varies in relation to current flowing into or out of 1402, then different electrodes 1402 may be at different biases throughout the progress of the integration period. Region 1403 represents the non-contacting region that lies between 1401 and 1402 within the lateral plane. 1403 is generally an insulating material in order to minimize dark current flowing between 1401 and 1402. 1401 and 1402 may generally consist of different materials. Each may for example be chosen for example from the list: TiN; TiN/Al/TiN; Cu; TaN; Ni; Pt; and from the preceding list there may reside superimposed on one or both contacts a further layer or set of layers chosen from: Pt, alkanethiols, Pd, Ru, Au, ITO, or other conductive or partially conductive materials.

In example embodiments, the pixel electrodes 1402 may consist of a semiconductor, such as silicon, including p-type or n-type silicon, instead of a metal interconnect pixel electrode.

Embodiments described herein may be combined. Example embodiments include a pixel circuit employing a pixel electrode that consists of a semiconductor, such as silicon, instead of a metal. In embodiments a direct connection between film and diode instead of metallic pixel electrodes (either front side or back side) may be formed. Other features described herein may be used in combination with this approach or architecture.

In example embodiments using the above structures, interconnect 1452 may form an electrode in electrical communication with a capacitance, impurity region on the semiconductor substrate or other charge store.

In embodiments, the charge store may be a pinned diode. In embodiments, the charge store may be a pinned diode in communication with an optically sensitive material without an intervening metal being present between the pinned diode and the optically sensitive layer.

In some embodiments, a voltage is applied to the charge store and discharges due to the flow of current across the optically sensitive film over an integration period of time. At the end of the integration period of time, the remaining voltage is sampled to generate a signal corresponding to the intensity of light absorbed by the optically sensitive layer during the integration period. In other embodiments, the pixel region may be biased to cause a voltage to accumulate in a charge store over an integration period of time. At the end of the integration period of time, the voltage may be sampled to generate a signal corresponding to the intensity of light absorbed by the optically sensitive layer during the integration period. In some example embodiments, the bias across the optically sensitive layer may vary over the integration period of time due to the discharge or accumulation of voltage at the charge store. This, in turn, may cause the rate of current flow across the optically sensitive material to also vary over the integration period of time. In addition, the optically sensitive material may be a nanocrystal material with photoconductive gain and the rate of current flow may have a non-linear relationship with the intensity of light absorbed by the optically sensitive layer. As a result, in some embodiments, circuitry may be used to convert the signals from the pixel regions into digital pixel data that has a linear relationship with the intensity of light absorbed by the pixel region over the integration period of time. The non-linear properties of the optically sensitive material can be used to provide a high dynamic range, while circuitry can be used to linearize the signals after they are read in order to provide digital pixel data. Example pixel circuits for read out of signals from pixel regions are described further below.

FIG. 37A represents closed-simple patterns 1430 (e.g., conceptual illustration) and 1432 (e.g., vias used to create photodetector structures). In the closed-simple illustrations 1430-1432 the positively biased electrical interconnect 1452 is provided in the center area of a grounded contained square electrical interconnect 1450. Square electrical interconnect 1450 may be grounded or may be at another reference potential to provide a bias across the optically sensitive material in the pixel region. For example, interconnect 1452 may be biased with a positive voltage and interconnect may be biased with a negative voltage to provide a desired voltage drop across a nanocrystal material in the pixel region between the electrodes. In this configuration, when radiation 1000 to which the layer is responsive falls within the square area a charge is developed and the charge is attracted to and move towards the center positively biased electrical interconnect 1452. If these closed-simple patterns are replicated over an area of the layer, each closed simple pattern forms a portion or a whole pixel where they capture charge associated with incident radiation 1000 that falls on the internal square area. In example embodiments, the electrical interconnect 1450 may be part of a grid that forms a common electrode for an array of pixel regions. Each side of the interconnect 1450 may be shared with the adjacent pixel region to form part of the electrical interconnect around the adjacent pixel. In this embodiment, the voltage on this electrode may be the same for all of the pixel regions (or for sets of adjacent pixel regions) whereas the voltage on the interconnect 1452 varies over an integration period of time based on the light intensity absorbed by the optically sensitive material in the pixel region and can be read out to generate a pixel signal for each pixel region. In example embodiments, interconnect 1450 may form a boundary around the electrical interconnect 1452 for each pixel region. The common electrode may be formed on the same layer as interconnect 1452 and be positioned laterally around the interconnect 1450. In some embodiments, the grid may be formed above or below the layer of optically sensitive material in the pixel region, but the bias on the electrode may still provide a boundary condition around the pixel region to reduce cross over with adjacent pixel regions.

In embodiments, said optically sensitive material may be in direct electrical communication with a pixel electrode, charge store, or pinned diode, without an intervening metal being present between said optically sensitive material and said pixel electrode, charge store, or pinned diode.

FIG. 37B illustrates open simple patterns of electrical interconnects. The open simple patterns do not, generally, form a closed pattern. The open simple pattern does not enclose a charge that is produced as the result of incident radiation 1000 with the area between the positively biased electrical interconnect 1452 and the ground 1450; however, charge developed within the area between the two electrical interconnects will be attracted and move to the positively biased electrical interconnect 1452. An array including separated open simple structures may provide a charge isolation system that may be used to identify a position of incident radiation 1000 and therefore corresponding pixel assignment. As above, electrical interconnect 1450 may be grounded or be at some other reference potential. In some embodiments, electrical interconnect 1450 may be electrically connected with the corresponding electrode of other pixels (for example, through underlying layers of interconnect) so the voltage may be applied across the pixel array. In other embodiments, the interconnect 1450 may extend linearly across multiple pixel regions to form a common electrode across a row or column.

Pixel circuitry that may be used to read out signals from the pixel regions will now be described. As described above, in embodiments, pixel structures 1500 within the QDPC 100 of FIG. 1 may have pixel layouts 1600, where pixel layouts 1600 may have a plurality of layout configurations such as vertical, planar, diagonal, or the like. Pixel structures 1500 may also have embedded pixel circuitry 1700. Pixel structures may also be associated with the electrical interconnections 1404 between the photodetector structures 1400 and pixel circuitry 1700.

In embodiments, quantum dot pixels 1800 within the QDPC 100 of FIG. 1 may have pixel circuitry 1700 that may be embedded or specific to an individual quantum dot pixel 1800, a group of quantum dot pixels 1800, all quantum dot pixels 1800 in an array of pixels, or the like. Different quantum dot pixels 1800 within the array of quantum dot pixels 1800 may have different pixel circuitry 1700, or may have no individual pixel circuitry 1700 at all. In embodiments, the pixel circuitry 1700 may provide a plurality of circuitry, such as for biasing, voltage biasing, current biasing, charge transfer, amplifier, reset, sample and hold, address logic, decoder logic, memory, TRAM cells, flash memory cells, gain, analog summing, analog-to-digital conversion, resistance bridges, or the like. In embodiments, the pixel circuitry 1700 may have a plurality of functions, such as for readout, sampling, correlated double sampling, sub-frame sampling, timing, integration, summing, gain control, automatic gain control, offset adjustment, calibration, offset adjustment, memory storage, frame buffering, dark current subtraction, binning, or the like. In embodiments, the pixel circuitry 1700 may have electrical connections to other circuitry within the QDPC 100, such as wherein other circuitry located in at least one of a second quantum dot pixel 1800, column circuitry, row circuitry, circuitry within the functional components 2004 of the QDPC 100, or other features 2204 within the integrated system 2200 of the QDPC 100, or the like. The design flexibility associated with pixel circuitry 1700 may provide for a wide range of product improvements and technological innovations.

Pixel circuitry 1700 within the quantum dot pixel 1800 may take a plurality of forms, ranging from no circuitry at all, just interconnecting electrodes, to circuitry that provides functions such as biasing, resetting, buffering, sampling, conversion, addressing, memory, and the like. In embodiments, electronics to condition or process the electrical signal may be located and configured in a plurality of ways. For instance, amplification of the signal may be performed at each pixel, group of pixels, at the end of each column or row, after the signal has been transferred off the array, just prior to when the signal is to be transferred off the chip 2000, or the like. In another instance, analog-to-digital conversion may be provided at each pixel, group of pixels, at the end of each column or row, within the chip's 2000 functional components 2004, after the signal has been transferred off the chip 2000, or the like. In addition, processing at any level may be performed in steps, where a portion of the processing is performed in one location and a second portion of the processing is performed in another location. An example may be the performing analog-to-digital conversion in two steps, say with an analog combining at the pixel 1800 and a higher-rate analog-to-digital conversion as a part of the chip's 2000 functional components 2004.

In embodiments, different electronic configurations may require different levels of post-processing, such as to compensate for the fact that every pixel has its own calibration level associated with each pixel's readout circuit. The QDPC 100 may be able to provide the readout circuitry at each pixel with calibration, gain-control, memory functions, and the like. Because of the QDPC's 100 highly integrated structure, circuitry at the quantum dot pixel 1800 and chip 2000 level may be available, which may enable the QDPC 100 to be an entire image sensor system on a chip. In some embodiments, the QDPC 100 may also be comprised of a quantum dot material 200 in combination with conventional semiconductor technologies, such as CCD and CMOS.

Pixel circuitry may be defined to include components beginning at the electrodes in contact with the quantum dot material 200 and ending when signals or information is transferred from the pixel to other processing facilities, such as the functional components 2004 of the underlying chip 200 or another quantum dot pixel 1800. Beginning at the electrodes on the quantum dot material 200, the signal is translated or read. In embodiments, the quantum dot material 200 may provide a change in current flow in response to radiation 1000. The quantum dot pixel 1800 may require bias circuitry 1700 in order to produce a readable signal. This signal in turn may then be amplified and selected for readout.

In embodiments, the biasing of the photodetector may be time invariant or time varying. Varying space and time may reduce cross-talk, and enable a shrinking the quantum dot pixel 1800 to a smaller dimension, and require connections between quantum dot pixels 1800. Biasing could be implemented by grounding at the corner of a pixel 1800 and dots in the middle. Biasing may occur only when performing a read, enabling either no field on adjacent pixels 1800, forcing the same bias on adjacent pixels 1800, reading odd columns first then the even columns, and the like. Electrodes and/or biasing may also be shared between pixels 1800. Biasing may be implemented as a voltage source or as a current source. Voltage may be applied across a number of pixels, but then sensed individually, or applied as a single large bias across a string of pixels 1800 on a diagonal. The current source may drive a current down a row, then read it off across the column. This may increase the level of current involved, which may decrease read noise levels.

In embodiments, configuration of the field, by using a biasing scheme or configuration of voltage bias, may produce isolation between pixels. Currently may flow in each pixel so that only electron-hole pairs generated in that volume of pixel flow within that pixel. This may allow electrostatically implemented inter-pixel isolation and cross-talk reduction, without physical separation. This could break the linkage between physical isolation and cross-talk reduction.

In embodiments, the pixel circuitry 1700 may include circuitry for pixel readout. Pixel readout may involve circuitry that reads the signal from the quantum dot material 200 and transfers the signal to other components 1900, chip functional components 2004, to the other features 2204 of the integrated system 2200, or to other off-chip components. Pixel readout circuitry may include quantum dot material 200 interface circuitry, such as 3T and 4T circuits, for example. Pixel readout may involve different ways to read-out the pixel signal, ways to transform the pixel signal, voltages applied, and the like. Pixel readout may require a number of metal contacts with the quantum dot material 200, such as 2, 3, 4, 20, or the like. In embodiments, pixel readout may involve direct electrical communication between the optically sensitive material and a pixel electrode, charge store, or pinned diode, without an intervening metal being present between said optically sensitive material and said pixel electrode, charge store, or pinned diode.

These electrical contacts may be custom configured for size, degree of barrier, capacitance, and the like, and may involve other electrical components such a Schottky contact. Pixel readout time may be related to how long the radiation 1000-induced electron-hole pair lasts, such as for milliseconds or microseconds. In embodiments, this time my be associated with quantum dot material 200 process steps, such as changing the persistence, gain, dynamic range, noise efficiency, and the like.

Figure 38A:
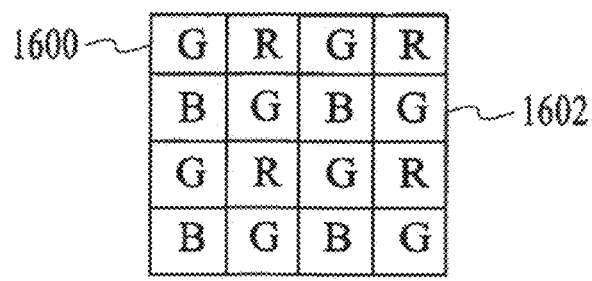
FIG. 38A shows a Bayer filter pattern.
Figure 38B:
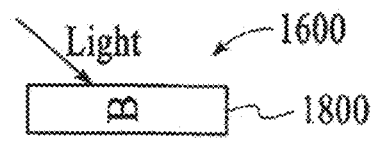
FIGS. 38B-38F show examples of some alternative pixel layouts.
Figure 38C:
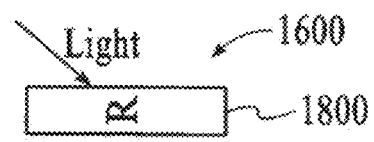
Figure 38D:
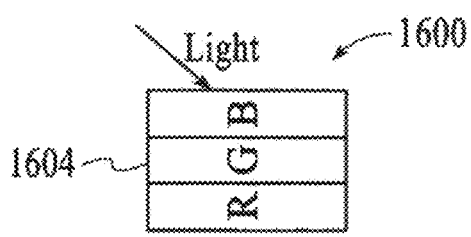
Figure 38E:
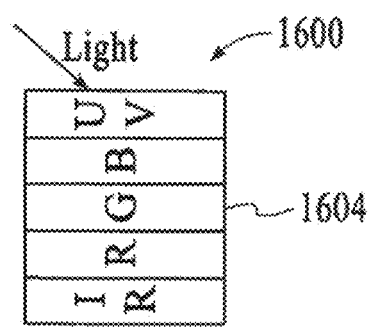
Figure 38F:
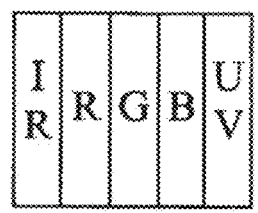
Figure 38G:
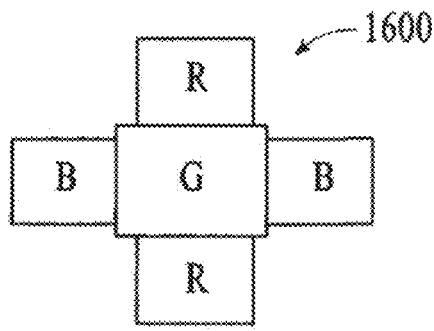
FIGS. 38G-38L show pixels of different sizes, layouts, and types used in pixel layouts.
Figure 38H:
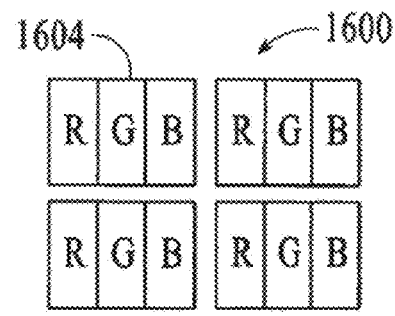
Figure 38I:
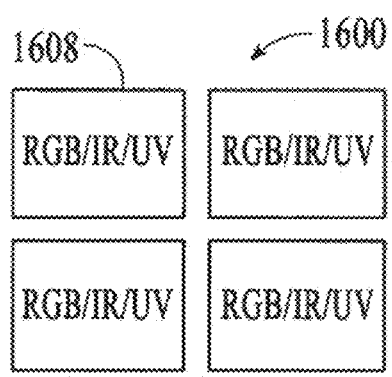
Figure 38J:
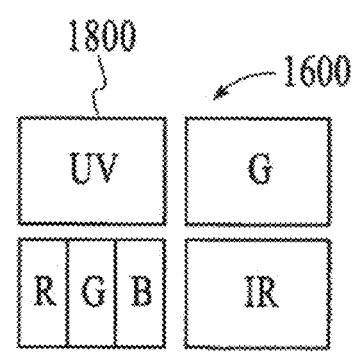
Figure 38K:
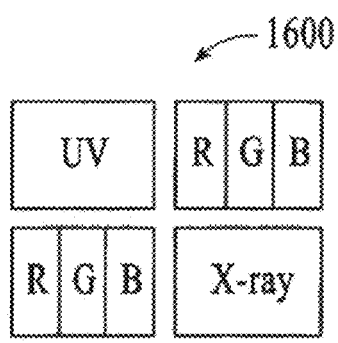
Figure 38L:
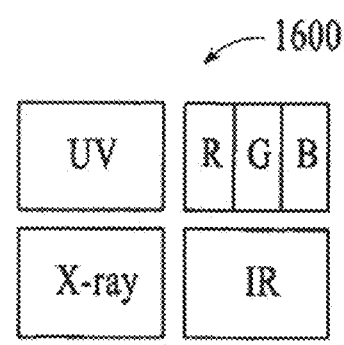
Figure 38M:
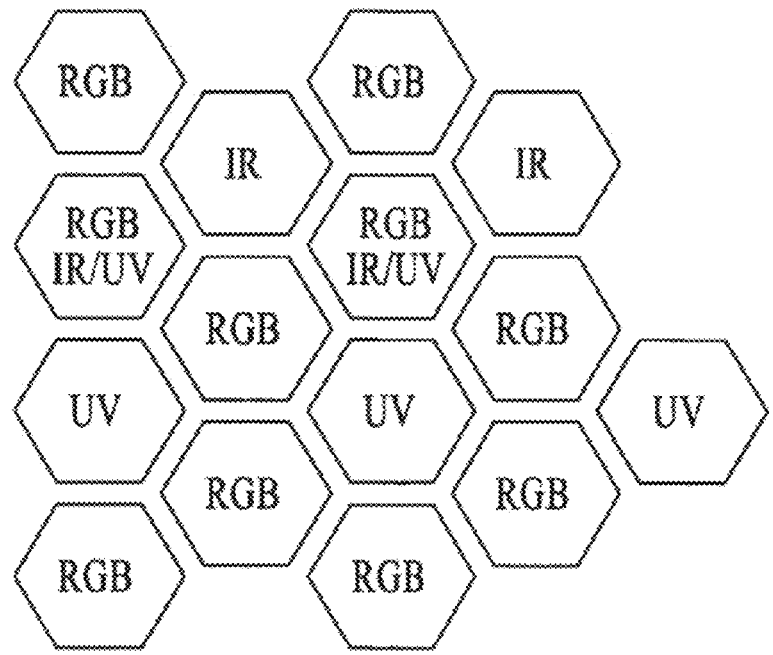
FIG. 38M shows pixel layouts with different shapes, such as hexagons.
Figure 38N:
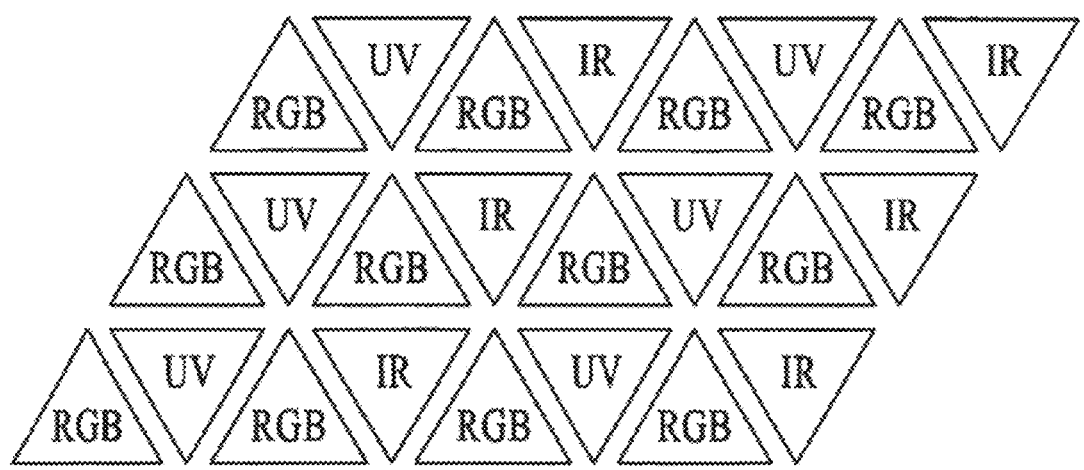
FIG. 38N shows pixel layouts with different shapes, such as triangles.
Figure 38O:
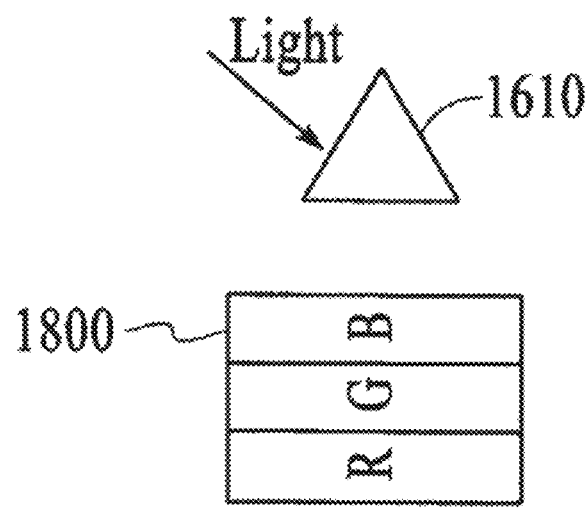
FIG. 38O shows a quantum dot pixel, such as a multi-spectral quantum dot pixel or other pixel, provided in association with an optical element.
Figure 38P:
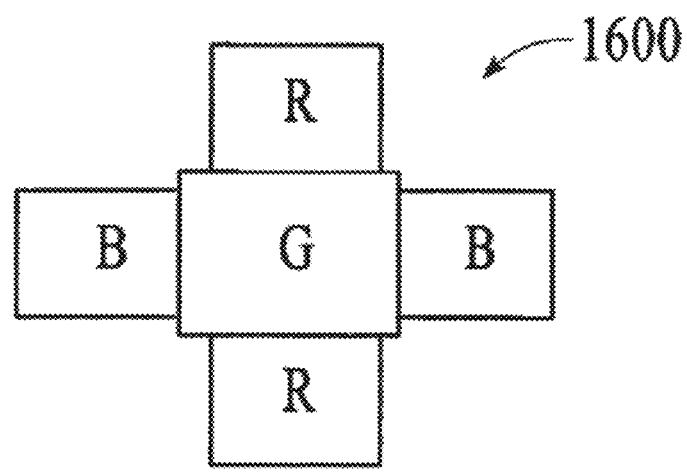
FIG. 38P shows an example of a pixel layout.

The quantum dot pixels 1800 described herein can be arranged in a wide variety of pixel layouts 1600. Referring to FIGS. 38A through 38P for example, a conventional pixel layout 1600, such as the Bayer filter layout 1602, includes groupings of pixels disposed in a plane, which different pixels are sensitive to radiation 1000 of different colors. In conventional image sensors, such as those used in most consumer digital cameras, pixels are rendered sensitive to different colors of radiation 1000 by the use of color filters that are disposed on top of an underlying photodetector, so that the photodetector generates a signal in response to radiation 1000 of a particular range of frequencies, or color. In this configuration, mosaic of different color pixels is referred to often as a color filter array, or color filter mosaic. Although different patterns can be used, the most typical pattern is the Bayer filter pattern 1602 shown in FIG. 38A, where two green pixels, one red pixel and one blue pixel are used, with the green pixels (often referred to as the luminance-sensitive elements) positioned on one diagonal of a square and the red and blue pixels (often referred to as the chrominance-sensitive elements) are positioned on the other diagonal. The use of a second green pixel is used to mimic the human eye's sensitivity to green light. Since the raw output of a sensor array in the Bayer pattern consists of a pattern of signals, each of which corresponds to only one color of light, demosaicing algorithms are used to interpolate red, green and blue values for each point. Different algorithms result in varying quality of the end images. Algorithms may be applied by computing elements on a camera or by separate image processing systems located outside the camera. Quantum dot pixels may be laid out in a traditional color filter system pattern such as the Bayer RGB pattern; however, other patterns may also be used that are better suited to transmitting a greater amount of light, such as Cyan, Magenta, Yellow (CMY). Red, Green, Blue (RGB) color filter systems are generally known to absorb more light than a CM Y system. More advanced systems such as RGB Cyan or RGB Clear can also be used in conjunction with Quantum dot pixels.

In one embodiment, the quantum dot pixels 1800 described herein are configured in a mosaic that imitates the Bayer pattern 1602; however, rather than using a color filter, the quantum dot pixels 1800 can be configured to respond to radiation 1000 of a selected color or group of colors, without the use of color filters. Thus, a Bayer pattern 1602 under an embodiment includes a set of green-sensitive, red-sensitive and blue-sensitive quantum dot pixels 1800. Because, in embodiments, no filter is used to filter out different colors of radiation 1000, the amount of radiation 1000 seen by each pixel is much higher.

The image sensor may detect a signal from the photosensitive material in each of the pixel regions that varies based on the intensity of light incident on the photosensitive material. In one example embodiment, the photosensitive material is a continuous film of interconnected nanoparticles. Electrodes are used to apply a bias across each pixel area. Pixel circuitry is used to integrate a signal in a charge store over a period of time for each pixel region. The circuit stores an electrical signal proportional to the intensity of light incident on the optically sensitive layer during the integration period. The electrical signal can then be read from the pixel circuitry and processed to construct a digital image corresponding to the light incident on the array of pixel elements. In example embodiments, the pixel circuitry may be formed on an integrated circuit device below the photosensitive material. For example, a nanocrystal photosensitive material may be layered over a CMOS integrated circuit device to form an image sensor. Metal contact layers from the CMOS integrated circuit may be electrically connected to the electrodes that provide a bias across the pixel regions. U.S. patent application Ser. No. 12/106,256, entitled "Materials, Systems and Methods for Optoelectronic Devices," filed Apr. 18, 2008 (U.S. Published Patent Application No. 2009/0152664) includes additional descriptions of optoelectronic devices, systems and materials that may be used in connection with example embodiments and is hereby incorporated herein by reference in its entirety.

This is an example embodiment only and other embodiments may use different photodetectors and photosensitive materials. For example, embodiments may use silicon or Gallium Arsenide (GaAs) photodetectors.

In example embodiments, an image sensor may be provided with a large number of pixel elements to provide high resolution. For example, an array of 4, 6, 8, 12, 24 or more megapixels may be provided.

The use of such large numbers of pixel elements, combined with the desirability of producing image sensor integrated circuits having small areas such as diagonal dimensions of order ⅓ inch or ¼ inch, entails the use of small individual pixels. Desirable pixel geometries include, for example, 1.75 μm linear side dimensions, 1.4 μm linear side dimensions, 1.1 μm linear side dimensions, 0.9 μm linear side dimensions, 0.8 μm linear side dimensions, and 0.7 μm linear side dimensions.

Pixel sizes can vary from less than about 0.5 to 3 microns across a lateral dimension or any range subsumed therein (less than about 0.5 to 3 microns squared in area or any range subsumed therein). In examples, the pixels size may be less than about 1.3, 1.4, 1.5, 1.7, 2, 2.2 or 2.5 microns (with less than that amount squared in area). Specific examples are 1.2 and 1.4 microns. The primary array may have larger pixels than secondary array. Primary may be greater than 0.5, 0.7, 1, 1.2 or 1.4 or 1.5 microns and less than 1, 1.2, 1.5, 1.7, 2, 2.2, 2.5 or 3 microns. The one or more secondary arrays could be also be greater than 0.5, 0.7, 1, 1.2 or 1.4 or 1.5 microns and less than 1, 1.2, 1.5, 1.7, 2, 2.2, 2.5 or 3 microns but would be smaller than the primary. For example, the primary may be greater than X and the secondary may be less than X, where X is 1.2, 1.4, 1.5, 1.7, or 2, etc.

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

Embodiments include systems that enable a large fill factor by ensuring that 100%, or nearly 100%, of the area of each pixel includes an optically sensitive material on which incident light of interest in imaging is substantially absorbed. Embodiments include imaging systems that provide a large chief ray acceptance angle. Embodiments include imaging systems that do not required microlenses. Embodiments include imaging systems that are less sensitive to the specific placement of microlenses (microlens shift) in view of their increased fill factor. Embodiments include highly sensitive image sensors. Embodiments include imaging systems in which a first layer proximate the side of optical incidence substantially absorbs incident light; and in which a semiconductor circuit that may include transistors carriers out electronic read-out functions.

Embodiments include optically sensitive materials in which the absorption is strong, i.e., the absorption length is short, such as an absorption length (1/alpha) less than 1 μm. Embodiments include image sensor comprising optically sensitive materials in which substantially all light across the visible wavelength spectrum, including out to the red ~630 nm, is absorbed in a thickness of optically sensitive material less than approximately 1 micrometer.

Embodiments include image sensors in which the lateral spatial dimensions of the pixels are approximately 2.2 μm, 1.75 μm, 1.55 μm, 1.4 μm, 1.1 μm, 900 nm, 700 nm, 500 nm; and in which the optically sensitive layer is less than 1 μm and is substantially absorbing of light across the spectral range of interest (such as the visible in example embodiments); and in which crosstalk (combined optical and electrical) among adjacent pixels is less than 30%, less than 20%, less than 15%, less than 10%, or less than 5%.

Pixel sizes can vary from less than about 0.5 to 3 microns across a lateral dimension or any range subsumed therein (less than about 0.5 to 3 microns squared in area or any range subsumed therein). In examples, the pixels size may be less than about 1.3, 1.4, 1.5, 1.7, 2, 2.2 or 2.5 microns (with less than that amount squared in area). Specific examples are 1.2 and 1.4 microns. The primary array may have larger pixels than secondary array. Primary may be greater than 0.5, 0.7, 1, 1.2 or 1.4 or 1.5 microns and less than 1, 1.2, 1.5, 1.7, 2, 2.2, 2.5 or 3 microns. The one or more secondary arrays could be also be greater than 0.5, 0.7, 1, 1.2 or 1.4 or 1.5 microns and less than 1, 1.2, 1.5, 1.7, 2, 2.2, 2.5 or 3 microns but would be smaller than the primary. For example, the primary may be greater than X and the secondary may be less than X, where X is 1.2, 1.4, 1.5, 1.7, or 2, etc.

Embodiments include pixel circuits, functioning in combination with an optically sensitive material, in which at least one of dark current, noise, photoresponse nonuniformity, and dark current nonuniformity are minimized through the means of integrating the optically sensitive material with the pixel circuit.

Embodiments include integration and processing approaches that are achieved at low additional cost to manufacture, and can be achieved (or substantially or partially achieved) within a CMOS silicon fabrication foundry.

Figure 39A:
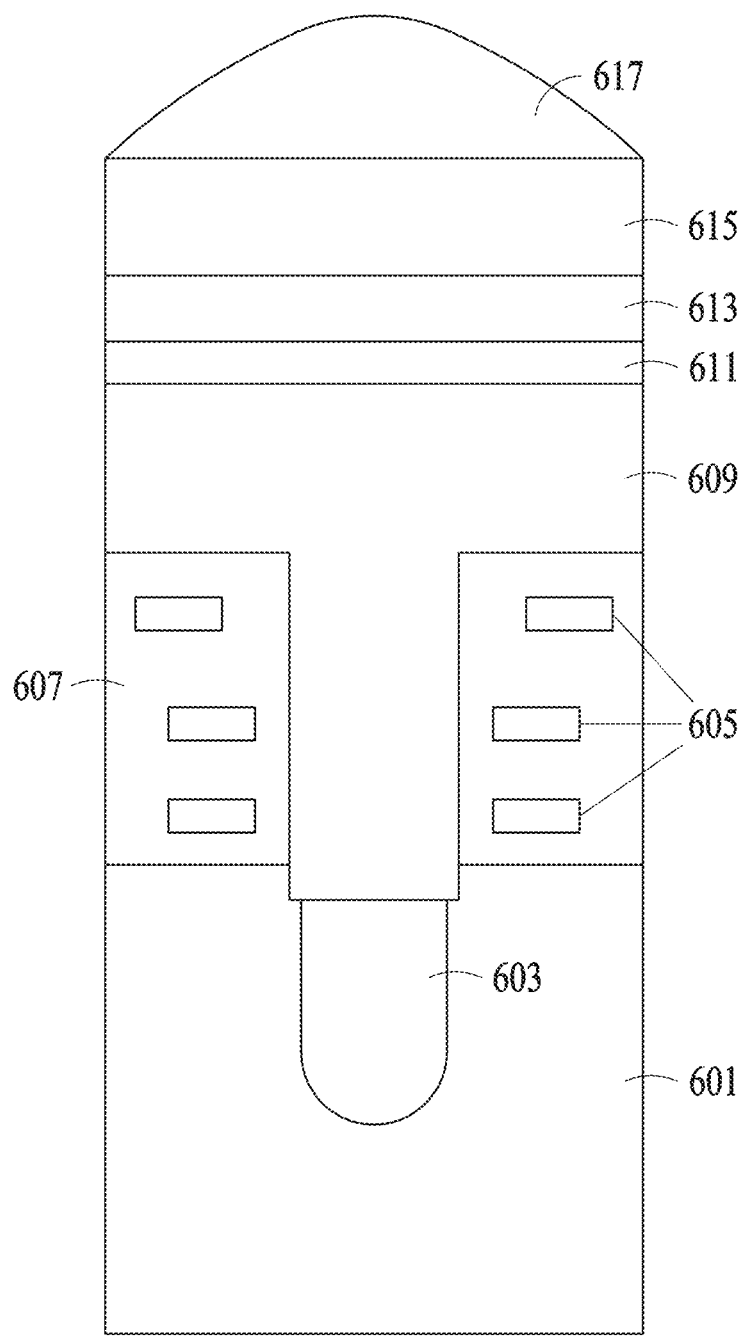
FIG. 39A shows a front-side illuminated CMOS image sensor pixel in which an optically sensitive material has been integrated in intimate contact with the silicon diode.

FIG. 39A depicts a front-side illuminated CMOS image sensor pixel in which an optically sensitive material has been integrated in intimate contact with the silicon diode. 601 depicts a silicon substrate on which the image sensor is fabricated. 603 depicts a diode formed in silicon. 605 is the metal interconnect and 607 is the interlayer dielectric stack that serves to provide communication of electrical signals within and across the integrated circuit. 609 is an optically sensitive material that is the primary location for the absorption of light to be imaged. 611 is a transparent electrode that is used to provide electrical biasing of the optically sensitive material to enable photocarrier collection from it. 613 is a passivation layer that may consist of at least one of an organic or polymer encapsulant (such as parylene) or an inorganic such as Si3N4 or a stack incorporating combinations thereof. 613 serves to protect the underlying materials and circuits from environmental influences such as the impact of water or oxygen. 615 is a color filter array layer that is a spectrally-selective transmitter of light used in aid of achieving color imaging. 617 is a microlens that aids in the focusing of light onto 609 the optically sensitive material.

Referring to FIG. 39A, in embodiments, photocurrent generated in 609 the optically sensitive material due to illumination may be transferred, with high efficiency, from the sensitizing material 609 to the diode '2.' Since most incident photons will be absorbed by the sensitizing material '5', the diode 603 no longer needs serve the predominant photodetection role. Instead its principal function is to serve as diode that enables maximal charge transfer and minimal dark current.

Referring to FIG. 39A, the diode 603 may be pinned using the sensitizing material 609 at its surface. The thickness of the sensitizing material 609 may be approximately 500 nm, and may range from 100 nm to 5 µm. In embodiments, a p-type sensitizing material 609 may be employed for the light conversion operation and for depleting an n-type silicon diode 603. The junction between the sensitizing material 609 and the silicon diode 603 may be termed a p-n heterojunction in this example.

Referring to FIG. 39A, in the absence of an electrical bias, the n-type silicon 603 and p-type sensitizing material 609 reach equilibrium, i.e., their Fermi levels come into alignment. In an example embodiment, the resultant band-bending produce a built-in potential in the p-type sensitizing material 609 such that a depletion region is formed therein. Upon the application of an appropriate bias within the silicon circuitry (this potential difference applied, for example, via the difference between 611 and 603 in FIG. 39A), the amplitude of this potential is augmented by an applied potential, resulting in a deepening of the depletion region that reaches into the p-type sensitizing material 609. The resultant electrical field results in the extraction of photoelectrons from the sensitizing material 609 into the n+ silicon layer 603. Biasing and doping in the silicon 603 achieve the collection of the photoelectrons from the sensitizing layer 609, and can achieve fully depletion of the n-type silicon 603 under normal bias (such as 3 V, with a normal range of 1V to 5V). Holes are extracted through a second contact (such as 611 in FIG. 39A) to the sensitizing layer 609.

Referring to FIG. 39A, in the case of a vertical device, the contact 611 may be formed atop the sensitizing material 609.

Figure 39B:
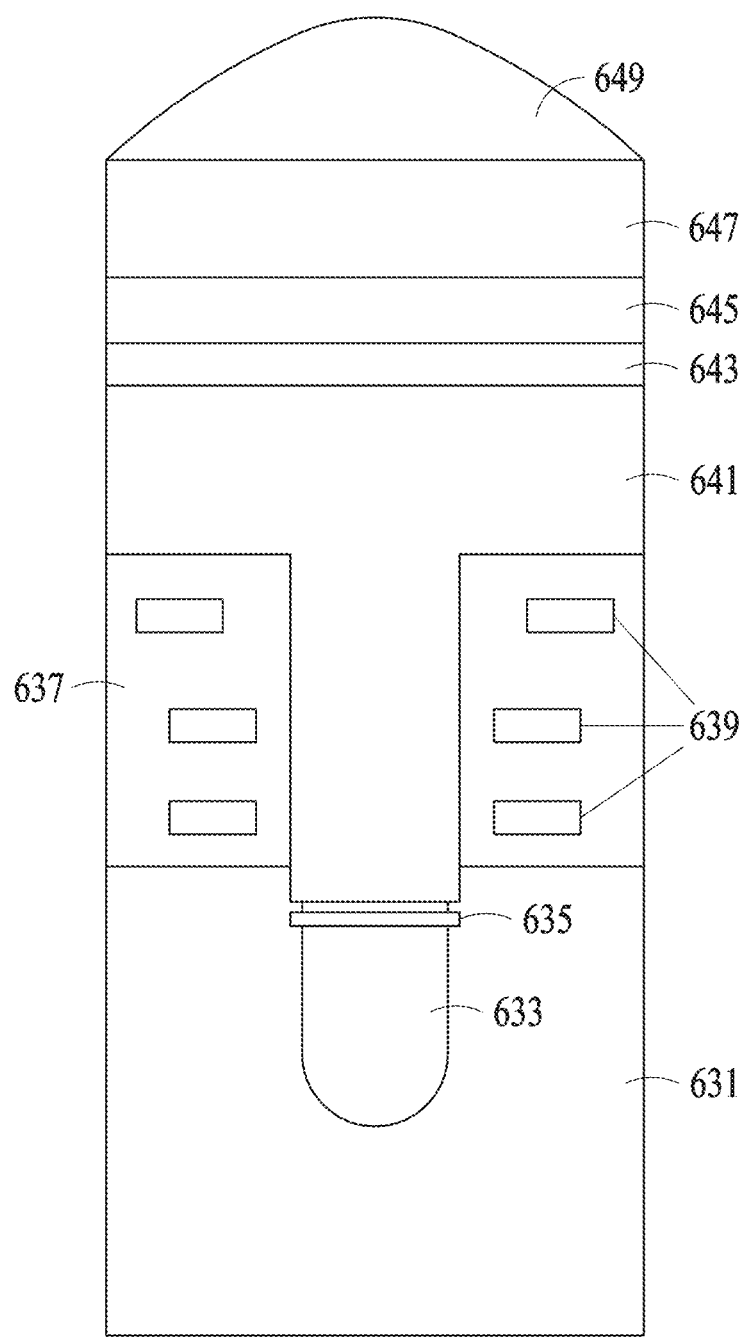
FIG. 39B shows a front-side illuminated CMOS image sensor pixel in which an optically sensitive material has been integrated in intimate contact with the silicon diode.

FIG. 39B depicts a front-side illuminated CMOS image sensor pixel in which an optically sensitive material has been integrated in intimate contact with the silicon diode. 631 depicts a silicon substrate on which the image sensor is fabricated. 633 depicts a diode formed in silicon. 639 is the metal interconnect and 637 the interlayer dielectric stack that serves to provide communication of electrical signals within and across the integrated circuit. 641 is an optically sensitive material that is the primary location for the absorption of light to be imaged. 643 is a transparent electrode that is used to provide electrical biasing of the optically sensitive material to enable photocarrier collection from it. 645 is a passivation layer that may consist of at least one of an organic or polymer encapsulant (such as parylene) or an inorganic such as Si3N4 or a stack incorporating combinations thereof. 645 serves to protect the underlying materials and circuits from environmental influences such as the impact of water or oxygen. 647 is a color filter array layer that is a spectrally-selective transmitter of light used in aid of achieving color imaging. 649 is a microlens that aids in the focusing of light onto 641 the optically sensitive material. 635 is a material that resides between the optically sensitive material 641 and the diode 633. 635 may be referred to as an added pinning layer. Example embodiments include a p-type silicon layer. Example embodiments include a non-metallic material such as a semiconductor and/or it could include polymer and/or organic materials. In embodiments, material 635 may provide a path having sufficient conductivity for charge to flow from the optically sensitive material to the diode, but would not be metallic interconnect. In embodiments, 635 serves to passivate the surface of the diode and create the pinned diode in this example embodiment (instead of the optically sensitive material, which would be on top of this additional layer).

Figure 39C:
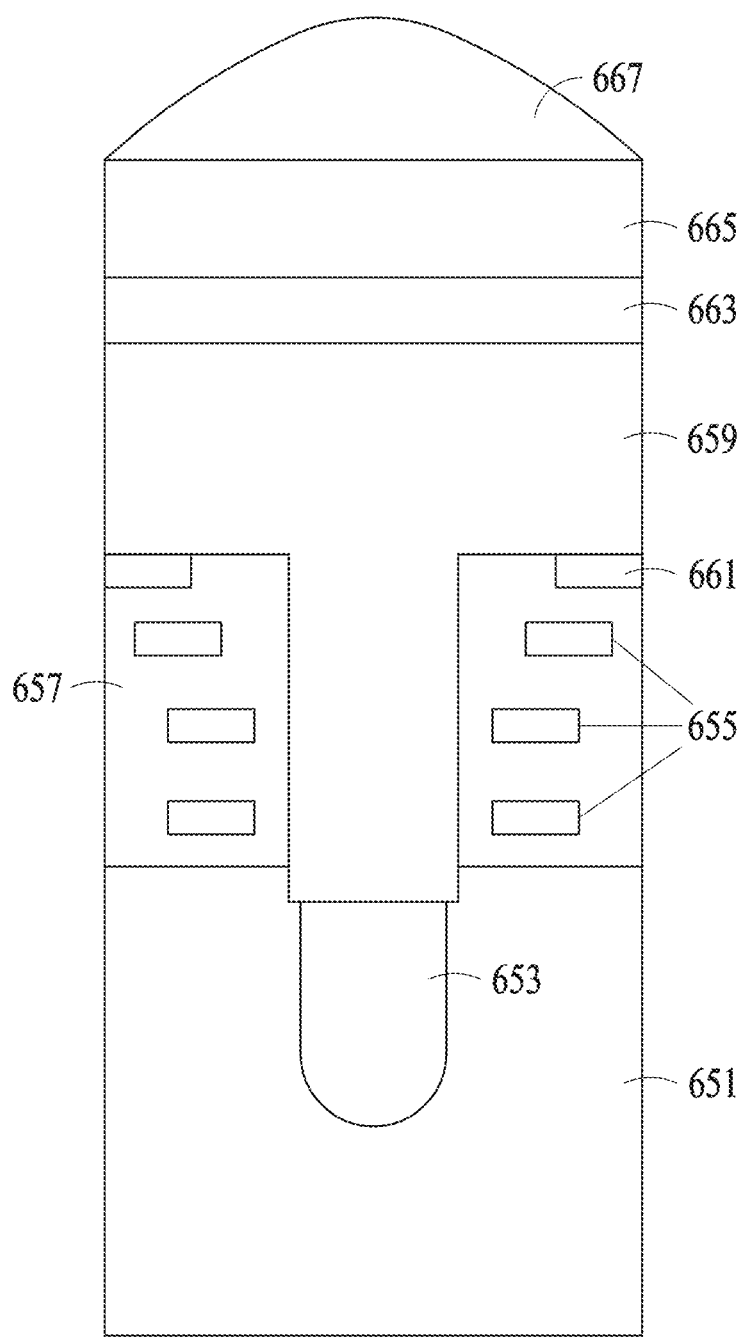
FIG. 39C, shows a front-side illuminated CMOS image sensor pixel in which an optically sensitive material has been integrated in intimate contact with the silicon diode.

Referring to FIG. 39C, a substantially lateral device may be formed wherein an electrode atop the silicon 661 that resides beneath the sensitizing material 659 may be employed. In embodiments, the electrode 661 may be formed using metals or other conductors such as TiN, TiOxNy, Al, Cu, Ni, Mo, Pt, PtSi, or ITO.

Referring to FIG. 39C, a substantially lateral device may be formed wherein the p-doped silicon 661 that resides beneath the sensitizing material 659 may be employed for biasing.

Example embodiments provide image sensors that use an array of pixel elements to detect an image. The pixel elements may include photosensitive material, also referred to herein as the sensitizing material, corresponding to 609 in FIG. 39A, 641 in FIG. 39B, 659 in FIG. 39C, 709 in FIG. 39A, the filled ellipse in FIG. 41 on which light 801 is incident, 903 in FIG. 59, 1003 in FIGS. 60, and 1103 in FIGS. 61A through 61F. FIGS. 59 and 61A through 61F are discussed in more detail, below.

FIG. 39C depicts a front-side illuminated CMOS image sensor pixel in which an optically sensitive material has been integrated in intimate contact with the silicon diode. In this embodiment the optically sensitive material is biased by the silicon substrate directly; as a result, in this embodiment, no transparent electrode is required on top. 651 depicts a silicon substrate on which the image sensor is fabricated. 653 depicts a diode formed in silicon. 655 is the metal interconnect and 657 the interlayer dielectric stack that serves to provide communication of electrical signals within and across the integrated circuit. 659 is an optically sensitive material that is the primary location for the absorption of light to be imaged. 661 points to an example region of the silicon substrate 651 that is used to provide electrical biasing of the optically sensitive material to enable photocarrier collection from it. 663 is a passivation layer that may consist of at least one of an organic or polymer encapsulant (such as parylene) or an inorganic such as Si3N4 or a stack incorporating combinations thereof 663 serves to protect the underlying materials and circuits from environmental influences such as the impact of water or oxygen. 665 is a color filter array layer that is a spectrally-selective transmitter of light used in aid of achieving color imaging. 667 is a microlens that aids in the focusing of light onto 659 the optically sensitive material.

Figure 40A:
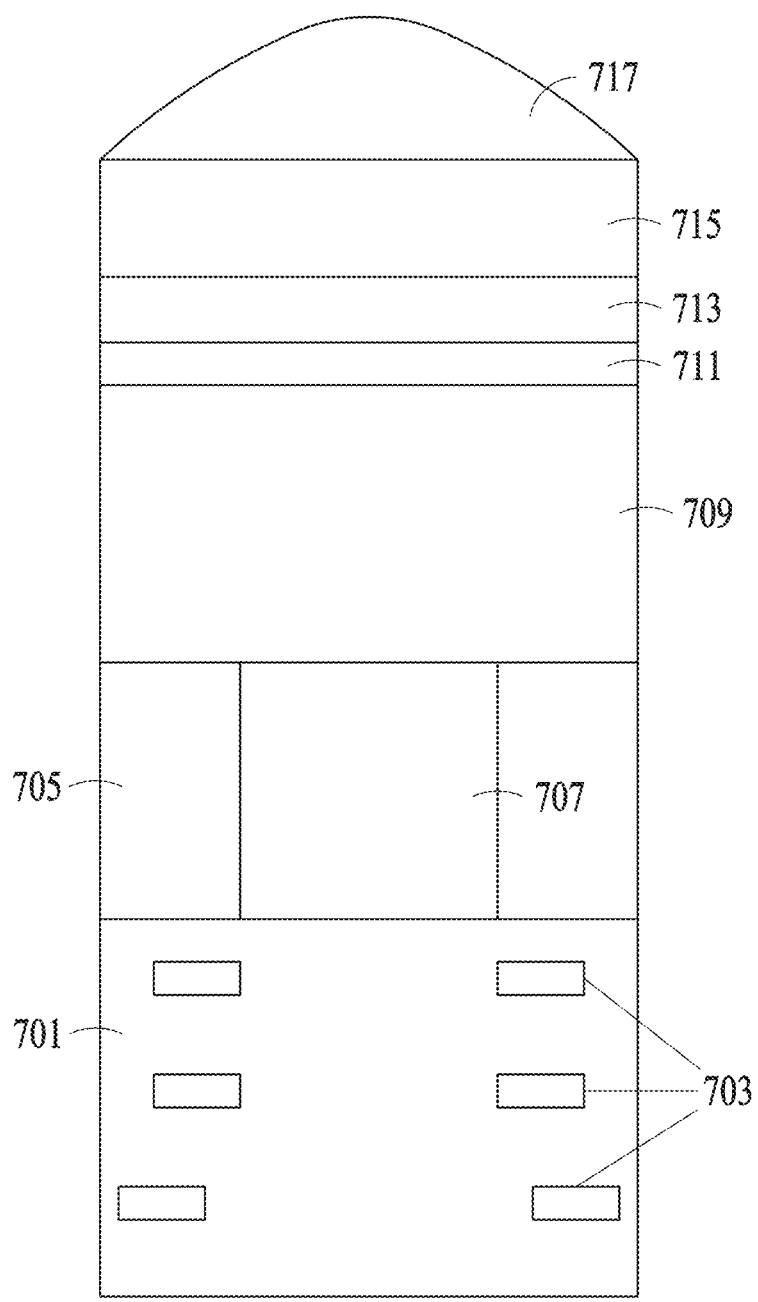
FIG. 40A shows a cross-section of a back-side illuminated CMOS image sensor pixel in which an optically sensitive material has been integrated in intimate contact with the silicon photodiode.

FIG. 40A depicts a cross-section of a back-side illuminated CMOS image sensor pixel in which an optically sensitive material has been integrated in intimate contact with the silicon photodiode. 705 depicts a silicon substrate on which the image sensor is fabricated. 707 depicts a diode formed in silicon. 703 is the metal interconnect and 701 the interlayer dielectric stack that serves to provide communication of electrical signals within and across the integrated circuit. 709 is an optically sensitive material that is the primary location for the absorption of light to be imaged. 711 is a transparent electrode that is used to provide electrical biasing of the optically sensitive material to enable photocarrier collection from it. 713 is a passivation layer that may consist of at least one of an organic or polymer encapsulant (such as parylene) or an inorganic such as Si3N4 or a stack incorporating combinations thereof 713 serves to protect the underlying materials and circuits from environmental influences such as the impact of water or oxygen. 715 is a color filter array layer that is a spectrally-selective transmitter of light used in aid of achieving color imaging. 717 is a microlens that aids in the focusing of light onto 709 the optically sensitive material.

Figure 40B:
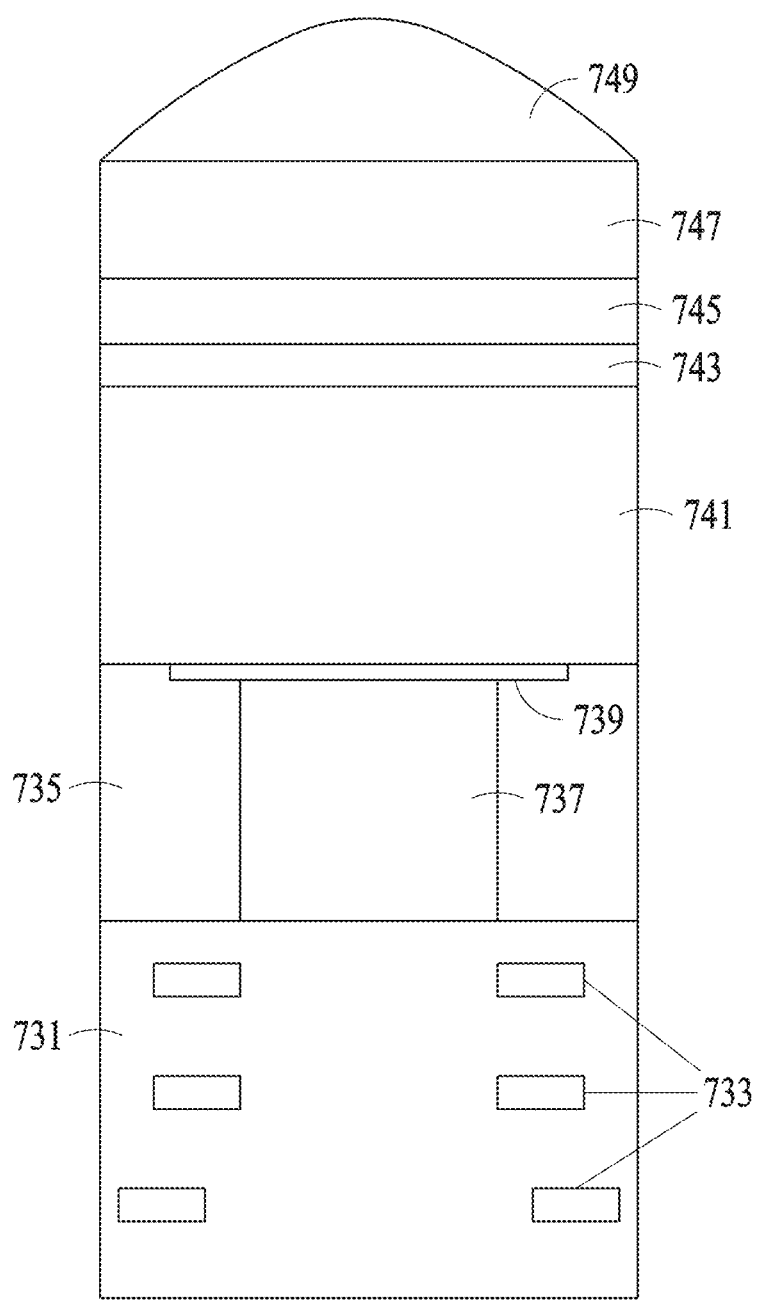
FIG. 40B shows a cross-section of a back-side illuminated CMOS image sensor pixel in which an optically sensitive material has been integrated in intimate contact with the silicon photodiode.

FIG. 40B depicts a cross-section of a back-side illuminated CMOS image sensor pixel in which an optically sensitive material has been integrated in intimate contact with the silicon photodiode. 735 depicts a silicon substrate on which the image sensor is fabricated. 737 depicts a diode formed in silicon. 733 is the metal interconnect and 731 the interlayer dielectric stack that serves to provide communication of electrical signals within and across the integrated circuit. 741 is an optically sensitive material that is the primary location for the absorption of light to be imaged. 743 is a transparent electrode that is used to provide electrical biasing of the optically sensitive material to enable photocarrier collection from it. 745 is a passivation layer that may consist of at least one of an organic or polymer encapsulant (such as parylene) or an inorganic such as Si3N4 or a stack incorporating combinations thereof 745 serves to protect the underlying materials and circuits from environmental influences such as the impact of water or oxygen. 747 is a color filter array layer that is a spectrally-selective transmitter of light used in aid of achieving color imaging. 749 is a microlens that aids in the focusing of light onto '5' the optically sensitive material. 739 is a material that resides between the optically sensitive material 741 and the diode 737. 739 may be referred to as an added pinning layer. Example embodiments include a p-type silicon layer. Example embodiments include a non-metallic material such as a semiconductor and/or it could include polymer and/or organic materials. In embodiments, material 739 may provide a path having sufficient conductivity for charge to flow from the optically sensitive material to the diode, but would not be metallic interconnect. In embodiments, 739 serves to passivate the surface of the diode and create the pinned diode in this example embodiment (instead of the optically sensitive material, which would be on top of this additional layer).

Figure 41:
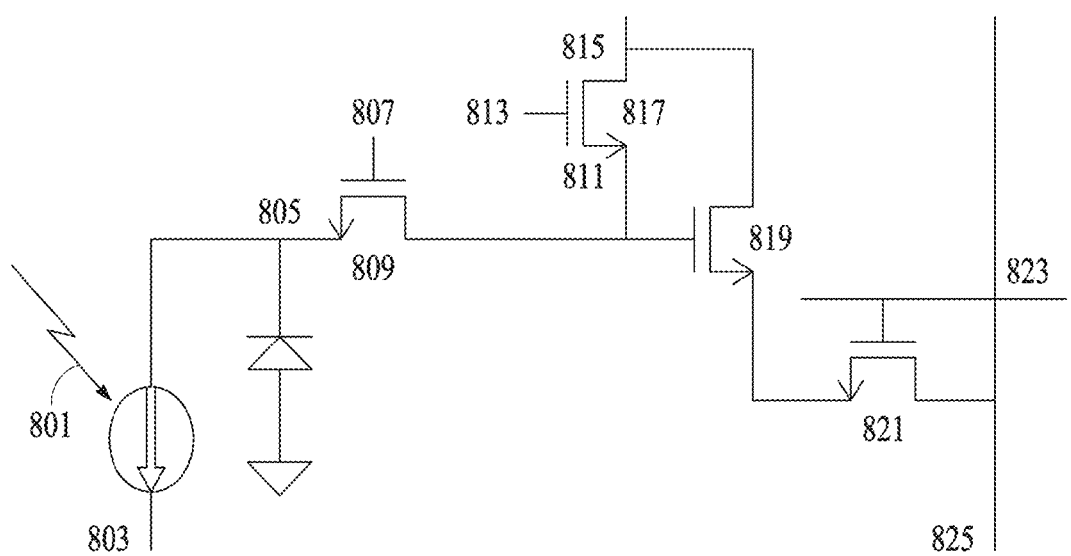
FIG. 41 shows a circuit diagram for a back-side illuminated image sensor in which optically sensitive material is integrated to a silicon chip from the back side.

FIG. 41 is a circuit diagram for a back-side illuminated image sensor in which optically sensitive material is integrated to silicon chip from the back side. 801 depicts light illuminating the optically sensitive material (filled circle with downward-pointing arrow). 803 is an electrode that provides bias across the optically sensitive material. It corresponds to the top transparent electrode (711 of FIG. 40A) or to the region of the silicon substrate used to provide electrical biasing (743 of FIG. 40B). 805 is the silicon diode (corresponding to 603, 633,653, 707, and 737 in FIGS. 39A, 39B, 39C, 40A, and 40B, respectively). 805 may also be termed the charge store. 805 may be termed the pinned diode. 807 is an electrode on the front side of silicon (metal), which ties to transistor gate of M1. 809 is the transistor M1, which separates the diode from sense node and the rest of the readout circuitry. The gate of this transistor is 807. A transfer signal is applied to this gate to transfer charge between the diode and the sense node 811. 811 is the sense node. It is separated from diode, allowing flexibility in the readout scheme. 813 is an electrode on the front side of silicon (metal), which ties to the transistor gate of M2. 815 is an electrode on the front side of silicon (metal), which ties to transistor drain of M2. 815 may be termed a reference potential. 815 can provide VDD for reset. 817 is the transistor M2, which acts as a reset device. It is used to initialize the sense node before readout. It is also used to initialize the diode before integration (when M1 and M2 are both turned on). The gate of this transistor is 813. A reset signal is applied to this gate to reset the sense node 811. 819 is transistor M3, which is used to read out the sense node voltage. 821 is transistor M4, which is used to connect the pixel to the readout bus. 823 is an electrode on the front side of silicon (metal), which ties to the gate of M4. When it is high, the pixel driving the readout bus vcol. 825 is the readout bus vcol. 801 and 803 and 805 reside within the backside of silicon. 807-825 reside within the frontside of silicon, including metal stack and transistors.

Referring to FIG. 41, the diagonal line is included to help describe the backside implementation. The transistors to the right of this line would be formed on the front side. The diode and optically sensitive material on the left would be on the back side. The diode would extend from the back side through the substrate and near to the front side. This allows a connection to be formed between the transistors on the front side to transfer charge from the diode to the sense node 811 of the pixel circuit.

Referring to FIG. 41, the pixel circuit may be defined as the set of all circuit elements in the figure, with the exception of the optically sensitive material. The pixel circuit includes the read-out circuit, the latter include a source follower transistor 819, row select transistor 821 with row select gate 823, and column read out 825.

Figure 42:
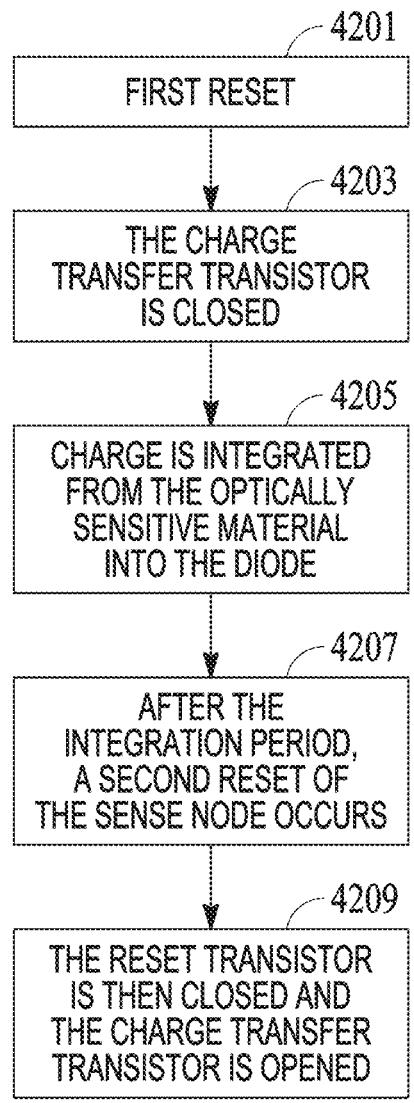
FIG. 42 shows a flowchart of an operation of the pixel circuitry.

Referring to FIG. 42, in embodiments, the pixel circuit may operate in the following manner.

A first reset (FIG. 42 at operation 4201) is performed to reset the sense node (811 from FIG. 41) and the diode (805 from FIG. 41) prior to integration. Reset transistor (817 from FIG. 41) and charge transfer transistor (809 from FIG. 41) are open during the first reset. This resets the sense node (811 from FIG. 41) to the reference potential (for example, 3 Volts). The diode is pinned to a fixed voltage when it is depleted. The fixed voltage to which the diode is pinned may be termed the depletion voltage of the diode. The reset depletes the diode which resets its voltage (for example, to 1 Volt). Since it is pinned, it will not reach the same voltage level as the sense node.

The charge transfer transistor (809 from FIG. 41) is then closed (FIG. 42 at operation 4203) to start the integration period which isolates the sense node from the diode.

Charge is integrated (FIG. 42 at operation 4205) from the optically sensitive material into the diode during the integration period of time. The electrode that biases the optically sensitive film is at a lower voltage than the diode (for example, 0 Volts) so there is a voltage difference across the material and charge integrates to the diode. The charge is integrated through a non-metallic contact region between the material and the diode. In embodiments, this is the junction between the optically sensitive material and the n-doped region of the diode. In embodiments, there may reside other non-metallic layers (such as p-type silicon) between the optically sensitive material and the diode. The interface with the optically sensitive material causes the diode to be pinned and also passivates the surface of the n-doped region by providing a hole accumulation layer. This reduces noise and dark current that would otherwise be generated by silicon oxide formed on the top surface of the diode.

After the integration period, a second reset (FIG. 42 at operation 4207) of the sense node occurs immediately prior to read out (the reset transistor is turned on while the diode remains isolated). This provides a known starting voltage for read out and eliminates noise/leakage introduced to the sense node during the integration period. The double reset process for pixel read out is referred to as true correlated double sampling.

The reset transistor is then closed and the charge transfer transistor is opened (FIG. 42 at operation 4209) to transfer charge from the diode to the sense node which is then read out through the source follower and column line.

Referring again to FIG. 39A, the use of the sensitizing material 609 may provide shorter absorption length than silicon's across the spectra range of interest. The sensitizing material may provide absorption lengths of 1 µm and shorter.

Referring to FIG. 39A, the high efficiency of photocarrier transfer from the sensitizing material 609 to a read-out integrated circuit beneath via diode 603 may be achieved.

Referring to FIG. 39A, the system described may achieve a minimum of dark current and/or noise and/or photoresponse nonuniformity and/or dark current nonuniformity by integrating the optically sensitive material 609 with the silicon read-out circuit via diode 603.

Referring to FIG. 39A, examples of optically sensitive material 609 include dense thin films made of colloidal quantum dots. Constituent materials include PbS, PbSe, PbTe; CdS, CdSe, CdTe; Bi2S3, In2S3, In2Se3; SnS, SnSe, SnTe; ZnS, ZnSe, ZnTe. The nanoparticles may be in the range 1-10 nm in diameter, and may be substantially monodispersed, i.e., may possess substantially the same size and shape. The materials may include organic ligands and/or crosslinkers to aid in surface passivation and of a length and conductivity that, combined, facilitate inter-quantum-dot charge transfer.

Referring to FIG. 39A, examples of optically sensitive material 609 include thin films made of organic materials that are strongly absorptive of light in some or all wavelength ranges of interest. Constituent materials include P3HT, PCBM, PPV, MEH-PPV, and copper phthalocyanine and related metal phthalocyanines.

Referring to FIG. 39A, examples of optically sensitive material 609 include thin films made of inorganic materials such as CdTe, copper indium gallium (di)selenide (CIGS), Cu2ZnSnS4 (CZTS), or III-V type materials such as AlGaAs.

Referring to FIG. 39A, optically sensitive material 609 may be directly integrated with a diode 603 in a manner that may, among other benefits, reduce dark currents. The direct integration of the optically sensitive material 609 with the silicon diode 603 may lead to reduced dark currents associated with interface traps located on the surface of a diode. This concept may enable substantially complete transfer of charge from the diode into a floating sense node, enabling true correlated double sample operation.

Referring to FIGS. 39A, 39B, and 39C, the respective sensitizing materials 609, 641, and 659 may be integrated with, and serve to augment the sensitivity and reduce the crosstalk of, a front-side-illuminated image sensor. Electrical connection is made between the sensitizing material 609, 641, and 659 and the respective diode 603, 633, and 653.

Referring to FIGS. 40A and 40B, the respective sensitizing materials 709 and 741 may be integrated with, and serve to augment the sensitivity and reduce the crosstalk of, a back-side-illuminated image sensor. Following the application and thinning of the second wafer atop a first, plus any further implants and surface treatments, a substantially planar silicon surface is presented. With this material may be integrated the sensitizing material materials 709 and 741.

The electrical biasing of the sensitizing material may be achieved substantially in the lateral or in the vertical direction.

Referring to FIG. 39A, which may be termed a substantially vertical biasing case, bias across the sensitizing material 609 is provided between the diode 603 and a top electrode 611. In this case the top electrode 611 is desired to be substantially transparent to the wavelengths of light to be sensed. Examples of materials that can be used to form top electrode 611 include MoO3, ITO, AZO, organic materials such as BPhen, and very thin layers of metals such as aluminum, silver, copper, nickel, etc.

Referring to FIG. 39B, which may be termed a substantially lateral, or coplanar, biasing case, bias across the sensitizing material 641 is provided between the diode 633 and silicon substrate electrode 639.

Referring to FIG. 39C, which may be termed partially lateral, partially vertical, biasing case, bias across the sensitizing material 659 is provided between the diode 653 and electrode 661.

Example embodiments include image sensor systems in which the zoom level, or field of view, is selected not at the time of original image capture, but instead at the time of image processing or selection.

Embodiments include a first image sensor region, or primary image sensor region, possessing a first pixel count exceeding at least 8 megapixels; and an at least second image sensor region, possessing a second pixel count less than 2 megapixels.

Embodiments include systems that provide true optical (as distinct from electronic, or digital) zoom, in which the total z-height is minimized. Embodiments include systems that achieve true optical zoom without the use of mechanical moving parts such as may be required in a telephoto system.

Embodiments include image sensor systems providing true optical zoom without adding undue cost to an image sensor system.

Embodiments include a file format that includes at least two constituent images: a first image, corresponding to a principal imaging region or field of view; and an at least second image, corresponding to a second field of view that is generally smaller (in angular extent) than that of the first field of view.

Embodiments include a file format that includes at least three constituent images: a first image, corresponding to a principal imaging region or field of view; an at least second image, corresponding to a second field of view that is generally smaller (in angular extent) than that of the first field of view; and a third image, corresponding to a second field of view that is generally smaller (in angular extent) than that of the first field of view.

Embodiments include a multiaperture image sensor system consisting of a single integrated circuit; image sensing subregions; and a number of analog-to-digital converters that is less than the number of image sensing subregions.

Embodiments include a multiaperture image sensor system consisting of a single integrated circuit; image sensing subregions; where the image sensor integrated circuit is of an area less than of a set of discrete image sensors required to achieve the same total imaging area.

Embodiments include an image sensor integrated circuit comprising pixels of at least two classes; where the first pixel class comprises pixels having a first area; and the second pixel class comprises pixels having a second area; where the area of the first pixel is different from that of the second pixel.

In embodiments, pixels of the first class have area (1.4 µm×1.4 µm pixels) and pixels of the second class have area (1.1 µm×1.1 µm). Pixel sizes can vary from less than about 0.5 to 3 microns across a lateral dimension or any range subsumed therein (less than about 0.5 to 3 microns squared in area or any range subsumed therein). In examples, the pixels size may be less than about 1.3, 1.4, 1.5, 1.7, 2, 2.2 or 2.5 microns (with less than that amount squared in area). Specific examples are 1.2 and 1.4 microns. The primary array may have larger pixels than secondary array. Primary may be greater than 0.5, 0.7, 1, 1.2 or 1.4 or 1.5 microns and less than 1, 1.2, 1.5, 1.7, 2, 2.2, 2.5 or 3 microns. The one or more secondary arrays could be also be greater than 0.5, 0.7, 1, 1.2 or 1.4 or 1.5 microns and less than 1, 1.2, 1.5, 1.7, 2, 2.2, 2.5 or 3 microns but would be smaller than the primary. For example, the primary may be greater than X and the secondary may be less than X, where X is 1.2, 1.4, 1.5, 1.7, or 2, etc.

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

In embodiments, image sensor systems include multiaperture imaging in which multiple lenses, but a single integrated image sensor circuit, implement multiaperture imaging.

In embodiments, image sensor systems include a first image sensor region; a second image sensor region; where the beginning of the integration period of each image sensor region is aligned in time within 1 millisecond (temporal alignment, or synchronicity, among image sensor regions).

In embodiments, image sensor systems include a first image sensor region; a second image sensor region; and a third image sensor; where the beginning of the integration period of each image sensor region is aligned in time within 1 millisecond (temporal alignment, or synchronicity, among image sensor regions).

In embodiments, image sensor systems include a first image sensor region; a second image sensor region; where each image sensor region implements global electronic shutter, wherein, during a first period of time, each of the at least two image sensor regions accumulates electronic charges proportional to the photon fluence on each pixel within each image sensor region; and, during a second period of time, each image sensor region extracts an electronic signal proportional to the electronic charge accumulated within each pixel region within its respective integration period.

In embodiments, superresolution is achieved by employing a first imaging region having a first phase shift relative to the imaged field of view; a second imaging region having a second field of view; where the relative phase shifts are controlled via the application of an electric field to the circuitry controlling the second imaging region.

In embodiments, a first, or principal, imaging region comprises a first number of pixels; and an at least second, or secondary, imaging region comprises a second number of pixels; where the number of pixels in the secondary imaging region is at least two times less than that in the first imaging region.

In embodiments, an image sensor system comprises: a circuit for implementing global electronic shutter; and pixels having linear dimensions less than (1.4 µm×1.4 µm pixels).

In embodiments, superresolution is achieved by employing a first imaging region having a first phase shift relative to the imaged field of view; a second imaging region having a second field of view; where the relative phase shifts are controlled via the application of an electric field to the circuitry controlling the second imaging region.

In embodiments, optimized superresolution is achieved by providing at least two imaging regions having a phase shift; determining said phase shift by comparing images acquired of a given scene using said at least two imaging regions; and dynamically adjusting the relative phase shift of the two imaging regions in response to said comparison in order to optimize the superresolution achieved by combining the information acquired using said two imaging regions.

Embodiments include fused images in which a first imaging region achieves high spatial resolution; and a second imaging region, such as a frame around said first imaging region, achieves a lower spatial resolution.

Embodiments include image sensor systems comprising a first camera module providing a first image; and a second camera module providing a second image (or images); where the addition of the second camera module provides zoom.

Figure 43:
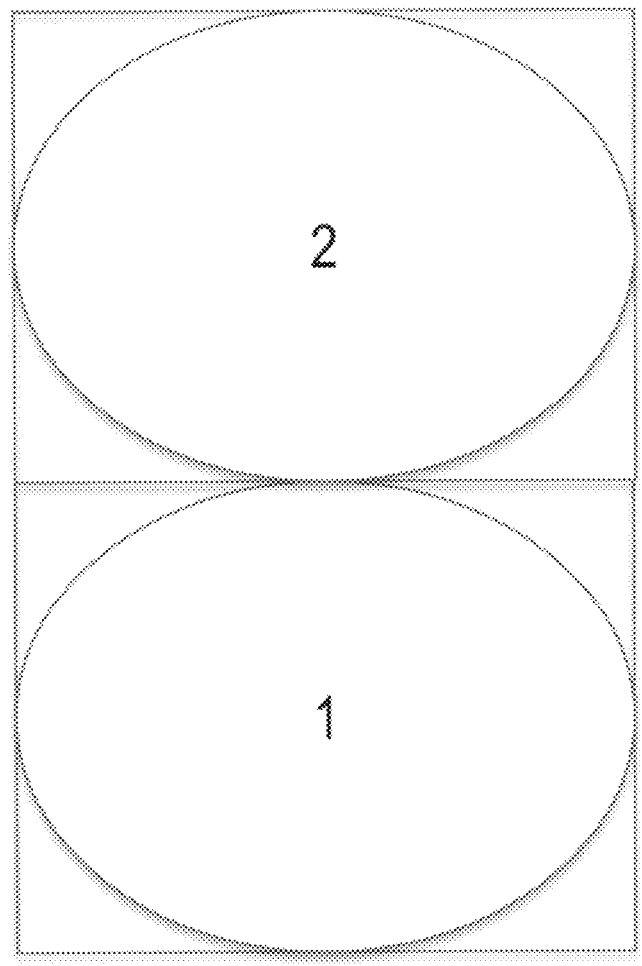
FIGS. 43 and 44 show example embodiments of multiaperture zoom from the perspective of the scene imaged.

FIG. 43 shows an example embodiment of multiaperture zoom from the perspective of the image array. The rectangle containing 202.01 is the principal array. The ellipse containing 202.01 represents the approximate extent of the optical systems (lens or lenses, possibly iris) that images a projection of the scene to be imaged onto 202.01. The rectangle containing 202.02 is the zoomed-in array. The ellipse containing 202.02 represents the approximate extent of the optical systems (lens or lenses, possibly iris) that images a projection of the scene to be imaged onto 202.02.

Figure 44:
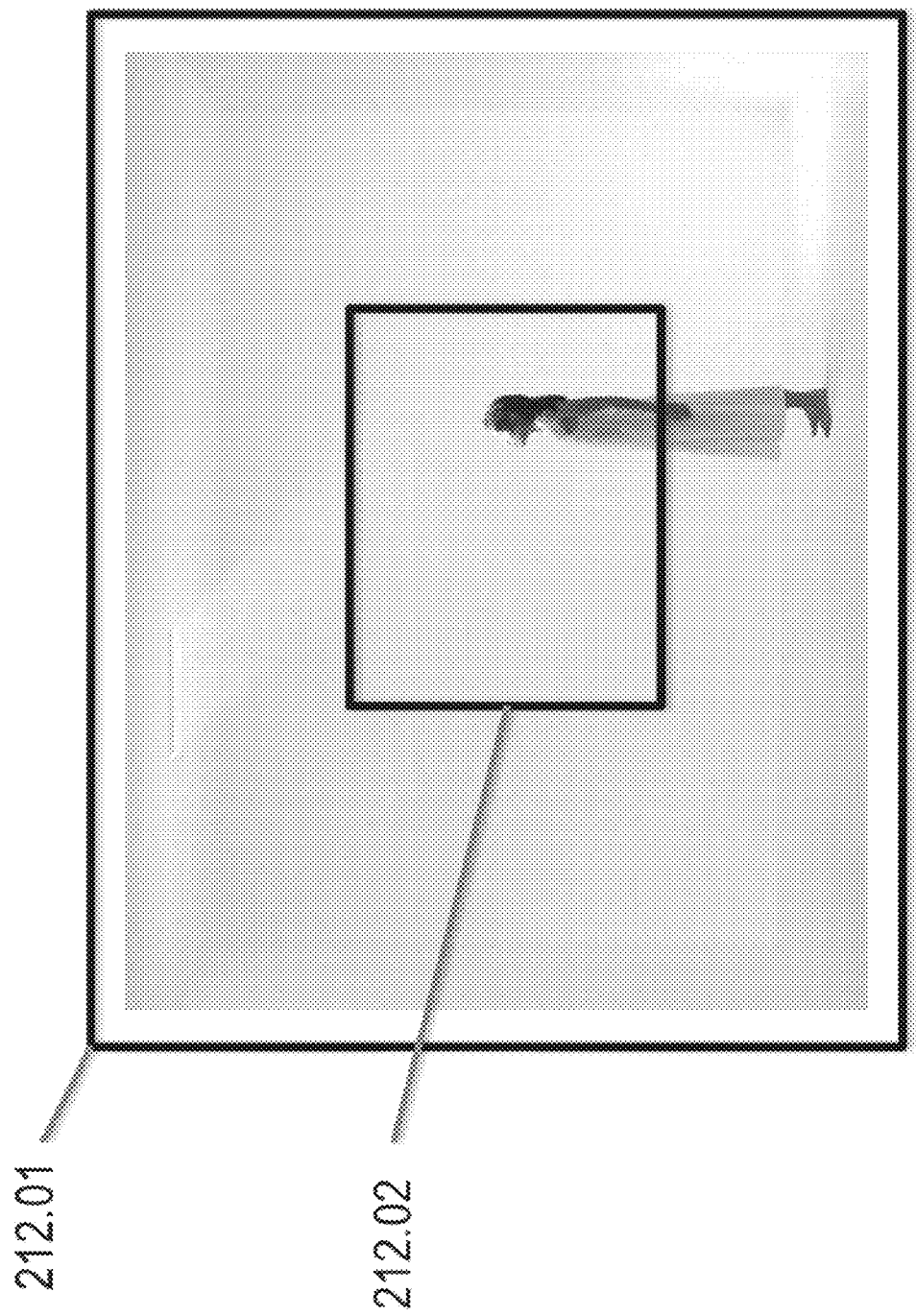

FIG. 44 shows an example embodiment of multiaperture zoom from the perspective of the scene imaged. The rectangle 212.01 represents the portion of the scene imaged onto the principal array 202.01 of FIG. 43. The rectangle 212.02 represents the portion of the scene imaged onto the zoomed-in array 202.02 of FIG. 43.

Referring to FIG. 43, in an example embodiment, the principal array (or primary array) is an 8-megapixel array containing approximately 3266 pixels along his horizontal (landscape) axis. The imaging system projects a scene corresponding to an approximately 25° field of view onto this array. This projection is represented by 212.01 of FIG. 44. In this example, each pixel in the principal array accounts for approximately 0.008° of field of view of the scene.

The zoomed-in array (or secondary array) is also an 8-megapixel array containing approximately 3266 pixels along his horizontal (landscape) axis. The imaging system projects a scene corresponding to an approximately 25°/3=8° field of view onto this array. This projection is represented by 212.02 of FIG. 44. In this example, each pixel in the zoomed-in array accounts for approximately 0.008°/3=0.0025° of field of view of the scene.

The primary array can include at least 4 to 12 megapixels or any range subsumed therein (for example, 4, 6, 8, 10, or 12 megapixels). For the secondary array, indicate that it can also be the same size (4, 6, 8, 10, 12). In various embodiments, there may be a number of secondary arrays (1 to 20 megapixels or any range subsumed therein, particularly, 1, 2, 4, 6, 8, 10, 12, 14, or 16 megapixels). The secondary arrays all may be smaller than the primary array of 1 to 8 megapixels or any range subsumed therein (for example, 1, 2, 4, 6, or 8 megapixels). In some embodiments, all of the secondary image arrays may be the same size (and may be less than the primary image array). In other embodiments, the secondary arrays may themselves vary in size (for example, they could vary between 1, 2 or 4 megapixels). They can be multi-color or single color (particularly secondary arrays with two for green, one blue and one red and multiples of that ratio). In example, the primary array may have a 1× zoom, and the secondary arrays may be more zoomed in (1.5× to 10× or any range subsumed therein, particularly, 2, 3, or 4× zoom). In other embodiments, the primary array may have a zoom level in between the zoom level of secondary arrays. The primary may have a zoom of x, and one secondary array may be one half (0.5)× and another may be 2×. Another example would be at least two zoomed out secondary arrays (1, 2, or 4 megapixels) of one quarter (0.25)× and one half (0.5)×, a primary array (2, 4, 8 or 12 megapixels) of 1× zoom, and at least two zoomed in secondary arrays (1, 2, or 4 megapixels).

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

In this example embodiment, 3× optical zoom is achieved in the zoomed-in array. In the zoomed-in array, each pixel is responsible for ⅓ of the field of view as in the principal array. The overall imaging integrated circuit has approximately 2× the area that would be required if only a single imaging region of the same resolution and pixel size were employed. No compromise has been made in the quality of imaging within the principal array.

In example embodiments, the images acquired in each of the arrays may be acquired concurrently. In example embodiments, the images acquired in each of the arrays may be acquired with the aid of global electronic shutter, wherein the time of start and the time of stop of the integration period in each pixel, in each of the arrays, is approximately the same.

In the two-array case, the processing of images generated using multiple arrays offering different zoom levels.

Figure 45:
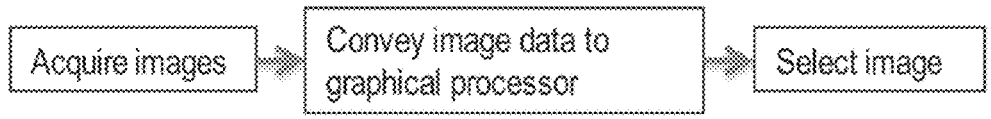
FIGS. 45-48 are flowcharts of example operations on images.

FIG. 45 describes a method in which the image sensor system first acquires the two images. It then conveys the image data to a graphical processor. It then selects one of the images to be stored.

Referring to FIG. 45, in example embodiments, only one of the two images may be stored. For example, the user of the imaging system may have indicated a preference for zoomed-out, or zoomed-in, mode, and only the preferred image may be retained in this case.

Figure 46:
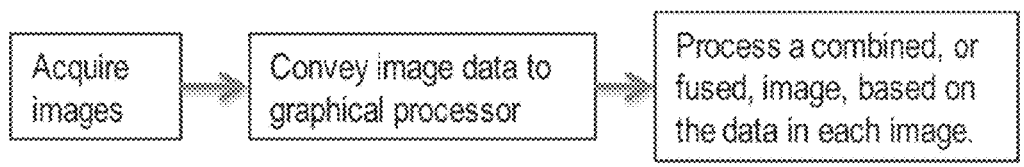

FIG. 46 describes a method in which the image sensor system first acquires the two images. It then conveys the image data to a graphical processor. The graphical processor then generates an image that may employ data from each image sensor.

Referring to FIG. 46, in example embodiments, both images may conveyed to a graphical processing unit that may use the images to generate an image that combines the information contained in the two images. The graphical processing unit may not substantially alter the image in the regions where only the principal image sensor captured the image. The graphical processing unit may present a higher-resolution region near the center of the reported image in which this region benefits from combining the information combined in the center of the peripheral array, and the contents reported by the zoomed-in array.

Figure 47:
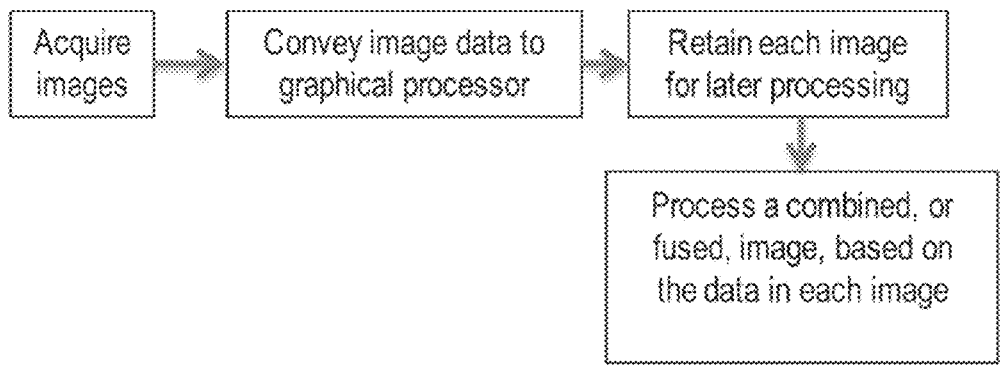

FIG. 47 describes a method in which the image sensor system first acquires the two images. It then conveys the image data to a graphical processor. The graphical processor then conveys each of the two images for storage. At a later time, a graphical processor then generates an image that may employ data from each image sensor.

Referring to FIG. 47, in example embodiments, the user of the imaging system may desire to retain the option to select the level of zoom—including the effective level of optical zoom—at a later time. In example embodiments, the image data acquired by each array region may be made available to a subsequent image processing application for later processing of a desired image, having a desired zoom, based on the information contained in each image.

Figure 48:
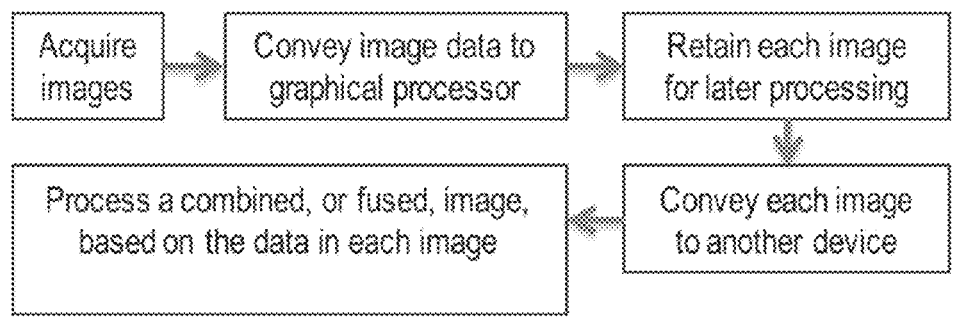

FIG. 48 describes a method in which the image sensor system first acquires the two images. It then conveys the image data to a graphical processor. The graphical processor then conveys each of the two images for storage. At a later time, each of the two images is conveyed to another device. At a later time, a device or system or application then generates an image that may employ data from each image sensor.

Referring to FIG. 48, in example embodiments, the user of the imaging system may desire to retain the option to select the level of zoom—including the effective level of optical zoom—at a later time. In example embodiments, the image data acquired by each array region may be made available to a device for later processing of a desired image, having a desired zoom, based on the information contained in each image.

In embodiments, a continuous or near-continuous set of zoom level options may be presented to the user. The user may zoom essentially continuously among the most-zoomed-out and the most-zoomed-in zoom levels.

Figure 49:
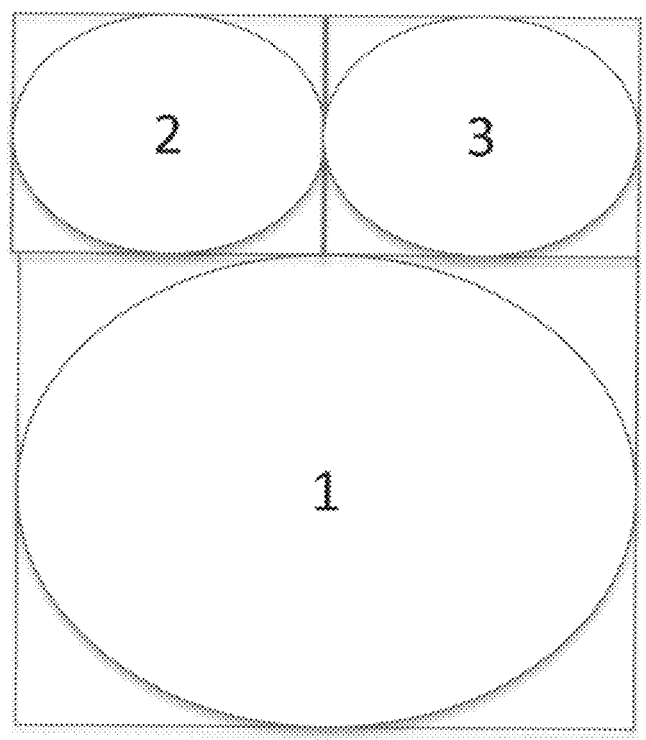
FIGS. 49-58 show example embodiments of multiaperture zoom from the perspective of the scene imaged.

FIG. 49 shows an example embodiment of multiaperture zoom from the perspective of the image array. The rectangle containing 207.01 is the principal array, i.e., it is the largest individual pixelated imaging region. The ellipse containing 207.01 represents the approximate extent of the optical systems (lens or lenses, possibly iris) that images a projection of the scene to be imaged onto 1. The rectangle containing 207.02 is the first peripheral array. The ellipse containing 207.02 represents the approximate extent of the optical systems (lens or lenses, possibly iris) that images a projection of the scene to be imaged onto 207.02. The rectangle containing 207.03 is the second peripheral array. The ellipse containing 207.03 represents the approximate extent of the optical systems (lens or lenses, possibly iris) that images a projection of the scene to be imaged onto 207.03.

Figure 50:
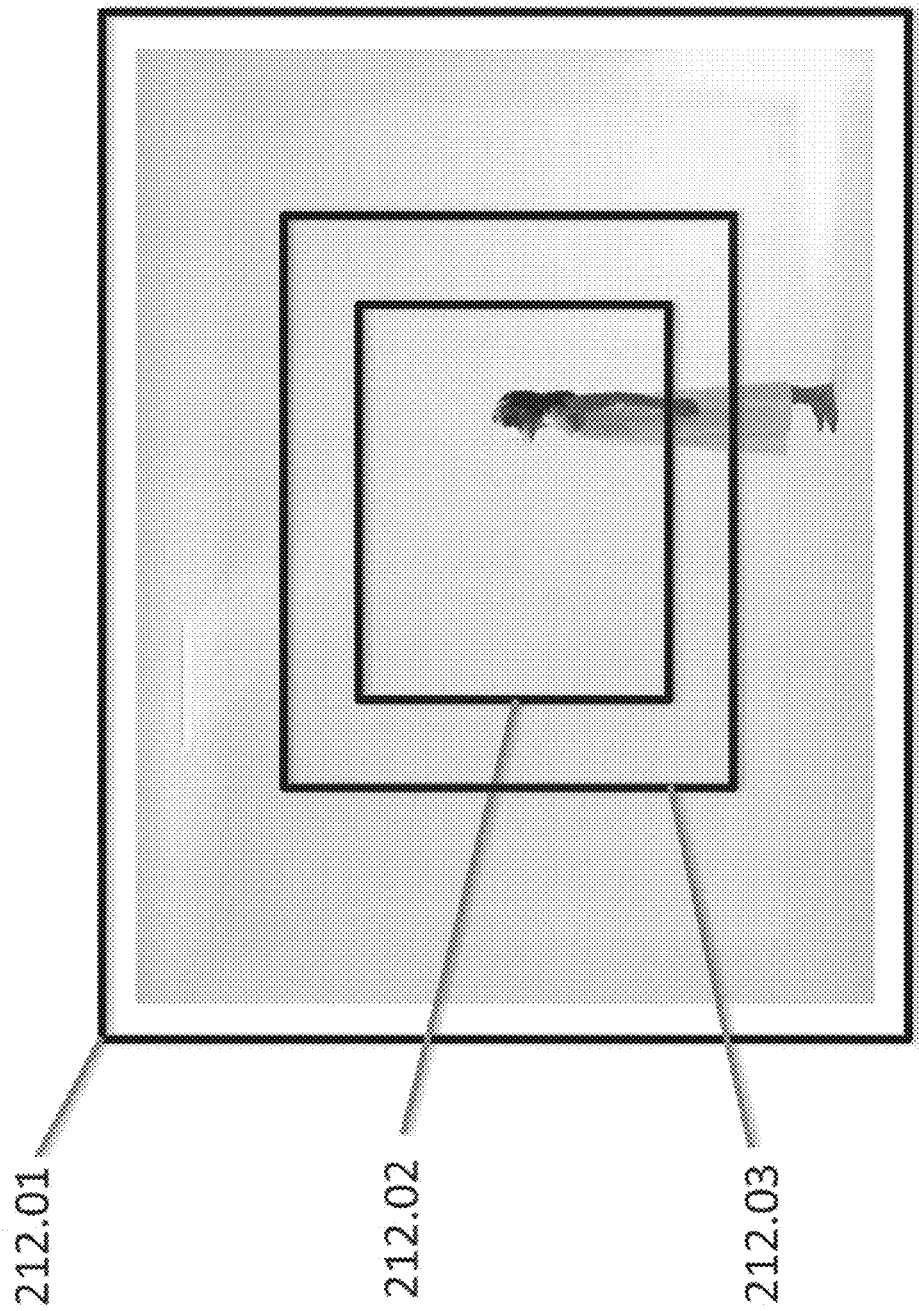

FIG. 50 shows an example embodiment of multiaperture zoom from the perspective of the scene imaged. The rectangle 212.01 represents the portion of the scene imaged onto the principal array 207.01 of FIG. 49. The rectangle 212.02 represents the portion of the scene imaged onto the first peripheral 207.02 of FIG. 49. The rectangle 212.03 represents the portion of the scene imaged onto the second peripheral 207.03 of FIG. 49.

Referring to FIG. 49, in an example embodiment, the principal array is an 8-megapixel array containing approximately 3266 pixels along his horizontal (landscape) axis. The imaging system projects a scene corresponding to an approximately 25° field of view onto this array. This projection is represented by 212.01 of FIG. 50. In this example, each pixel accounts for approximately 0.008° of field of view of the scene.

The first peripheral array, the most-zoomed-in array, is a 2-megapixel array containing 1633 pixels along his horizontal (landscape) axis. The imaging system projects a smaller portion of the same scene—in this example, 25°/3 field of view—onto this array. This projection is represented by 212.02 of FIG. 50. In this example, each pixel now accounts for approximately ⅔*0.008°=0.005° of field of view of the scene.

The second peripheral array, the intermediate-zoom array, is a 2-megapixel array containing 1633 pixels along his horizontal (landscape) axis. The imaging system projects a portion of the same scene onto this array where this portion is intermediate in angular field of view between full-field-of-view 25° and zoomed-in-field-of-view 8°. This projection is represented by 212.03 of FIG. 50. In an ex ample embodiment, the system is designed such that each pixel now accounts for approximately sqrt(2/3)*0.008°=0.0065° of field of view of the scene. In this example, the scene projected onto the second peripheral array corresponds to 25/3/sqrt(2/3)=10.2°.

The primary array can include at least 4 to 12 megapixels or any range subsumed therein (for example, 4, 6, 8, 10, or 12 megapixels). For the secondary array, indicate that it can also be the same size (4, 6, 8, 10, 12). In various embodiments, there may be a number of secondary arrays (1 to 20 megapixels or any range subsumed therein, particularly, 1, 2, 4, 6, 8, 10, 12, 14, or 16 megapixels). The secondary arrays all may be smaller than the primary array of 1 to 8 megapixels or any range subsumed therein (for example, 1, 2, 4, 6, or 8 megapixels). In some embodiments, all of the secondary image arrays may be the same size (and may be less than the primary image array). In other embodiments, the secondary arrays may themselves vary in size (for example, they could vary between 1, 2 or 4 megapixels). They can be multi-color or single color (particularly secondary arrays with two for green, one blue and one red and multiples of that ratio). In example, the primary array may have a 1× zoom, and the secondary arrays may be more zoomed in (1.5× to 10× or any range subsumed therein, particularly, 2, 3, or 4× zoom). In other embodiments, the primary array may have a zoom level in between the zoom level of secondary arrays. The primary may have a zoom of x, and one secondary array may be one half (0.5)× and another may be 2×. Another example would be at least two zoomed out secondary arrays (1, 2, or 4 megapixels) of one quarter (0.25)× and one half (0.5)×, a primary array (2, 4, 8 or 12 megapixels) of 1× zoom, and at least two zoomed in secondary arrays (1, 2, or 4 megapixels).

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

In this example embodiment, 3× optical zoom is achieved in the first peripheral array, the most-zoomed-in array. In the most-zoomed-in array, each pixel is responsible for ⅔ of the field of view as in the principal array.

In addition, 2.4× optical zoom is achieved in the second peripheral array, the intermediate-zoom array. In this array, each pixel is responsible for 82% of the field of view as in the principal array.

The overall imaging integrated circuit has approximately 1.5× the area that would be required if only a single imaging region of the same resolution and pixel size were employed. No compromise has been made in the quality of imaging within the principal array.

In addition, a progression of zoom is provided by the presence of the intermediate-zoom array.

In the three-array case, the processing of images generated using multiple arrays offering different zoom Referring to FIG. 45, in example embodiments, only one of the three images may be stored. For example, the user of the imaging system may have indicated a preference for zoomed-out, or zoomed-in, or intermediate-zoom, mode, and only the preferred image may be retained in this case.

Referring to FIG. 46, in example embodiments, multiple images may be conveyed to a graphical processing unit that may use the images to generate an image that combines the information contained in the multiple images. The graphical processing unit may not substantially alter the image in the regions where only the principal image sensor captured the image. The graphical processing unit may present a higher-resolution region near the center of the reported image in which this region benefits from combining the information combined in the center of the peripheral array, and the contents reported by the zoomed-in and/or intermediate array(s).

Referring to FIG. 47, in example embodiments, the user of the imaging system may desire to retain the option to select the level of zoom—including the effective level of optical zoom—at a later time. In example embodiments, the image data acquired by multiple array regions may be made available to a subsequent image processing application for later processing of a desired image, having a desired zoom, based on the information contained in multiple array regions.

Referring to FIG. 48, in example embodiments, the user of the imaging system may desire to retain the option to select the level of zoom—including the effective level of optical zoom—at a later time. In example embodiments, the image data acquired by multiple array regions may be made available to a device for later processing of a desired image, having a desired zoom, based on the information contained in multiple array regions.

Figure 51:
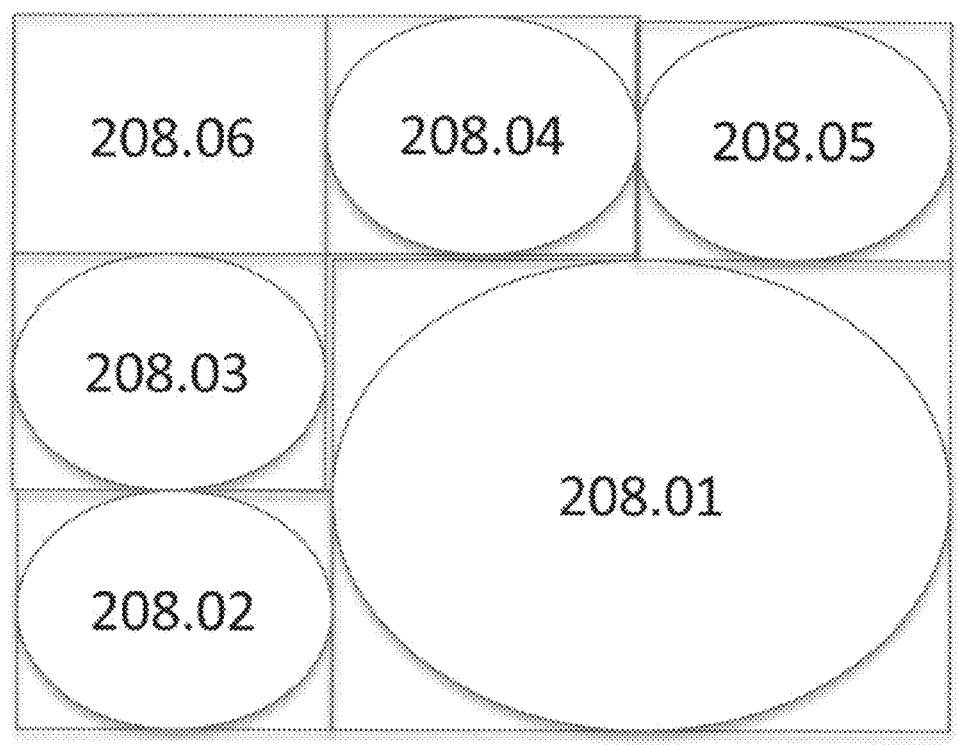

FIG. 51 shows an example embodiment of multiaperture zoom from the perspective of the image array. The rectangle containing 208.01 is the principal array, i.e., it is the largest individual pixelated imaging region. The ellipse containing 208.01 represents the approximate extent of the optical systems (lens or lenses, possibly iris) that images a projection of the scene to be imaged onto 208.01.

The rectangle containing 208.02 is the first peripheral array. The ellipse containing 208.02 represents the approximate extent of the optical systems (lens or lenses, possibly iris) that images a projection of the scene to be imaged onto 208.02. 208.03, 208.04, and 208.05 are analogously the second, third, and fourth peripheral and fifth peripheral arrays.

208.06 is a region of the integrated circuit used for purposes related to imaging, such as biasing, timing, amplification, storage, processing of images.

In embodiments, the flexibility to select the location(s) of areas such as 208.06 may be used to optimize layout, minimizing total integrated circuit area and cost.

Figure 52:
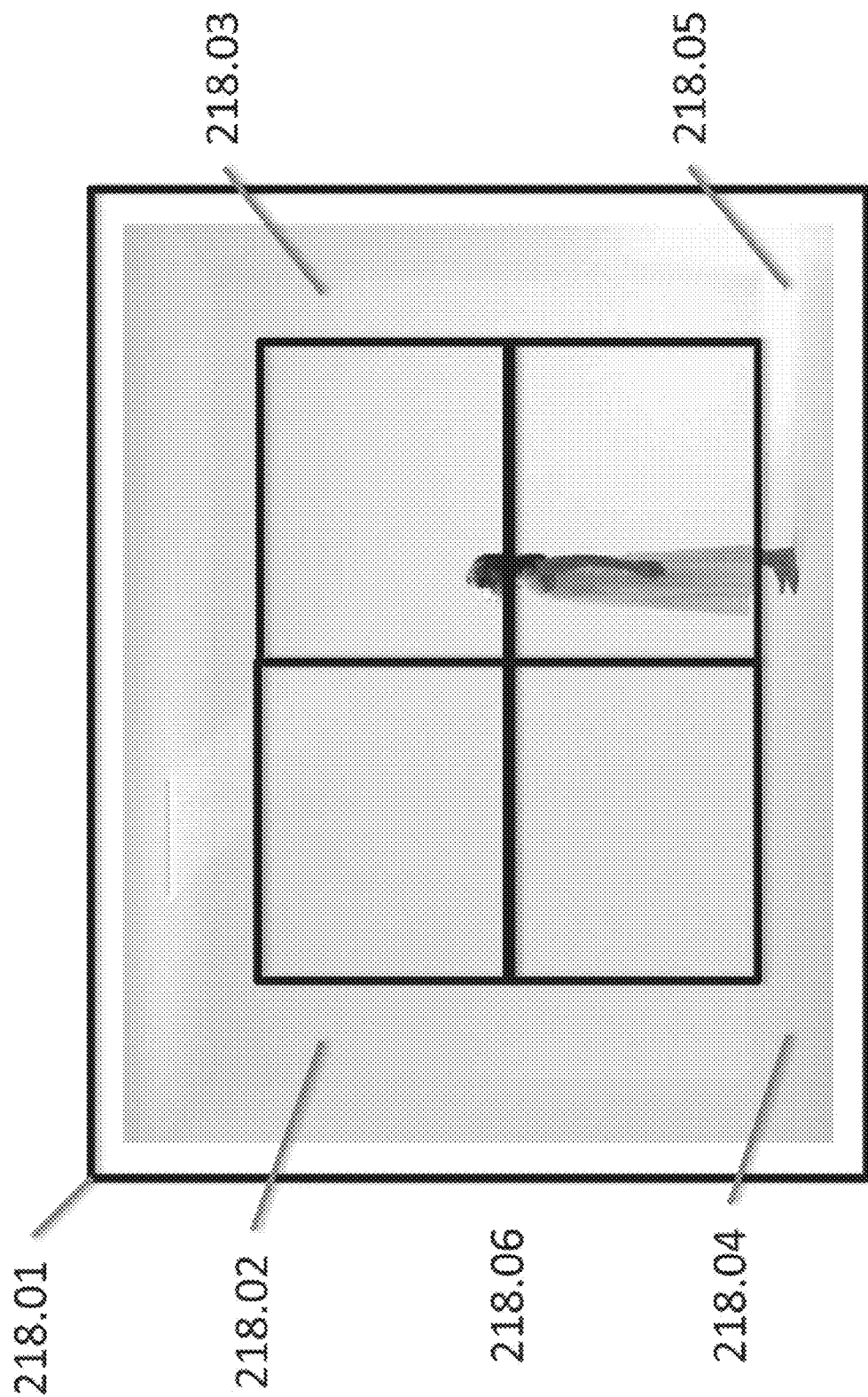

FIG. 52 shows an example embodiment of multiaperture zoom from the perspective of the scene imaged. The rectangle 218.01 represents the portion of the scene imaged onto the principal array 208.01 of FIG. 51.

The rectangle 218.02 represents the portion of the scene imaged onto the first peripheral array 208.02 of FIG. 51. 218.03, 218.04, and 218.05 are analogous.

Referring to FIG. 51, in an example embodiment, the principal array is an 8-megapixel array containing approximately 3266 pixels along his horizontal (landscape) axis. The imaging system projects a scene corresponding to an approximately 25° field of view onto this array. This projection is represented by 218.01 of FIG. 52. In this example, each pixel accounts for approximately 0.008° of field of view of the scene.

The first, second, third, and fourth arrays are each 2-megapixel arrays containing 1633 pixels along their horizontal (landscape) axes. The imaging system projects a portion of the same scene onto each array. The projection in the case of the first peripheral array is represented by 218.02 of FIG. 52. In an example embodiment, the system is designed such that each pixel now accounts for approximately 0008°/2=0.0040° of field of view of the scene. In this example, the scene projected onto the second peripheral array corresponds to 25°/(2*2)=6.25°. Different portions of the scene are analogously projected onto 218.03, 218.04, and 218.05. In this way, the scene projected onto the combined rectangle formed by 218.02-218.05 corresponds to 12.5°.

The primary array can include at least 4 to 12 megapixels or any range subsumed therein (for example, 4, 6, 8, 10, or 12 megapixels). For the secondary array, indicate that it can also be the same size (4, 6, 8, 10, 12). In various embodiments, there may be a number of secondary arrays (1 to 20 megapixels or any range subsumed therein, particularly, 1, 2, 4, 6, 8, 10, 12, 14, or 16 megapixels). The secondary arrays all may be smaller than the primary array of 1 to 8 megapixels or any range subsumed therein (for example, 1, 2, 4, 6, or 8 megapixels). In some embodiments, all of the secondary image arrays may be the same size (and may be less than the primary image array). In other embodiments, the secondary arrays may themselves vary in size (for example, they could vary between 1, 2 or 4 megapixels). They can be multi-color or single color (particularly secondary arrays with two for green, one blue and one red and multiples of that ratio). In example, the primary array may have a 1× zoom, and the secondary arrays may be more zoomed in (1.5× to 10× or any range subsumed therein, particularly, 2, 3, or 4× zoom). In other embodiments, the primary array may have a zoom level in between the zoom level of secondary arrays. The primary may have a zoom of x, and one secondary array may be one half (0.5)× and another may be 2×. Another example would be at least two zoomed out secondary arrays (1, 2, or 4 megapixels) of one quarter (0.25)× and one half (0.5)×, a primary array (2, 4, 8 or 12 megapixels) of 1× zoom, and at least two zoomed in secondary arrays (1, 2, or 4 megapixels).

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

In this example embodiment, 2× optical zoom is achieved via the peripheral arrays. Each pixel in the peripheral arrays is responsible for ½ of the field of view as in the principal array.

The overall imaging integrated circuit has slightly less than 2× the area that would be required if only a single imaging region of the same resolution and pixel size were employed. No compromise has been made in the quality of imaging within the principal array.

In addition, a progression of zoom is provided via the zoomed-in arrays.

Figure 53:
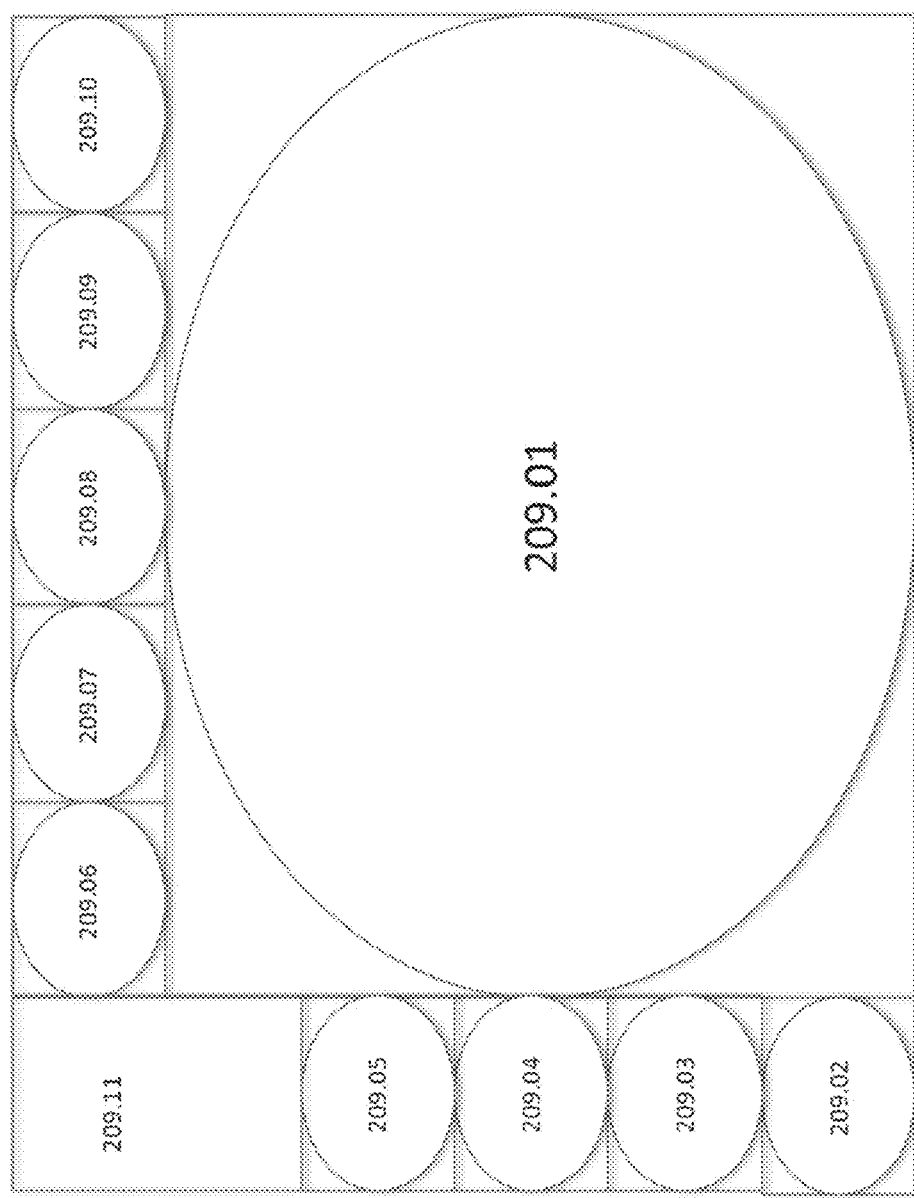

FIG. 53 shows an example embodiment of multiaperture zoom from the perspective of the image array. The rectangle containing 209.01 is the principal array, ie it is the largest individual pixelated imaging region. The ellipse containing 209.01 represents the approximate extent of the optical systems (lens or lenses, possibly iris) that images a projection of the scene to be imaged onto 209.01.

The rectangle containing 209.02 is the first peripheral array. The ellipse containing 209.02 represents the approximate extent of the optical systems (lens or lenses, possibly iris) that images a projection of the scene to be imaged onto 209.02. 209.03, 209.04, 209.05, 209.06, are analogously the second, third, and fourth peripheral and fifth peripheral arrays.

209.11 is a region of the integrated circuit used for purposes related to imaging, such as biasing, timing, amplification, storage, processing of images.

Figure 54:
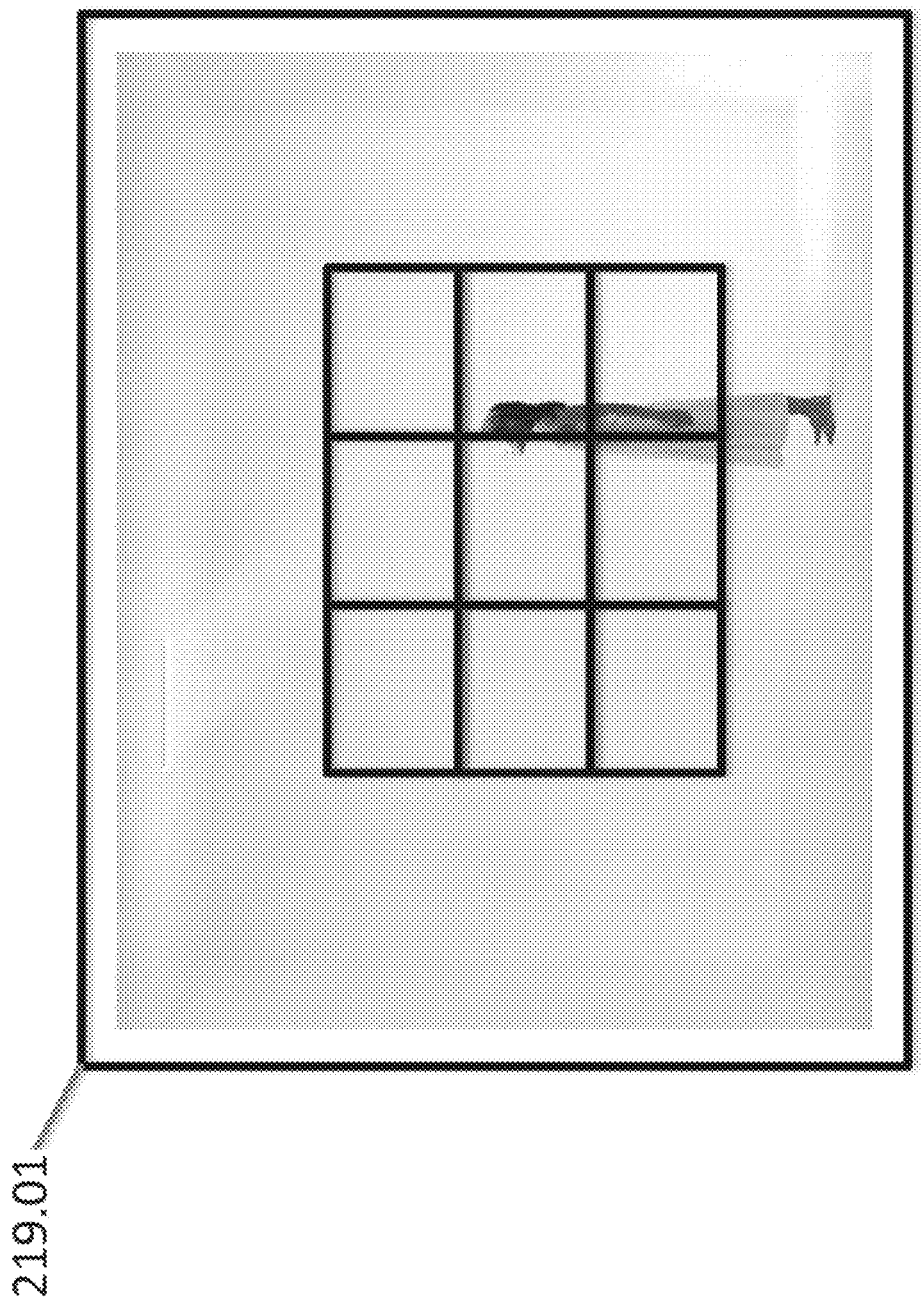

FIG. 54 shows an example embodiment of multiaperture zoom from the perspective of the scene imaged. The rectangle 219.01 represents the portion of the scene imaged onto the principal array 209.01 of FIG. 53.

The rectangle 219.02 represents the portion of the scene imaged onto the first peripheral array 209.02 of FIG. 53. 218.03 . . . are analogous.

Referring to FIG. 53, in an example embodiment, the principal array is an 8-megapixel array containing approximately 3266 pixels along his horizontal (landscape) axis. The imaging system projects a scene corresponding to an approximately 25° field of view onto this array. This projection is represented by 219.01 of FIG. 54. In this example, each pixel accounts for approximately 0.008° of field of view of the scene.

The peripheral arrays are each approximately 320 kpixel arrays containing 653 pixels along their horizontal (landscape) axes. The imaging system projects a portion of the same scene onto each array. The projection in the case of the first peripheral array is represented by 219.02 of FIG. 53. In an example embodiment, the system is designed such that each pixel now accounts for approximately 0.008°/2=0.004° of field of view of the scene. In this example, the scene projected onto the second peripheral array corresponds to 25°/(2*3)=4.16°. Different portions of the scene are analogously projected onto 219.03 . . . . In this way, the scene projected onto the combined rectangle formed by 219.02 . . . corresponds to 12.5°.

The primary array can include at least 4 to 12 megapixels or any range subsumed therein (for example, 4, 6, 8, 10, or 12 megapixels). For the secondary array, indicate that it can also be the same size (4, 6, 8, 10, 12). In various embodiments, there may be a number of secondary arrays (1 to 20 megapixels or any range subsumed therein, particularly, 1, 2, 4, 6, 8, 10, 12, 14, or 16 megapixels). The secondary arrays all may be smaller than the primary array of 1 to 8 megapixels or any range subsumed therein (for example, 1, 2, 4, 6, or 8 megapixels). In some embodiments, all of the secondary image arrays may be the same size (and may be less than the primary image array). In other embodiments, the secondary arrays may themselves vary in size (for example, they could vary between 1, 2 or 4 megapixels). They can be multi-color or single color (particularly secondary arrays with two for green, one blue and one red and multiples of that ratio). In example, the primary array may have a 1× zoom, and the secondary arrays may be more zoomed in (1.5× to 10× or any range subsumed therein, particularly, 2, 3, or 4× zoom). In other embodiments, the primary array may have a zoom level in between the zoom level of secondary arrays. The primary may have a zoom of x, and one secondary array may be one half (0.5)× and another may be 2×. Another example would be at least two zoomed out secondary arrays (1, 2, or 4 megapixels) of one quarter (0.25)× and one half (0.5)×, a primary array (2, 4, 8 or 12 megapixels) of 1× zoom, and at least two zoomed in secondary arrays (1, 2, or 4 megapixels).

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

In this example embodiment, 2× optical zoom is achieved via the peripheral arrays. Each pixel in the peripheral arrays is responsible for ½ of the field of view as in the principal array.

The overall imaging integrated circuit has slightly less than 1.2 the area that would be required if only a single imaging region of the same resolution and pixel size were employed. No compromise has been made in the quality of imaging within the principal array.

In addition, a progression of zoom is provided via the zoomed-in arrays.

Referring to FIG. 49, in an example embodiment, the principal array is an 8-megapixel array containing approximately 3266 pixels along his horizontal (landscape) axis. The pixels have linear dimensions of 1.4 µm. The imaging system projects a scene corresponding to an approximately 25° field of view onto this array. This projection is represented by 212.01 of FIG. 50. In this example, each pixel accounts for approximately (25°/3266)=0.008° of field of view of the scene.

The first peripheral array, the most-zoomed-in array, is a 2*(1.4/0.9)=3.1 megapixel array containing 2540 pixels along his horizontal (landscape) axis. The imaging system projects a smaller portion of the same scene—in this example, 25°/3=8° field of view—onto this array. This projection is represented by 212.02 of FIG. 50. In this example, each pixel now accounts for (25°/3/2540)=0.33° of angular field of view of the scene.

The second peripheral array, the intermediate-zoom array, is a 2*(1.4/0.9)=3.1 megapixel array containing 2540 pixels along his horizontal (landscape) axis. The imaging system projects a portion of the same scene onto this array where this portion is intermediate in angular field of view between full-field-of-view 25° and zoomed-in-field-of-view 8°. This projection is represented by 212.03 of FIG. 50. The imaging system projects a portion of the same scene—in this example, 25°/2=12.5° field of view—onto this array. This projection is represented by 212.03 of FIG. 50. In this example, each pixel now accounts for (25°/2/2540)=0.005° of angular field of view of the scene.

The primary array can include at least 4 to 12 megapixels or any range subsumed therein (for example, 4, 6, 8, 10, or 12 megapixels). For the secondary array, indicate that it can also be the same size (4, 6, 8, 10, 12). In various embodiments, there may be a number of secondary arrays (1 to 20 megapixels or any range subsumed therein, particularly, 1, 2, 4, 6, 8, 10, 12, 14, or 16 megapixels). The secondary arrays all may be smaller than the primary array of 1 to 8 megapixels or any range subsumed therein (for example, 1, 2, 4, 6, or 8 megapixels). In some embodiments, all of the secondary image arrays may be the same size (and may be less than the primary image array). In other embodiments, the secondary arrays may themselves vary in size (for example, they could vary between 1, 2 or 4 megapixels). They can be multi-color or single color (particularly secondary arrays with two for green, one blue and one red and multiples of that ratio). In example, the primary array may have a 1× zoom, and the secondary arrays may be more zoomed in (1.5× to 10× or any range subsumed therein, particularly, 2, 3, or 4× zoom). In other embodiments, the primary array may have a zoom level in between the zoom level of secondary arrays. The primary may have a zoom of x, and one secondary array may be one half (0.5)× and another may be 2×. Another example would be at least two zoomed out secondary arrays (1, 2, or 4 megapixels) of one quarter (0.25)× and one half (0.5)×, a primary array (2, 4, 8 or 12 megapixels) of 1× zoom, and at least two zoomed in secondary arrays (1, 2, or 4 megapixels).

In example embodiments, the arrays may be on a single substrate. A photosensitive layer may be formed over the substrate with pixel circuitry below the photosensitive region. In some embodiments, photo sensitive regions may be formed in a doped area of the substrate (rather than nanocrystal material on top) such as photodiode, pinned photodiode, partially pinned photodiode or photogate. In embodiments, the image sensor may be a nanocrystal or CMOS image sensor. In some embodiments, one or more image sensors can be formed on one side of substrate (e.g., the back side) with charge store extending from that side of the substrate to (or near to) the other side of the substrate (e.g., the front side) which has metal interconnect layers and forms pixel read out circuitry that can read out from the charge store.

Pixel sizes can vary from less than about 0.5 to 3 microns across a lateral dimension or any range subsumed therein (less than about 0.5 to 3 microns squared in area or any range subsumed therein). In examples, the pixels size may be less than about 1.3, 1.4, 1.5, 1.7, 2, 2.2 or 2.5 microns (with less than that amount squared in area). Specific examples are 1.2 and 1.4 microns. The primary array may have larger pixels than secondary array. Primary may be greater than 0.5, 0.7, 1, 1.2 or 1.4 or 1.5 microns and less than 1, 1.2, 1.5, 1.7, 2, 2.2, 2.5 or 3 microns. The one or more secondary arrays could be also be greater than 0.5, 0.7, 1, 1.2 or 1.4 or 1.5 microns and less than 1, 1.2, 1.5, 1.7, 2, 2.2, 2.5 or 3 microns but would be smaller than the primary. For example, the primary may be greater than X and the secondary may be less than X, where X is 1.2, 1.4, 1.5, 1.7, or 2, etc.

In this example embodiment, 3× optical zoom is achieved in the first peripheral array, the most-zoomed-in array. In the most-zoomed-in array, each pixel is responsible for 41% of the field of view as in the principal array.

In addition, 2× optical zoom is achieved in the second peripheral array, the intermediate-zoom array. In this array, each pixel is responsible for 60% of the field of view as in the principal array.

The overall imaging integrated circuit has approximately 1.5× the area that would be required if only a single imaging region of the same resolution and pixel size were employed. No compromise has been made in the quality of imaging within the principal array.

In addition, a progression of zoom is provided by the presence of the intermediate-zoom array.

Figure 55:
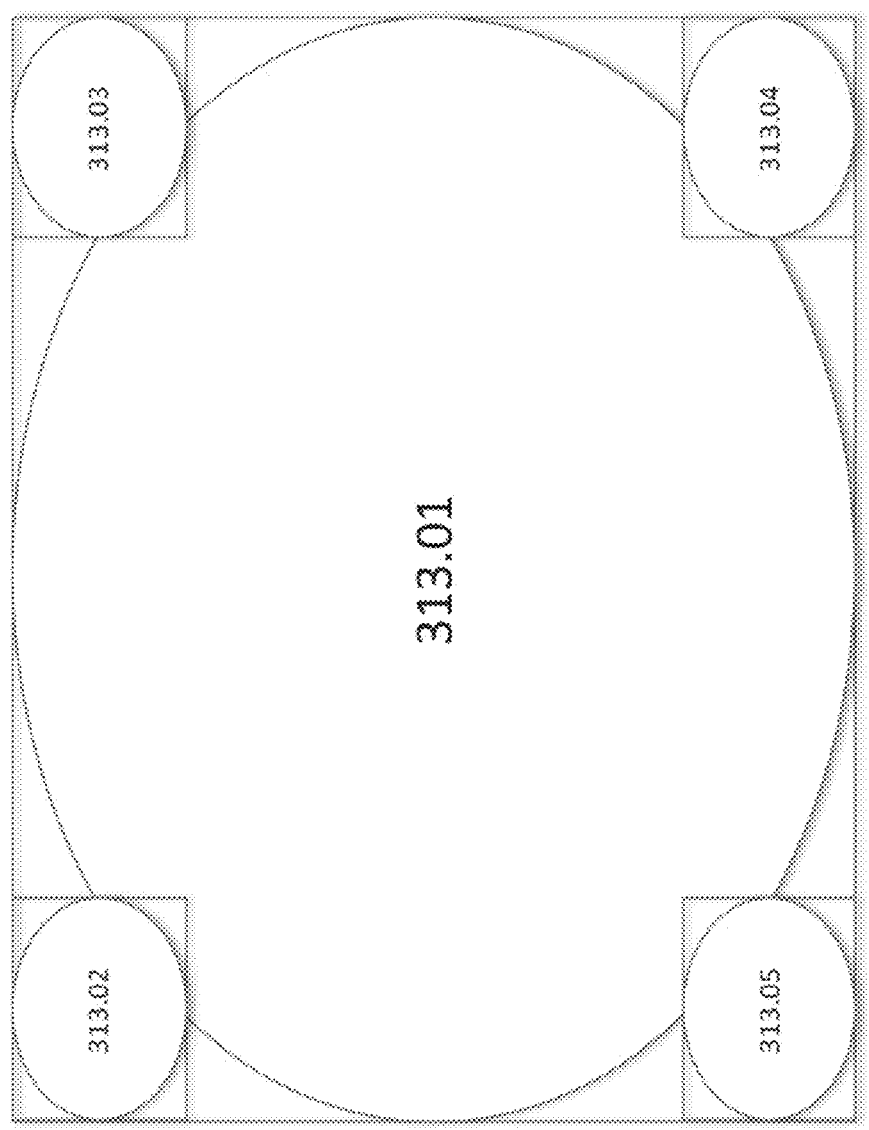

FIG. 55 depicts an approach employing a single image sensor array (the full rectangle in which label 313.01 is enclosed). In example embodiments, the single image sensor array may be a 12 megapixel array. A principal lensing system projects an image that exploits a subset of the full rectangle. The area utilized is depicted with the ellipse containing label 313.01. In example embodiments, the principal lensing system may image onto a utilized 8 megapixel subset of the 12 megapixel array. The rectangles containing 313.02, 313.03, 313.04, 313.05 represent regions of the full array that are used for zoomed-in imaging. The ellipses containing 313.02, 313.03, 313.04, 313.05 represent the formation of images using these supplementary lenses.

Figure 56:
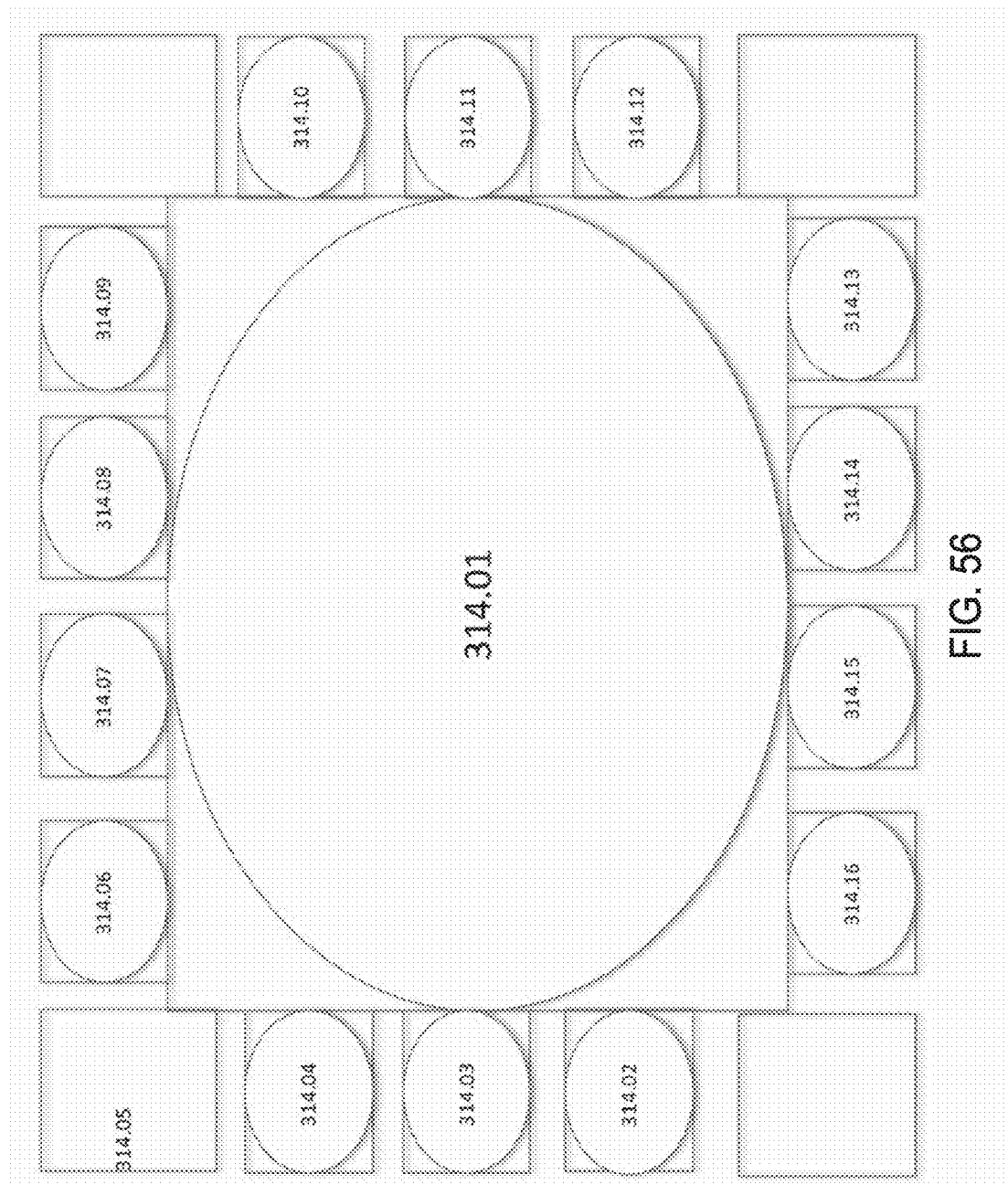

FIG. 56 depicts an approach employing a single image sensor array (the full rectangle in which label 314.01 is enclosed). In example embodiments, the single image sensor array may be a 12 megapixel array. A principal lensing system projects an image that exploits a subset of the full rectangle. The area utilized is depicted with the ellipse containing label 314.01. In example embodiments, the principal lensing system may image onto a utilized 8 megapixel subset of the 12 megapixel array. The rectangles containing 314.02-314.16 represent regions of the full array that are used for zoomed-in imaging. The ellipses containing 314.02-314.16 represent the formation of images using these supplementary lenses.

The use of multiple supplementary lenses to zoom into a single region of interest—superresolution.

Figure 57:
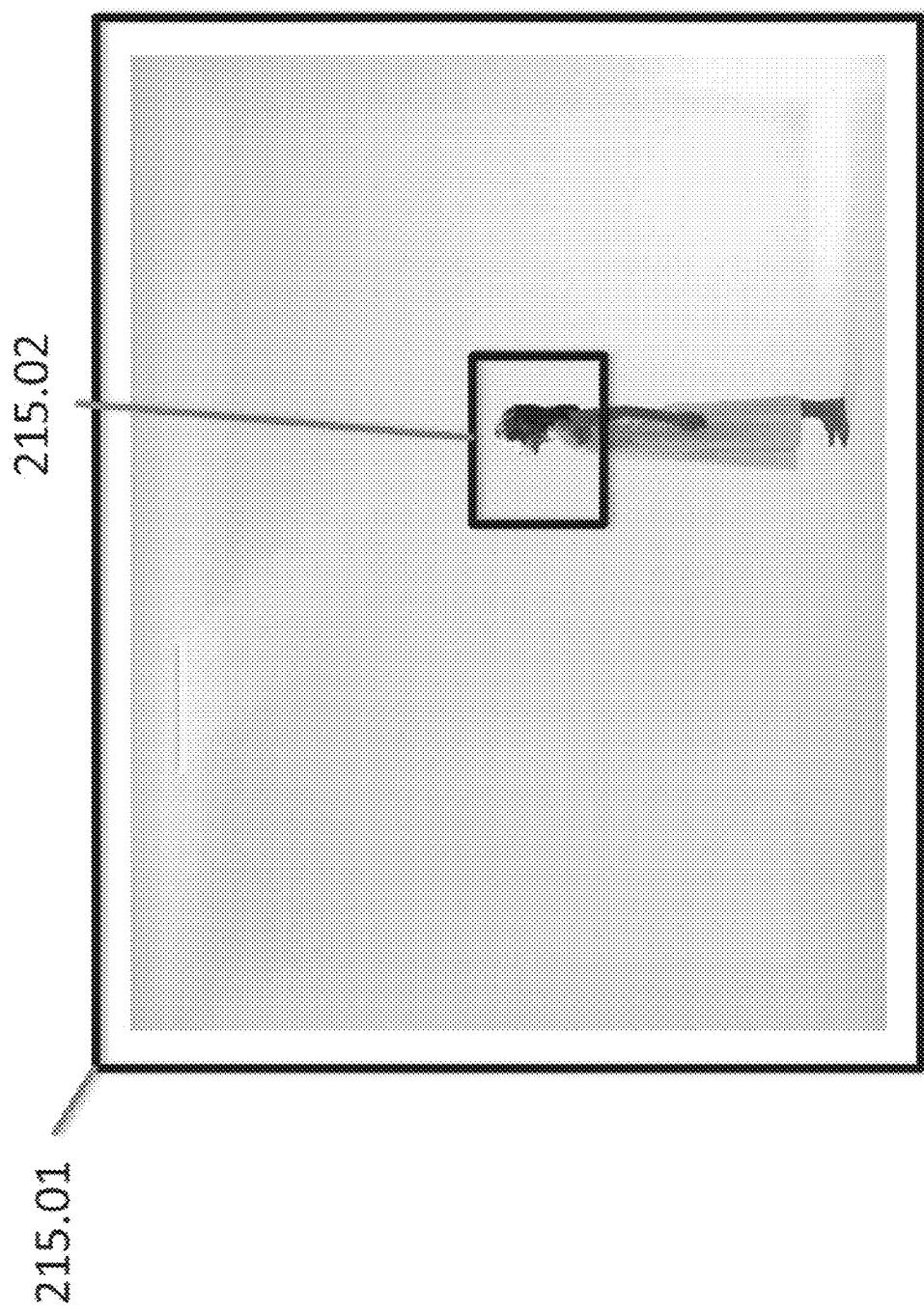

Referring to FIG. 57, the principal imaging system may image the entire scene of interest, 215.01. At least two lensing systems may image substantially the same subportion, 215.02, of the entire scene onto at least two image sensor regions. In sum, substantially the same region of interest may be imaged by at least two image sensor regions. This may allow superresolving of this region of interest. Specifically, the resolution achieved may exceed that generated by this region of interest once, using one lensing system, onto one image sensor—the information obtained by imaging this region of interest more than once may be combined to produce a superresolved image.

Figure 58:
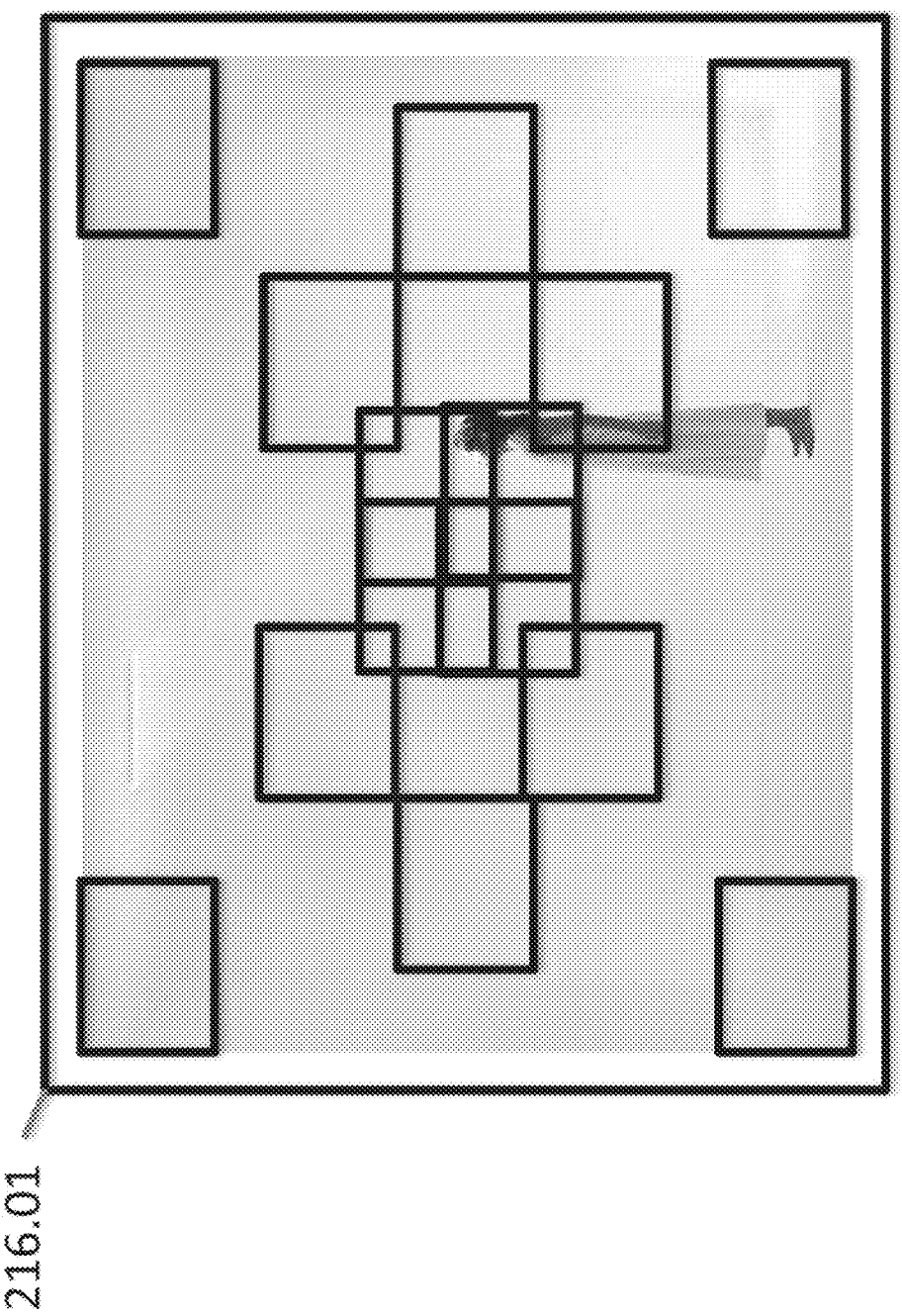

Referring to FIG. 58, the subregions of interest that image onto the secondary arrays may be laid out in a variety of ways. In embodiments, at least lens may produce images corresponding to overlapping subregions near the center of the image. Combining the information from these overlapping can produce superresolution in the center of the image. In embodiments, at least one lens corresponding to various additional subregions may enable predefined variable zoom and zoom-in resolution within one shot.

The different lensing systems corresponding to different subregions will also provide slightly different perspectives on the same scene. This perspective information can be used, in combination with image processing, to provide information about the depth of objects within a scene. This technique may be referred to as 3D imaging.

In embodiments, users interacting with an image-display system, such as the display on a mobile phone, a computer, or a television, may wish to change 'on-the-fly' the image that they see. For example, they may wish to zoom in live, or in replay, on subregions of an image, desiring improved resolution. In embodiments, users may zoom in on-the-fly on a subregion, and the availability of the multiply-imaged regions-of-interest may allow high-resolution zoom-in on-the-fly.

In embodiments, users interacting with an image-display system, such as the display on a mobile phone, a computer, or a television, may wish to change 'on-the-fly' from the presentation of a 2D image to the presentation of a 3D image. For example, they may wish to switch live, or in replay, to a 3D representation. In embodiments, users may switch to 3D on-the-fly on a subregion, and the availability of the multiple-perspective prerecorded images may allow the presentation of information regarding the depth of objects.

Figure 59:
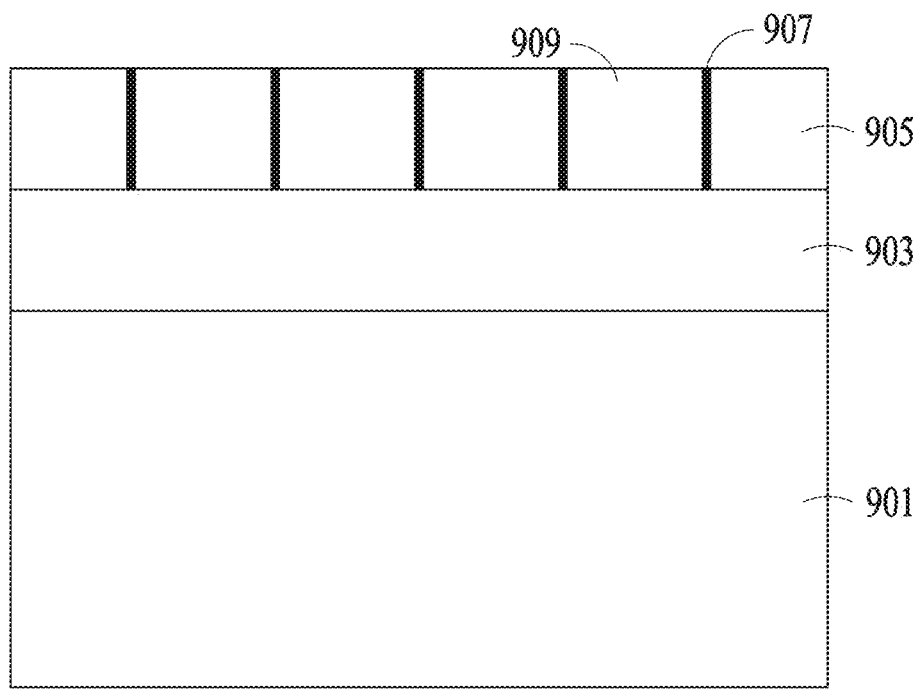
FIG. 59 is a cross-section depicting a means of reducing optical crosstalk among pixels by incorporating light-blocking layers in the color filter array or the passivation or the encapsulation or combinations thereof.

FIG. 59 depicts an image sensor device in cross-section. 901 is the substrate and may also include circuitry and metal and interlayer dielectric and top metal. 903 is a continuous photosensitive material that is contacted using metal in 901 and possibly in 905. 905 is transparent, or partially-transparent, or wavelength-selectively transparent, material on top of 903. 907 is an opaque material that ensures that light incident from the top of the device, and arriving at a non-normal angle of incidence onto region 905, is not transferred to adjacent pixels such as 909, a process that would, if it occurred, be known as optical crosstalk.

Figure 60:
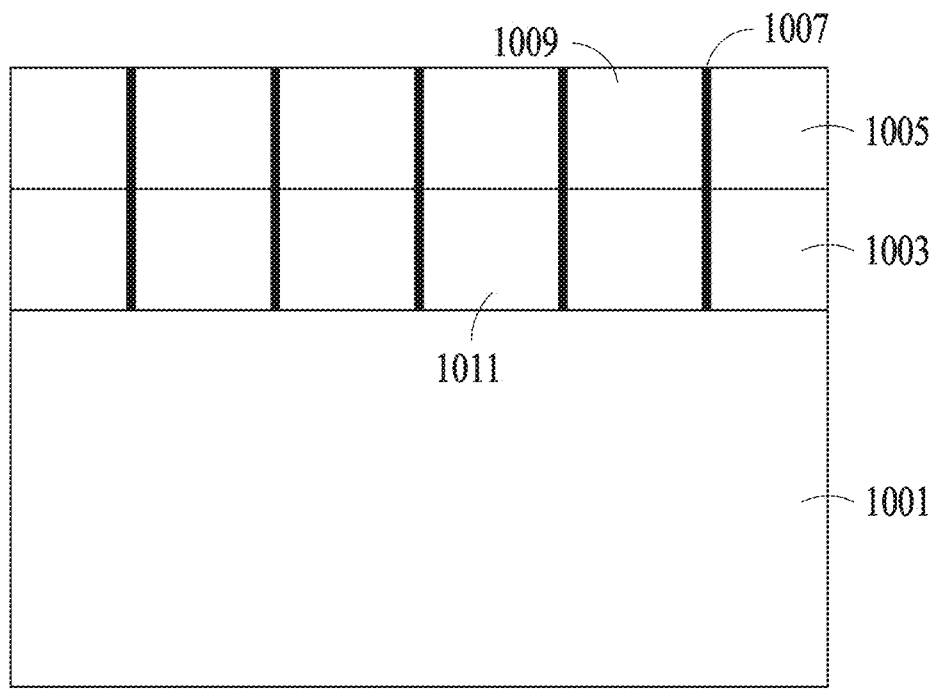
FIG. 60 is a cross-section depicting a means of reducing crosstalk among pixels by incorporating light-blocking layers in the color filter array or the passivation or the encapsulation or combinations thereof and also into the optically sensitive material.

FIG. 60 depicts an image sensor device in cross-section. 1001 is the substrate and may also include circuitry and metal and interlayer dielectric and top metal. 1003 is a photosensitive material that is contacted using metal in 1001 and possibly in 1005. 1005 is transparent, or partially-transparent, or wavelength-selectively transparent, material on top of 1003. 1007 is an opaque material that ensures that light incident from the top of the device, and arriving at a non-normal angle of incidence onto region 1005 and thence to 1003, is not transferred to adjacent pixels such as 1009 or 1011, a process that would, if it occurred, be known as optical or electrical or optical and electrical crosstalk.

FIGS. 61A through 61F depict in cross-section a means of fabricating an optical-crosstalk-reducing structure such as that shown in FIG. 59. FIG. 61A depicts a substrate 1101 onto which is deposited an optically sensitive material 1103 and an ensuing layer or layers 1105 including as examples encapsulant, passivation material, dielectric, color filter array, microlens material, as examples. In FIG. 61B, layer 1105 has been patterned and etched in order to define pixelated regions. In FIG. 61C, a blanket of metal 1107 has been deposited over the structure shown in FIG. 61B. In FIG. 61D, the structure of FIG. 61C has been directionally etched such as to remove regions of metal from 1107 on horizontal surfaces, but leave it on vertical surfaces. The resulting vertical metal layers will provide light obscuring among adjacent pixels in the final structure. In FIG. 61E a further passivation/encapsulation/color/microlens layer or layers have been deposited 1109. In FIG. 61F, the structure has been planarized.

Referring again to FIG. 59, optical cross-talk between pixels may be reduced by deposition of a thin layer 907 (e.g., 10-20 nm depending on material) of a reflective material on a sidewall of the recess of the passivation layer between photosensitive layer 903 and color filter array (top portion of 905). Since the layer 905 is deposited on the sidewall, its minimum thickness is defined only by optical properties of the material, not by minimum critical dimension of the lithography process used.

In embodiments, a thin (e.g., 5-10 nm) dielectric transparent etch stop layer is deposited as a blanket film over an optically sensitive material. A thicker (e.g., 50-200 nm) also transparent dielectric passivation layer (SiO2) is deposited over an etch stop layer. The checkerboard pattern the size of the pixel per unit is etched, the 10 nm aluminum metal layer is deposited over the topography using a conformal process (e.g., CVD, PECVD, ALD) and metal is removed from the bottom of the recessed parts of the pattern using directional (anisotropic) reactive ion plasma etch process. The recessed areas are filled with the same transparent passivation dielectric (SiO2) and overfilled to provide sufficiently thick film to allow a planarization process, for example, either using Chemical Mechanical Polishing or Back Etch. Said processes remove excess SiO2 and also residual metal film over horizontal surfaces. Similar processes can be applied for isolation of CTA or microlens layers.

Referring to FIG. 59, a vertical metal layer 907 may provide improved optical isolation between small pixels without substantial photoresponse loss.

Referring again to FIG. 60, for optical isolation of pixels through the optically sensitive material 1003, the following structure and process may be employed. A hard mask protective pattern is formed on the surface of optically sensitive material using high-resolution lithography techniques such as double-exposure or imprint technology. The mask forms a grid with the minimum dimensions (for example, 22 nm or 16 nm width). Exposed photosensitive material is etched using anisotropic reactive ion plasma etch process thru all or a major part of the photosensitive layer. The formed recess is filled with, for example, a) one or more dielectric materials with the required refractive index to provide complete internal reflection of photons back into the pixel or b) exposed photosensitive material is oxidized to form an electrical isolation layer about 1-5 nm thick on sidewalls of the recess and the remaining free space is filled with the reflective metal material such as aluminum using, for example, conventional vacuum metallization processes. The residual metal on the surface of photosensitive material is removed either by wet or dry etching or by mechanical polishing.

In various embodiments disclosed herein, an example imaging system comprising: a first image sensor array; a first optical system configured to project a first image on the first image sensor array, the first optical system having a first zoom level; a second image sensor array; a second optical system configured to project a second image on the second image sensor array, the second optical system having a second zoom level; wherein the second image sensor array and the second optical system are pointed in the same direction as the first image sensor array and the first optical system; wherein the second zoom level is greater than the first zoom level such that the second image projected onto the second image sensor array is a zoomed in portion of the first image projected on the first image sensor array; and wherein the first image sensor array includes at least four megapixels; and wherein the second image sensor array includes one-half or less than the number of pixels in the first image sensor array.

The example imaging system above, wherein the first image sensor array includes at least six megapixels.

The example imaging system above, wherein the first image sensor array includes at least eight megapixels.

The imaging system of any of the preceding examples, wherein the second image sensor array includes four megapixels or less.

The imaging system of any of the preceding examples, wherein the second image sensor array includes two megapixels or less.

The imaging system of any of the preceding examples, wherein the second image sensor array includes one megapixel or less.

The imaging system of any of the preceding examples, wherein the first image sensor array includes a first array of first pixel regions and the second image sensor array includes a second array of second pixel regions, wherein each of the first pixel regions is larger than each of the second pixel regions.

The imaging system of any of the preceding examples, wherein each of the first pixel regions has a lateral distance across the first pixel region of less than 2.5 microns.

The imaging system of any of the preceding examples, wherein each of the first pixel regions has an area of less than about 2.5 microns squared.

The imaging system of any of the preceding examples, wherein each of the first pixel regions has a lateral distance across the first pixel region of less than 2 microns.

The imaging system of any of the preceding examples, wherein each of the first pixel regions has an area of less than about 2 microns squared.

The imaging system of any of the preceding examples, wherein each of the first pixel regions has a lateral distance across the first pixel region of less than 1.5 microns.

The imaging system of any of the preceding examples, wherein each of the first pixel regions has an area of less than about 1.5 microns squared.

The imaging system of any of the preceding examples, wherein each of the second pixel regions has a lateral distance across the second pixel region of less than 2.1 microns.

The imaging system of any of the preceding examples, wherein each of the second pixel regions has an area of less than about 2.1 microns squared.

The imaging system of any of the preceding examples, wherein each of the second pixel regions has a lateral distance across the second pixel region of less than 1.6 microns.

The imaging system of any of the preceding examples, wherein each of the second pixel regions has an area of less than about 1.6 microns squared.

The imaging system of any of the preceding examples, wherein each of the second pixel regions has a lateral distance across the second pixel region of less than 1.3 microns.

The imaging system of any of the preceding examples, wherein each of the second pixel regions has an area of less than about 1.3 microns squared.

The imaging system of any of the preceding examples, further comprising a third image sensor array and a third optical system configured to project a third image on the third image sensor array, the third optical system having a third zoom level; wherein the third image sensor array and the third optical system are pointed in the same direction as the first image sensor array and the first optical system.

The imaging system of the example above, wherein the third zoom level is greater than the second zoom level.

The imaging system of the example above, wherein the third zoom level is less than the first zoom level.

The imaging system of any of the preceding examples, wherein the third image sensor array includes the same number of pixels as the second image sensor array.

The imaging system of any of the preceding examples, wherein the third image sensor array includes four megapixels or less.

The imaging system of any of the preceding examples, wherein the third image sensor array includes two megapixels or less.

The imaging system of any of the preceding examples, wherein the third image sensor array includes one megapixel or less.

The imaging system of any of the preceding examples, wherein the third image sensor array includes a third array of third pixel regions, wherein each of the third pixel regions is smaller than each of the first pixel regions.

The imaging system of any of the preceding examples, wherein each of the third pixel regions has a lateral distance across the pixel region of less than 1.9 microns.

The imaging system of any of the preceding examples, wherein each of the third pixel regions has an area of less than about 1.9 microns squared.

The imaging system of any of the preceding examples, wherein each of the third pixel regions has a lateral distance across the third pixel region of less than 1.4 microns.

The imaging system of any of the preceding examples, wherein each of the third pixel regions has an area of less than about 1.4 microns squared.

The imaging system of any of the preceding examples, wherein each of the third pixel regions has a lateral distance across the third pixel region of less than 1.2 microns.

The imaging system of any of the preceding examples, wherein each of the third pixel regions has an area of less than about 1.2 microns squared.

The imaging system of any of the preceding examples, wherein the first image sensor array and the second image sensor array are formed on the same substrate.

The imaging system of example above, wherein the third image sensor array is formed on the same substrate.

The imaging system of any of the preceding examples, further comprising a user interface control for selecting a zoom level and circuitry for reading out images from the first sensor array and the second sensor array and generating an output image based on the selected zoom level.

The imaging system of any of the preceding examples, wherein the first image is selected for output when the first zoom level is selected.

The imaging system of any of the preceding examples, wherein the second image is used to enhance the first image for output when the first zoom level is selected.

The imaging system of any of the preceding examples, wherein the second image is selected for output when the first zoom level is selected and the first image is used to enhance the second image.

The imaging system of any of the preceding examples, wherein the imaging system is part of a camera device and wherein a user control may be selected to output both the first image and the second image from the camera device.

The imaging system of any of the preceding examples, wherein the imaging system is part of a camera device and wherein a user control may be selected to output the first image, the second image and the third image from the camera device.

The imaging system of any of the preceding examples, further comprising first pixel circuitry for reading image data from the first image sensor array and second pixel circuitry for reading image data from the second image sensor array and an electronic global shutter configured to stop charge integration between the first image sensor array and the first pixel circuitry and between the second image sensor array and the second pixel circuitry at substantially the same time.

The imaging system of any of the preceding examples, wherein the electronic global shutter is configured to stop the integration period for each of the pixel regions in the first pixel sensor array and the second pixel sensor array within one millisecond of one another.

The imaging system of any of the preceding examples, further comprising third pixel circuitry for reading image data from the third image sensor array, wherein the electronic global shutter is configured to stop charge integration between the third image sensor array and the third pixel circuitry at substantially the same time as the first sensor array and the second sensor array.

The imaging system of any of the preceding examples, wherein the electronic global shutter is configured to stop the integration period for each of the third pixel regions in the third pixel sensor array within one millisecond of each of the pixel regions in the first image sensor array and the second image sensor array.

In various embodiments disclosed herein, an example imaging system comprising: a primary image sensor array; a primary optical system configured to project a primary image on the primary image sensor array, the primary optical system having a first zoom level; a plurality of secondary image sensor arrays; a secondary optical system for each of the secondary image sensor arrays, wherein each secondary optical system is configured to project a secondary image on a respective one of the secondary image sensor arrays, each of the secondary optical systems having a respective zoom level different than the first zoom level; wherein each of the secondary image sensor arrays and each of the secondary optical systems are pointed in the same direction as the primary image sensor array and the primary optical system; and wherein the primary image sensor array is larger than each of the secondary image sensor arrays.

The example imaging system above, further comprising a control circuit to output a primary image output based on the first image projected onto the primary image sensor array during a first mode of operation, wherein the primary image output is not generated based on any of the secondary images projected onto the secondary image arrays.

The example imaging system above, further comprising a control circuit to output a primary image output based on the first image projected onto the primary image sensor array during a first mode of operation, wherein the primary image output is enhanced based on at least one of the secondary images.

The imaging system of any of the preceding examples, wherein the control circuit is configured to output a zoomed image having a zoom level greater than the first zoom level during a second mode of operation, wherein the zoomed image is based on at least one of the secondary images and the primary image.

The imaging system of any of the preceding examples, wherein the number of secondary image sensor arrays is at least two.

The imaging system of any of the preceding examples, wherein the number of secondary image sensor arrays is at least four.

The imaging system of any of the preceding examples, wherein the number of secondary image sensor arrays is at least six.

The imaging system of any of the preceding examples, wherein each of the secondary optical systems has a different zoom level from one another.

The imaging system of any of the preceding examples, wherein at least some of the zoom levels of the plurality of secondary optical systems are greater than the first zoom level.

The imaging system of any of the preceding examples, wherein at least some of the zoom levels of the plurality of secondary optical systems are less than the first zoom level.

The imaging system of any of the preceding examples, wherein the plurality of secondary optical systems include at least two respective secondary optical systems having a zoom level greater than the first zoom level and at least two respective secondary optical systems having a zoom level less than the first zoom level.

The imaging system of any of the preceding examples, wherein the imaging system is part of a camera device, further comprising control circuitry configured to output a plurality of images during a mode of operation, wherein the plurality of images includes at least one image corresponding to each of the image sensor arrays.

The imaging system of any of the preceding examples, wherein the imaging system is part of a camera device, further comprising control circuitry configured to output an image with super resolution generated from the first image and at least one of the secondary images.

The imaging system of any of the preceding examples, further comprising global electronic shutter circuitry configured to control an imaging period for the primary image sensor array and each of the secondary image sensor arrays to be substantially the same.

The imaging system of any of the preceding examples, further comprising global electronic shutter circuitry configured to control an integration period for the primary image sensor array and each of the secondary image sensor arrays to be substantially the same.

In various embodiments disclosed herein, an example imaging system comprising: a semiconductor substrate; a plurality of image sensor arrays, including a primary image sensor array and a plurality of secondary image sensor arrays; a plurality of optical systems, including at least one optical system for each image sensor array; wherein each of the optical systems has a different zoom level; each of the image sensor arrays including pixel circuitry formed on the substrate for reading an image signal from the respective image sensor array, wherein the pixel circuitry for each of the image sensor arrays includes switching circuitry; and a control circuit operatively coupled to the switching circuitry of each of the image sensor arrays.

The example image sensor above, wherein the control circuit is configured to switch the switching circuitry at substantially the same time to provide a global electronic shutter for each of the image sensor arrays.

The image sensor of any of the preceding examples, wherein the control circuit is configured to switch the switching circuitry to end an integration period for each of the image sensor arrays at substantially the same time.

The imaging system of any of the preceding examples, wherein the number of secondary image sensor arrays is at least four.

The imaging system of any of the preceding examples, wherein the optical systems for the secondary image sensor arrays include at least two respective optical systems having a zoom level greater than the zoom level of the primary image sensor array and at least two respective optical systems having a zoom level less than the primary image sensor array.

The imaging system of any of the preceding examples, wherein the primary image sensor array is larger than each of the secondary image sensor arrays.

The imaging system of any of the preceding examples, wherein the pixel circuitry for each image sensor array includes a plurality of pixel circuits formed on the substrate corresponding to pixel regions of the respective image sensor array, each pixel circuit comprising a charge store and a switching element between the charge store and the respective pixel region.

The imaging system of any of the preceding examples, wherein the switching circuitry of each image sensor array is operatively coupled to each of the switching elements of the pixel circuits in the image sensor array, such that an integration period for each of the pixel circuits is configured to end at substantially the same time.

The imaging system of any of the preceding examples, wherein each pixel region comprises optically sensitive material over the pixel circuit for the respective pixel region.

The imaging system of any of the preceding examples, wherein each pixel region comprises an optically sensitive region on a first side of the semiconductor substrate, wherein the pixel circuit includes read out circuitry for the respective pixel region on the second side of the semiconductor substrate.

The imaging system of any of the preceding examples, wherein the charge store comprises a pinned diode.

The imaging system of any of the preceding examples, wherein the switching element is a transistor.

The imaging system of any of the preceding examples, wherein the switching element is a diode.

The imaging system of any of the preceding examples, wherein the switching element is a parasitic diode.

The imaging system of any of the preceding examples, wherein the control circuitry is configured to switch the switching element of each of the pixel circuits at substantially the same time.

The imaging system of any of the preceding examples, wherein each pixel region comprises a respective first electrode and a respective second electrode, wherein the optically sensitive material of the respective pixel region is positioned between the respective first electrode and the respective second electrode of the respective pixel region.

The imaging system of any of the preceding examples, wherein each pixel circuit is configured to transfer charge between the first electrode to the charge store when the switching element of the respective pixel region is in a first state and to block the transfer of the charge from the first electrode to the charge store when the switching element of the respective pixel region is in a second state.

The imaging system of any of the preceding examples, wherein the control circuitry is configured to switch the switching element of each of the pixel circuits from the first state to the second state at substantially the same time for each of the pixel circuits after an integration period of time.

The imaging system of any of the preceding examples, wherein each pixel circuit further comprises reset circuitry configured to reset the voltage difference across the optically sensitive material while the switching element is in the second state.

The imaging system of any of the preceding examples, wherein each pixel circuit further comprises a read out circuit formed on one side of the semiconductor substrate below the plurality of pixel regions.

The imaging system of any of the preceding examples, wherein the optically sensitive material is a continuous film of nanocrystal material.

The imaging system of any of the preceding examples, further comprising analog to digital conversion circuitry to generate digital pixel values from the signal read out of the pixel circuits for each of the image sensor arrays and a processor configured to process the pixel values corresponding to at least two of the image sensor arrays in a first mode of operation to generate an output image.

The imaging system of the example above, wherein the output image has a zoom level between the zoom level of the primary image sensor array and at least one of the secondary image sensor arrays used to generate the output image.

The imaging system of any of the preceding examples, further comprising a processor configured to generate an output image during a selected mode of operation based on the pixel values corresponding to the primary image sensor array without modification based on the images projected onto the secondary image sensor arrays.

The imaging system of any of the preceding examples, wherein the primary image sensor array includes a number of pixels corresponding to the full resolution of the imaging system and wherein each of the secondary image sensor arrays includes a number of pixels less than the full resolution of the imaging system.

The imaging system of the example above, wherein an image corresponding to the primary image sensor array is output when the first zoom level is selected and an image generated from the primary image sensor array and at least one of the secondary image sensor arrays is output when a different zoom level is selected.

In various embodiments disclosed herein, an example imaging system comprising: an image sensor comprising offset arrays of pixel electrodes for reading out a signal from the image sensor, wherein the arrays of pixel electrodes are offset by less than the size of a pixel region of the image sensor; and circuitry configured to select one of the offset arrays of pixel electrodes for reading out a signal from the image sensor.

The example imaging system above, further comprising circuitry to read out image data from each of the offset arrays of pixel electrodes and circuitry for combining the image data read out from each of the offset arrays of pixel electrodes to generate an output image.

In various embodiments disclosed herein, an example imaging system comprising: a first image sensor array comprising offset arrays of pixel electrodes for reading out a signal from the first image sensor array, wherein the arrays of pixel electrodes are offset by less than the size of a pixel region of the first image sensor; a second image sensor array; circuitry configured to select one of the offset arrays of pixel electrodes for reading out a signal from the first image sensor array; and circuitry for reading out image data from the first image sensor array and the second image sensor array.

The example imaging system above, further comprising circuitry for generating an output image from the image data for the first image sensor array and the second image sensor array.

The imaging system of any of the preceding examples, wherein the circuitry configured to select one of the offset arrays of pixel electrodes is configured to select the offset array of pixel electrodes that provides the highest super resolution when the image data from the first image sensor array is combined with the image data from the second image sensor array.

The imaging system of any of the preceding examples, wherein the circuitry configured to select one of the offset arrays of pixel electrodes is configured to select the offset array of pixel electrodes providing the least image overlap with the second image sensor array.

In various embodiments disclosed herein, an example method of generating an image from an image sensor system, the method comprising: reading out a first image from a first image sensor array from a first set of locations corresponding to pixel regions of the first image sensor array; and reading out a second image from the first image sensor array from a second set of locations corresponding to pixel regions of the first image sensor array.

The example method above, further comprising generating an output image from the first image and the second image.

In various embodiments disclosed herein, an example method of generating an image from an image sensor system, the method comprising: reading out a first image from a first image sensor array from a first set of locations corresponding to pixel regions of the first image sensor array; reading out a second image from the first image sensor array from a second set of locations corresponding to pixel regions of the first image sensor array; reading out a third image from a second image sensor array; and using the first image, the second image and the third image to select either the first set of locations or the second set of locations for reading out a subsequent image from the first image sensor array.

The example method above, further comprising reading a subsequent image from the second image sensor array at substantially the same time as the subsequent image from the first image sensor array.

The example method above, further comprising generating a super resolution image from the subsequent image read out from the second image sensor array and the subsequent image read out from the first image sensor array.

The method of any of the preceding examples, wherein the second image sensor array is pointed in the same direction as the first image sensor array and has a zoom level different than the first image sensor array.

The invention claimed is:

1. An imaging system, comprising:
 a first image sensor array;
 a first optical system configured to project a first image on the first image sensor array, the first optical system having a first zoom level covering a first field-of-view;
 a second image sensor array;
 a second optical system configured to project a second image on the second image sensor array, the second optical system having a second zoom level covering a second field-of-view, the imaging system to combine information from the first field-of-view and the second field-of-view to produce a digital image that substantially spans the first field-of-view and the second field-of-view, the digital image having information content covering a third field-of-view; and
 first pixel circuitry for reading image data from the first image sensor array and second pixel circuitry for reading image data from the second image sensor array and an electronic global shutter configured to stop charge integration between the first image sensor array and the first pixel circuitry and between the second image sensor array and the second pixel circuitry at substantially the same time;
wherein the second image sensor array and the second optical system are pointed generally in the same direction as the first image sensor array and the first optical system;
wherein the second zoom level is greater than the first zoom level such that the second image projected onto the second image sensor array is a zoomed in portion of the first image projected on the first image sensor array;
wherein the first image sensor array includes at least four megapixels; and wherein the second image sensor array includes one-half or less than the number of pixels in the first image sensor array; and
wherein the imaging system is configured to be selectable to operate in one of at least three modes:
in a first mode, the first image is utilized and is the sole source of image data for presentation to the user;
in a second mode, the second image is utilized and is the sole source of image data for presentation to the user; and
in a third mode, both the first image and the second image are to be conveyed to a graphical processing unit, the graphical processing unit to use the first image and the second image to generate a third image that combines information containing the first image and the second image, the third image having a higher-resolution region near a center.

2. The imaging system of claim 1, wherein the first image sensor array includes at least six megapixels.

3. The imaging system of claim 1, wherein the first image sensor array includes at least eight megapixels.

4. The imaging system of claim 1, wherein the second image sensor array includes four megapixels or less.

5. The imaging system of claim 1, wherein the second image sensor array includes two megapixels or less.

6. The imaging system of claim 1, wherein the second image sensor array includes one megapixel or less.

7. The imaging system of claim 1, wherein the first image sensor array includes a first array of first pixel regions and the second image sensor array includes a second array of second pixel regions, wherein each of the first pixel regions is larger than each of the second pixel regions.

8. The imaging system of claim 7, wherein each of the first pixel regions has a lateral distance across a first pixel region of less than 2.5 microns.

9. The imaging system of claim 7, wherein each of the first pixel regions has an area of less than about 2.5 microns squared.

10. The imaging system of claim 7, wherein each of the first pixel regions has a lateral distance across a first pixel region of less than 2 microns.

11. The imaging system of claim 7, wherein each of the first pixel regions has an area of less than about 2 microns squared.

12. The imaging system of claim 7, wherein each of the first pixel regions has a lateral distance across a first pixel region of less than 1.5 microns.

13. The imaging system of claim 7, wherein each of the first pixel regions has an area of less than about 1.5 microns squared.

14. The imaging system of claim 1, further comprising:
a third image sensor array; and
a third optical system configured to project a third image on the third image sensor array, the third optical system having a third zoom level, wherein the third image sensor array and the third optical system are pointed generally in the same direction as the first image sensor array and the first optical system.

15. The imaging system of claim 14, wherein the third image sensor array includes the same number of pixels as the second image sensor array.

16. The imaging system of claim 1, wherein the first image sensor array and the second image sensor array are formed on a same substrate.

17. The imaging system of claim 1, further comprising a user interface control for selecting a zoom level and circuitry for reading out images from the first image sensor array and the second image sensor array and generating an output image based on the selected zoom level.

18. The imaging system of claim 1, wherein the first image is selected for output when the first zoom level is selected.

19. The imaging system of claim 1, wherein the second image is used to enhance the first image for output when the first zoom level is selected.

20. The imaging system of claim 1, wherein the second image is selected for output when the first zoom level is selected and the first image is used to enhance the second image.

21. The imaging system of claim 1, wherein the imaging system is part of a camera device and wherein a user control may be selected to output both the first image and the second image from the camera device.

22. The imaging system of claim 1, wherein the imaging system is part of a camera device and wherein a user control may be selected to output the first image, the second image and the third image from the camera device.

23. The imaging system of claim 1, wherein the electronic global shutter is configured to stop a period of the charge integration for each pixel region in the first image sensor array and the second image sensor array within one millisecond of one another.

24. The imaging system of claim 14, further comprising third pixel circuitry for reading image data from the third image sensor array, wherein the electronic global shutter is configured to stop charge integration between the third image sensor array and a third pixel circuitry at substantially the same time as the first image sensor array and the second image sensor array.

25. An imaging system, comprising:
a primary image sensor array;
a primary optical system configured to project a primary image on the primary image sensor array, the primary optical system having a first zoom level covering a first field-of-view;
a plurality of secondary image sensor arrays;
a secondary optical system for each of the secondary image sensor arrays, wherein each secondary optical system is configured to project a secondary image on a respective one of the secondary image sensor arrays, each of the secondary optical systems having a respective zoom level different than the first zoom level and each covering a secondary field-of-view, respectively, the imaging system to combine information from the first field-of-view and at least one of the secondary fields-of-view to produce a digital image that substantially spans the first field-of-view and the at least one secondary field-of-view to produce the digital image with information content covering a third field-of-view;
wherein each of the secondary image sensor arrays and each of the secondary optical systems are pointed generally in the same direction as the primary image sensor array and the primary optical system;

wherein the primary image sensor array is larger than each of the secondary image sensor arrays; and wherein the imaging system is configured to be selectable to operate in one of at least three modes:

in a first mode, the primary image is utilized and is the sole source of image data for presentation to the user;

in a second mode, at least one secondary image is utilized and is the sole source of image data for presentation to the user; and in a third mode, both the primary image and the at least one secondary image are to be conveyed to a graphical processing unit, the graphical processing unit to use the primary image and the at least one secondary image to generate a third image that combines information containing the primary image and the at least one secondary image, the third image having a higher-resolution region near a center.

26. The imaging system of claim 25, further comprising a control circuit to output a primary image output based on the first image projected onto the primary image sensor array during a first mode of operation, wherein the primary image output is not generated based on any of the secondary images projected onto the secondary image sensor arrays.

27. The imaging system of claim 25, further comprising a control circuit to output a primary image output based on the first image projected onto the primary image sensor array during a first mode of operation, wherein the primary image output is enhanced based on at least one of the secondary images.

28. The imaging system of claim 25, wherein a control circuit is configured to output a zoomed image having a zoom level greater than the first zoom level during a second mode of operation, wherein the zoomed image is based on at least one of the secondary images and the primary image.

29. The imaging system of claim 25, wherein each of the secondary optical systems has a different zoom level from one another.

30. The imaging system of claim 25, wherein at least some of the zoom levels of the plurality of secondary optical systems are greater than the first zoom level.

31. The imaging system of claim 25, wherein at least some of the zoom levels of the plurality of secondary optical systems are less than the first zoom level.

32. The imaging system of claim 25, wherein the plurality of secondary optical systems include at least two respective secondary optical systems having a zoom level greater than the first zoom level and at least two respective secondary optical systems having a zoom level less than the first zoom level.

33. The imaging system of claim 25, wherein the imaging system is part of a camera device, further comprising control circuitry configured to output a plurality of images during a mode of operation, wherein the plurality of images includes at least one image corresponding to each of the image sensor arrays.

34. The imaging system of claim 25, wherein the imaging system is part of a camera device, further comprising control circuitry configured to output an image with super resolution generated from the first image and at least one of the secondary images.

35. The imaging system of claim 25, further comprising global electronic shutter circuitry configured to control an imaging period for the primary image sensor array and each of the secondary image sensor arrays to be substantially the same.

36. The imaging system of claim 25, further comprising global electronic shutter circuitry configured to control an integration period for the primary image sensor array and each of the secondary image sensor arrays to be substantially the same.

37. An imaging system, comprising:

a semiconductor substrate;

a plurality of image sensor arrays, including a primary image sensor array and a plurality of secondary image sensor arrays;

a plurality of optical systems, including at least one optical system for each image sensor array, a first of the plurality of optical systems being configured to project a primary image, covering a first field-of-view, onto the primary image sensor array, each of a remaining plurality of optical systems covering a secondary field-of-view, respectively, the imaging system to combine information from the first field-of-view and at least one of the secondary fields-of-view to produce a digital image that substantially spans the first field-of-view and the at least one secondary field-of-view to produce the digital image with information content covering a third field-of-view;

wherein each of the plurality of optical systems has a different zoom level;

each of the image sensor arrays including pixel circuitry formed on the semiconductor substrate for reading an image signal from the respective image sensor array, wherein the pixel circuitry for each of the image sensor arrays includes switching circuitry;

a control circuit operatively coupled to the switching circuitry of each of the image sensor arrays; and wherein the imaging system is configured to be selectable to operate in one of at least three modes:

in a first mode, the primary image is utilized and is the sole source of image data for presentation to the user;

in a second mode, at least one secondary image from at least one of the secondary fields-of-view is utilized and is the sole source of image data for presentation to the user; and in a third mode, both the primary image and the at least one secondary image are to be conveyed to a graphical processing unit, the graphical processing unit to use the primary image and the at least one secondary image to generate a third image that combines information containing the primary image and the at least one secondary image, the third image having a higher-resolution region near a center.

38. The image sensor of claim 37, wherein the control circuit is configured to switch the switching circuitry at substantially the same time to provide a global electronic shutter for each of the image sensor arrays.

39. The image sensor of claim 37, wherein the control circuit is configured to switch the switching circuitry to end an integration period for each of the image sensor arrays at substantially the same time.

40. The imaging system of claim 37, wherein the number of secondary image sensor arrays is at least four.

41. The imaging system of claim 37, wherein the optical systems for the secondary image sensor arrays include at least two respective optical systems having a zoom level greater than the zoom level of the primary image sensor array and at least two respective optical systems having a zoom level less than the primary image sensor array.

42. The imaging system of claim 37, wherein the primary image sensor array is larger than each of the secondary image sensor arrays.

43. The imaging system of claim 37, wherein the pixel circuitry for each image sensor array includes a plurality of pixel circuits formed on the semiconductor substrate corresponding to pixel regions of the respective image sensor array, each pixel circuit comprising a charge store and a switching element between the charge store and the respective pixel region.

44. The imaging system of claim 43, wherein the switching circuitry of each image sensor array is operatively coupled to each of the switching elements of the pixel circuits in the image sensor array, such that an integration period for each of the pixel circuits is configured to end at substantially the same time.

45. The imaging system of claim 37, wherein each pixel region comprises optically sensitive material over a pixel circuit for a respective pixel region.

46. The imaging system of claim 37, wherein each pixel region comprises an optically sensitive region on a first side of the semiconductor substrate, wherein a pixel circuit includes read out circuitry for the respective pixel region on the second side of the semiconductor substrate.

47. The imaging system of claim 43, wherein the charge store comprises a pinned diode.

48. The imaging system of claim 43, wherein the switching element is a transistor.

49. The imaging system of claim 43, wherein the switching element is a diode.

50. The imaging system of claim 43, wherein the switching element is a parasitic diode.

51. The imaging system of claim 43, wherein the control circuitry is configured to switch the switching element of each of the pixel circuits at substantially the same time.

52. The imaging system of claim 45, wherein each pixel region comprises a respective first electrode and a respective second electrode, wherein the optically sensitive material of the respective pixel region is positioned between the respective first electrode and the respective second electrode of the respective pixel region.

53. The imaging system of claim 43, wherein each pixel circuit is configured to transfer charge between a first electrode to the charge store when the switching element of the respective pixel region is in a first state and to block a transfer of charge from the first electrode to the charge store when the switching element of the respective pixel region is in a second state.

54. The imaging system of claim 43, wherein the control circuitry is configured to switch the switching element of each of the pixel circuits from a first state to a second state at substantially the same time for each of the pixel circuits after an integration period of time.

55. The imaging system of claim 45, wherein each pixel circuit further comprises reset circuitry configured to reset a voltage difference across the optically sensitive material while a switching element is in a second state.

56. The imaging system of claim 43, wherein each pixel circuit further comprises a read out circuit formed on one side of the semiconductor substrate below a plurality of pixel regions.

57. The imaging system of claim 45, wherein the optically sensitive material is a continuous film of nanocrystal material.

58. The imaging system of claim 43, further comprising analog to digital conversion circuitry to generate digital pixel values from a signal read out of the pixel circuits for each of the image sensor arrays and a processor configured to process the pixel values corresponding to at least two of the image sensor arrays in the first mode of operation to generate an output image.

59. The imaging system of claim 58, wherein the output image has a zoom level between the zoom level of the primary image sensor array and at least one of the secondary image sensor arrays used to generate the output image.

60. The imaging system of claim 37, further comprising a processor configured to generate an output image during a selected mode of operation based on pixel values corresponding to the primary image sensor array without modification based on images projected onto the secondary image sensor arrays.

61. The imaging system of claim 37, wherein the primary image sensor array includes a number of pixels corresponding to the full resolution of the imaging system and wherein each of the secondary image sensor arrays includes a number of pixels less than the full resolution of the imaging system.

62. The imaging system of claim 61, wherein an image corresponding to the primary image sensor array is output when a first zoom level is selected and an image generated from the primary image sensor array and at least one of the secondary image sensor arrays is output when a different zoom level is selected.

* * * * *

UNITED STATES PATENT AND TRADEMARK OFFICE
CERTIFICATE OF CORRECTION

PATENT NO. : 9,609,190 B2  
APPLICATION NO. : 14/067745  
DATED : March 28, 2017  
INVENTOR(S) : Lee et al.

Page 1 of 1

It is certified that error appears in the above-identified patent and that said Letters Patent is hereby corrected as shown below:

In Column 8, Line 41, delete "tuns" and insert --turns-- therefor

In Column 19, Line 41, delete "±2.5" and insert --+2.5-- therefor

In Column 24, Line 27, delete "CM Y" and insert --CMY-- therefor

In Column 29, Line 47, delete "633,653," and insert --633, 653,-- therefor

In Column 32, Line 2, delete "MoO3," and insert --$MoO_3$,-- therefor

In Column 37, Line 19, delete "ex ample" and insert --example-- therefor

In Column 39, Line 29, delete "0008°/2=0.0040°" and insert --0.008°/2=0.004°-- therefor In Column 45, Line 16, delete "(SiO2)" and insert --($SiO_2$)-- therefor In Column 45, Line 24, delete "(SiO2)" and insert --($SiO_2$)-- therefor In Column 45, Line 27, delete "SiO2" and insert --$SiO_2$-- therefor In Column 45, Line 29, delete "CTA" and insert --CFA-- therefor Signed and Sealed this  
Tenth Day of July, 2018

Andrei Iancu  
*Director of the United States Patent and Trademark Office*